(12) United States Patent
Kakino et al.

(10) Patent No.: US 7,063,936 B2
(45) Date of Patent: Jun. 20, 2006

(54) POLYMERIZABLE COMPOSITION AND IMAGE RECORDING MATERIAL CONTAINING THE SAME

(75) Inventors: Ryuki Kakino, Shizuoka (JP); Kazuto Kunita, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 59 days.

(21) Appl. No.: 10/959,143

(22) Filed: Oct. 7, 2004

(65) Prior Publication Data

US 2005/0075247 A1   Apr. 7, 2005

(30) Foreign Application Priority Data

Oct. 7, 2003 (JP) ............... P.2003-348345

(51) Int. Cl.
*G03F 7/27* (2006.01)
*G03F 7/32* (2006.01)
*G03F 7/33* (2006.01)

(52) U.S. Cl. ............... 430/287.1; 430/288.1; 430/927; 430/964; 522/96; 522/107; 522/117; 522/121; 522/137; 522/142; 522/145; 522/186

(58) Field of Classification Search ......... 430/287.1, 430/288.1, 927, 964; 522/96, 107, 117, 121, 522/137, 142, 145, 186
See application file for complete search history.

(56) References Cited

U.S. PATENT DOCUMENTS

| 2,850,445 | A |   | 9/1958 | Oster |
| 5,834,118 | A | * | 11/1998 | Rånby et al. ............ 428/482 |
| 6,232,038 | B1 | * | 5/2001 | Takasaki et al. ........ 430/281.1 |
| 6,255,444 | B1 | * | 7/2001 | Yuasa et al. ............ 528/308.6 |
| 6,448,301 | B1 | * | 9/2002 | Gaddam et al. ............ 522/6 |

FOREIGN PATENT DOCUMENTS

| JP | 44-20189 B | 8/1969 |
| JP | 8-276558 A | 10/1996 |
| JP | 11-60540 A | 3/1999 |

* cited by examiner

*Primary Examiner*—Richard L. Schilling
(74) *Attorney, Agent, or Firm*—Sughrue Mion, PLLC

(57) ABSTRACT

A polymerizable composition comprising; a dendrimer having at least two polymerizable groups within a molecule; a radical initiator; and an alkali-soluble polymer, and an image recording material comprising a support and a recording layer comprising a polymerizable composition containing a dendrimer having at least two polymerizable groups within a molecule, a radical initiator and an alkali-soluble polymer.

10 Claims, 1 Drawing Sheet

POLYMERIZABLE COMPOSITION AND IMAGE RECORDING MATERIAL CONTAINING THE SAME

FIELD OF THE INVENTION

The present invention relates to a polymerizable composition which can be used for image-forming materials such as three-dimensional stereolithography, holography, lithographic printing plate, color proof, photoresist and color filter, or for photocurable resin materials such as ink, coating material and adhesive and which can be cured with high sensitivity by various laser exposures, and also relates to an image recording material using the polymerizable composition in the recording layer. More specifically, the present invention relates to a polymerizable composition suitably used as a recording layer of a lithographic printing plate material capable of so-called direct plate-making of directly producing a printing plate based on digital signals of a computer or the like by using various lasers, and relates to an image recording material using the polymerizable composition.

BACKGROUND OF THE INVENTION

As for the solid laser, semiconductor laser and gas laser each emitting an ultraviolet ray, a visible ray or an infrared ray at a wavelength of from 300 to 1,200 nm, high-output and compact lasers are now easily available. These lasers are very useful as a light source for recording at the time of directly producing a printing plate based on digital data of a computer or the like. Studies on the recording material sensitive to these various laser rays are being diversely made and representative examples of such a recording material include the followings. First, an acid catalyst crosslinking-type negative recording material having a sensitivity at a wavelength of 760 nm or more and being recordable by an infrared laser is known (sea, for ale, JP-A-8-276558 (the term "JP-A" as used herein means an "unexamined published Japanese patent application")). Secondly, a large number of radical polymerization-type negative recording materials which are a recording material sensitive to an ultraviolet or visible laser of 300 to 700 nm are known (see, for example, U.S. Pat. No. 2,850,445 and JP-B-44-20189 (the term "JP-B" as used herein means an "examined Japanese patent publication")).

On the other hand, a polymerizable composition recordable by a short-wavelength ray of 300 nm or less or an electron beam is important particularly as a photoresist material. The integration degree of integrated circuits has recently become higher and higher, and also in the production of a semiconductor substrate for VLSI or the like, processing of an ultrafine pattern having a line width of a half micron or less is required. In order to satisfy such a requirement, the wavelength used in an exposure apparatus for photolithography becomes shorter and studies are being made to use a far ultraviolet ray or an excimer laser ray (e.g., XeCl, KrF, ArF) and furthermore to form an ultrafine pattern by an electron beam. Particularly, the electron beam is promising as a light source for pattern-formation techniques in the next generation.

These image-forming materials all have a common problem to be solved and this is how to expand the image ON-OFF in the areas irradiated and not irradiated with the above-described various energies.

In order to solve this problem, a large number of reports using a high-sensitivity radical polymerizable composition have been proposed and the main components used in such a radical polymerizable composition are generally a radical polymerizable crosslinking agent and a polymer binder. As for the radical polymerizable crosslinking agent, a polyfunctional crosslinking agent having two or more polymerizable groups within the molecule is usually used to enhance the crosslinking efficiency. However, the reaction rate of the radical polymerizable crosslinking agent is not so high in practice and there is a fear that an unreacted crosslinking agent or crosslinking group remains in the laser exposed area and due to its presence, the film property in the region cured by exposure is deteriorated.

When a highly reactive polymerizable crosslinking agent is used or the polymerizable crosslinking agent content is increased for the purpose of obtaining high sensitivity, the storage stability of the polymerizable composition tends to decrease due to high reactivity. In order to satisfy both the storage stability and the high sensitivity, the balance therebetween is taken at present by controlling the reactivity or content of the crosslinking group.

In order to form a highly curable film, a novel aromatic ester (meth)acrylate dendrimer useful as a polymerizable compound, and a curable resin composition comprising this polymerizable compound and a polymerization initiator have been proposed (see, for example, JP-A-11-60540). The (meth)acrylate dendrimer used in this composition is called an "aromatic ester" and contains many phenyl groups within the molecule to render the entire molecule hydrophobic. Therefore, a coat having excellent water resistance can be formed, but the hydrophobicity is too high in view of removing an unnecessary coat by performing development. Thus, this composition cannot be substantially used for pattern-forming materials such as image-forming material.

SUMMARY OF THE INVENTION

The present invention has been made by taking account of these problems and an object of the present invention is to provide a polymerizable composition which is cured with high sensitivity by the application of an energy, forms a cured film having good film properties, and exhibits good storage stability. Another object of the present invention is to provide an image recording material such as a lithographic printing plate precursor using this polymerizable composition in the recording layer, which is recordable with high sensitivity by using a solid or semiconductor laser emitting an ultraviolet ray, a visible ray or an infrared ray, allows for direct plate-making based on digital data of a computer or the like, and ensures excellent press life and good storage stability.

As a result of intensive investigations, the present inventors have found that high sensitivity, good storage stability and excellent film quality can be realized by using, as a crosslinking component, a dendrimer having a polymerizable group. The present invention has been accomplished based on this finding.

That is, the polymerizable composition of the present invention is characterized by comprising (1) a dendrimer having at least two polymerizable groups within the molecule, (2) a radical initiator and (3) an alkali-soluble polymer.

From the standpoint of enhancing the film property, a polymer having a polymerizable group within the molecule is preferably used as (3) the alkali-soluble polymer.

In view of sensitivity, the polymerizable composition preferably further comprises (4) a sensitizing dye.

The term "polymerizable composition" as used in the present invention means a composition which is cured through polymerization caused to occur and proceed upon application of an energy, such as exposure or heating, and generally includes a composition which is polymerized under the action of light, heat, or light and heat.

The image recording material according the present invention is characterized by comprising a support having thereon a recording layer comprising a polymerizable composition containing (1) a dendrimer having at least two polymerizable groups within the molecule, (2) a radical initiator and (3) an alkali-soluble polymer. In addition, an image forming method comprising irradiating the polymerizable composition of the present invention with a semiconductor laser having a wavelength of from 350 to 1200 nm is a preferable embodiment of the present invention.

The operation mechanism of the present invention is not clearly known but is presumed as follows.

In the polymerizable composition of the present invention, (1) a dendrimer having at least two polymerizable groups within the molecule is used as a polymerizable compound and since multiple polymerizable groups are present within one molecule of this compound, even when individual polymerizable groups have a low reaction rate, all polymerizable groups can decrease the number of unreacted compounds not participating in the crosslinking•polymerization reaction. Therefore, the presence of the unreacted polymerizable compound having a possibility of forming one impregnation route for developer at the development and decreasing the film strength is lessened and this leads to the enhancement of film property.

On the other hand, as described above, the polymerizable compound having such a structure can effectively prevent the impregnation of developer and therefore, even when the content of the polymerizable group is decreased, this does not cause reduction in the film property and in turn, deterioration of the press life performance when used for an image recording material. That is, a satisfactory film property can be ensured without introducing a highly reactive polymerizable group giving rise to reduction in the storability or without increasing the amount of the polymerizable compound added and therefore, both high press life property and stock storability can be achieved.

Also, in (1) the dendrimer having at least two polymerizable groups within the molecule, because of the structure of molecule, the polymerizable groups are concentrated at a high density on the terminal part of the molecule and there is a high probability that the crosslinking groups contact with each other at the exposure to give a very high reaction rate. This is a large characteristic feature not seen in conventional techniques.

Furthermore, by virtue of the function of (3) the alkali-soluble polymer, the area unexposed at the pattern exposure is swiftly removed by alkali development and therefore, the polymerizable composition of the present invention is useful as a pattern forming material such as image recording material. In addition, when a polymer having a polymerizable group within the molecule is used as (3) the alkali-soluble polymer, the binder polymer itself contributes to the polymerization reaction•formation of crosslinked structure with (1) the dendrimer having at least two polymerizable groups within the molecule and therefore, in this preferred embodiment, the film strength can be more enhanced.

Such a polymerizable composition of the present invention is suitable particularly for a recording layer of a thermal polymerization•thermal crosslinking type direct image recording material used with a laser ray at a wavelength of 800 nm or more. More specifically, in a thermal polymerization•thermal crosslinking type recording layer, light is converted into heat and radicals are generated under the action of this heat. Therefore, as compared with a photopolymerization type recording material, it is difficult in practice to achieve both storage stability, particularly, heat stability, and sensitivity. However, the polymerizable composition of the present invention fulfills storage stability and high sensitivity and therefore, is particularly effective as a thermal polymerization•thermal crosslinking type recording material.

The polymerizable composition of the present invention comprises, as a polymerizable compound, (1) a dendrimer having at least two polymerizable groups within the molecule and this provides effects that curing is attained with high sensitivity by the application of an energy, the cured film has good film property, and the storage stability is good.

The image recording material of the present invention uses the polymerizable composition of the present invention in the recording layer and this provides excellent effects that recording can be performed with high sensitivity by using a solid or semiconductor laser emitting an ultraviolet ray, a visible ray or an infrared ray, a printing plate can be directly produced based on digital data of a computer or the like, and high press life property and storage stability are ensured.

Figure 1:
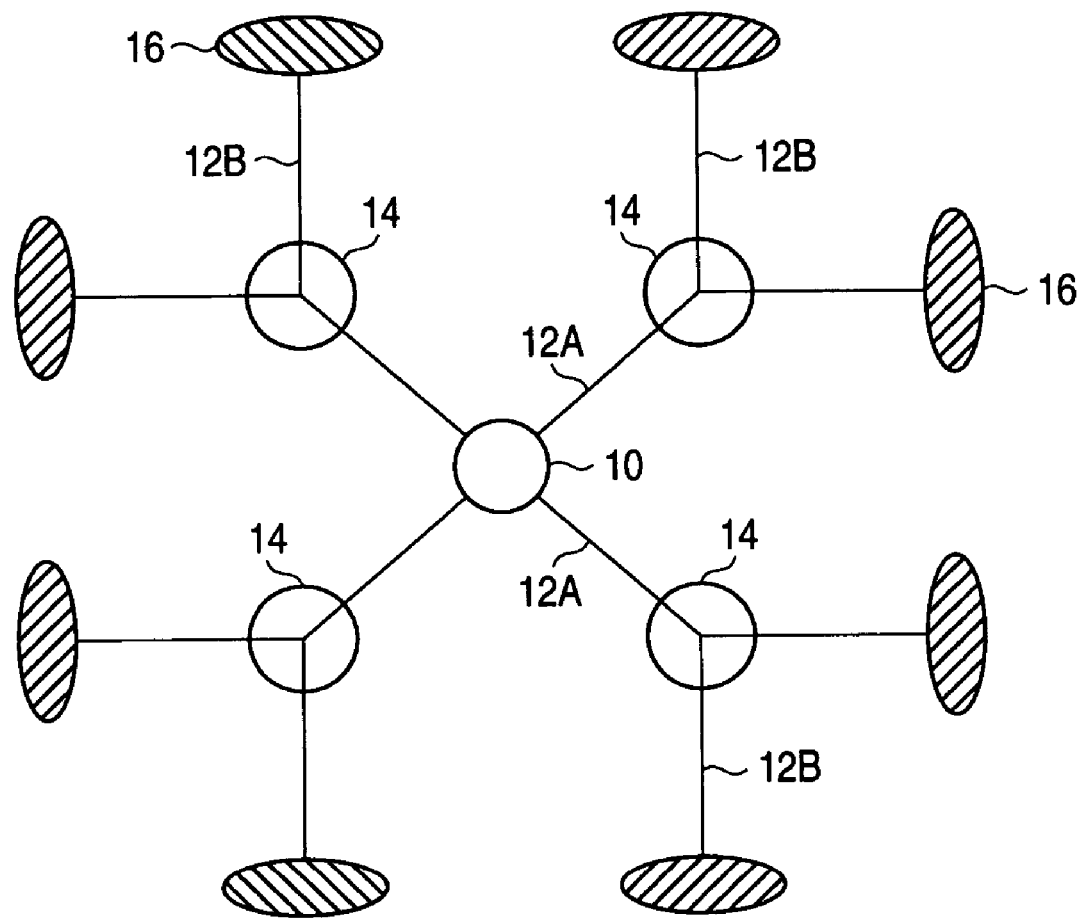
FIG. 1.

A model view showing a standard structure of the polymerizable dendrimer of the present invention.

DETAILED DESCRIPTION OF THE INVENTION

The polymerizable composition of the present invention is described in detail below.

The polymerizable composition of the present invention is characterized by comprising (1) a dendrimer having at least two polymerizable groups within the molecule, (2) a radical initiator and (3) an alkali-soluble polymer, and preferably further comprises (4) a sensitizing dye.

Respective components of the polymerizable composition of the present invention are described in sequence below.

<(1) Dendrimer Having at Least Two Polymerizable Groups within the Molecule>

The dendrimer (1) having at least two polymerizable groups within the molecule, which is a characteristic component in the polymerizable composition of the present invention, is a multi-branched compound having a regularly branched structure and a uniform molecular weight and has polymerizable groups at any of the terminal portions of the branched structure.

The dendrimer as used in the present invention means a multi-branched compound having a regularly branched structure and a uniform molecular weight and excludes, even when having multiple chain portions branched around a core portion, a hyperbranched compound having low regularity and a compound where the branched chain portion is straight-chained without having a branched structure.

The dendrimer is described in detail, for example, in *Angew. Chem.*, Int. Ed. 38, p. 884 (1999).

The polymerizable dendrimer for use in the present invention is preferably a multi-branched polymer having a molecular weight of 1,500 or more and 12 or more polymerizable groups, more preferably a multi-branched compound having a molecular weight of 1,800 or more and 14 or more polymerizable groups, and most preferably a multi-branched compound having a molecular weight of 2,000 or more and 16 or more polymerizable groups.

The molecular weight of the polymerizable dendrimer is not particularly limited in its upper limit, but in view of developability, the upper limit is preferably 20,000 or less, more preferably 15,000 or less, and most preferably 10,000 or less.

The polymerizable group is preferably positioned at the terminal of each branched structure.

The polymerizable group-containing dendrimer for use in the present invention has a dendritic multi-branched structure comprising a core site, a branching site, a branch site and a terminal site. FIG. 1 is a model view showing the standard dendrimer of the present invention.

The core site 10 as a center has multiple branch sites 12A, the terminal site of the branch site 12A works out to a branching site 14, a branch site 12B is newly branched from the branching site, and each branch site 12B has a terminal site 16. The polymerizable dendrimer for use in the present invention has a structure that at least two most terminal sites 16 have a polymerizable group. In the model view shown, the branching site 14 is present only at the terminal of the branch site 12A generated from the core site 10 but of course, the present invention is not limited thereto and the polymerizable dendrimer may have a structure that the terminal of the branch site 12B continuing to the branching site 14 works out to a branching site and this branching site newly has multiple branch sites.

In the case of a dendrimer having regularity, the size thereof is generally expressed by a conceptual term of generation. In the present invention, when having a terminal site (terminal group) at the distal end of the branch site 12A in FIG. 1, the branched structure body starting from the core site defined above to the terminal site is called a first-generation dendrimer, and when having a branched structure which is branched from all terminal sites (branching sites 14 in FIG. 1) of the first generation, the structure body from the branch site 12B to the terminal site 16 positioned at its distal end is called a second-generation dendrimer. The generation is defined in this way in the present invention.

The polymerizable dendrimer for use in the present invention preferably has a size of 2 to 10 generations, more specifically from 2 to 8 generation, still more preferably from 2 to 6 generations.

Preferred structures of the core site, branching site, branch site and terminal site of the polymerizable dendrimer are described in sequence below.

In the present invention, the core site should have a structure where at lest two branch sites are bonded.

Representative structures of the core site are described below. Examples of the core site composed of one atom include those represented by the following formulae (2-a) and (2-b) where the center is constituted by a trivalent or higher polyvalent atom, such as N and C. Examples of the core site composed of a cyclic compound include those represented by the following formulae (2-c), (2-d) and (2-e). The cyclic structure may be an aromatic cyclic structure, an alicyclic structure or a heterocyclic structure.

Examples of the core site also include a structure configured by combining multiple atoms with the center being a polyvalent atom, represented by the following formula (2-f) or (2-g), and a metal atom. The structures represented by formulae (2-f) and (2-g) can be used not only as a core site but also as a branching site which is described later.

The structures represented by formulae (2-h) to (2-k) are examples of the structure corresponding only to the core site, and the core site having such a structure preferably has 4 or more branches. In formulae (2-h) to (2-k), Rx is an alkylene group having from 1 to 12, preferably from 1 to 6, carbon atoms.

(2-a)

(2-b)

(2-c)

(2-d)

(2-e)

(2-f)

(2-g)

(2-j)

(2-i)

-continued

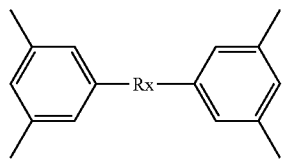
(2-j)

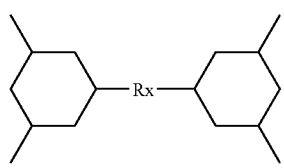
(2-k)

The branch site in the polymerizable dendrimer for use in the present invention is a generic term of constituent sites for connecting one core site or branching site to an adjacent branching site or a terminal site, and the structure thereof is not particularly limited.

The total number of branch sites (the sum total of those connected directly to the core site and those connected to the branching sites) present in one molecule of dendrimer is preferably from 9 to 160, more preferably from 12 to 130, and most preferably from 18 to 100.

The branching site of the polymerizable dendrimer for use in the present invention is not particularly limited as long as it is composed of a trivalent or higher polyvalent atom or atomic group and having a bond to the adjacent core site or a linking site positioned on the core site side and bonds to multiple branch sites connected in the terminal direction. A branching site having a structure similar to those described above for the core site may be used, but the branching site is usually composed of a carbon atom, a nitrogen atom or an atomic group containing such an atom.

The dendrimer for use in the present invention should have at least two polymerizable groups at the terminal of a branch site connected to the branching site. In view of the effect, the dendrimer preferably has, as described above, from 12 to 180, more preferably from 14 to 140, and most preferably from 16 to 120, polymerizable groups within the molecule.

Incidentally, in the case of applying the polymerizable composition of the present invention to pattern formation having an expose area and an unexposed area, such as recording layer of an image-recording material, by taking account of hydrophobicity of the film and solubility of the unexposed region, the number of aryl groups contained in the molecule is preferably 12 or less, more preferably 6 or less, and most preferably 3 or less.

The polymerizable group in the polymerizable dendrimer is not particularly limited as long as the group can be radical-polymerized.

Preferred examples thereof include an α-substituted methyl acryl group [—OC(=O)—C(—CH$_2$Z)=CH$_2$ (wherein Z is a hydrocarbon group starting from a heteroatom)], an acryl group, a methacryl group, an allyl group and a styryl group. Among these, more preferred are an acryl group and a methacryl group.

As apparent from specific examples shown above, the polymerizable group may be present at all terminal sites of dendrimer or may be present only at a part of terminal sites.

The polymerizable dendrimer of the present invention can be synthesized by known method. The method for the synthesis is specifically described, for example, in Shi W. et al., *J. Appl. Polym. Scie.*, 59, 12, 1945 (1996), Moszner N. et al., *Macromol. Chem. Phys.*, 197, 2, 621 (1996), Qichum W. Scott R. et al., *Pure Appl. Chem.*, A37(11), 1301 (2000), Qichum W. Scott R. et al., *Pure Appl. Chem.*, A39(4), 267 (2000), and Shikichi Yokoyama and Noburo Masuko, *Kobunshi Ronbun Shu (Polymer Collected Papers)*, Vol. 59, No. 10, 642 (2002).

Examples of the polymerizable dendrimer suitably usable in the present invention [Compounds (M-1) to (M-24)] are set forth below, but the present invention is not limited thereto.

(M-1)

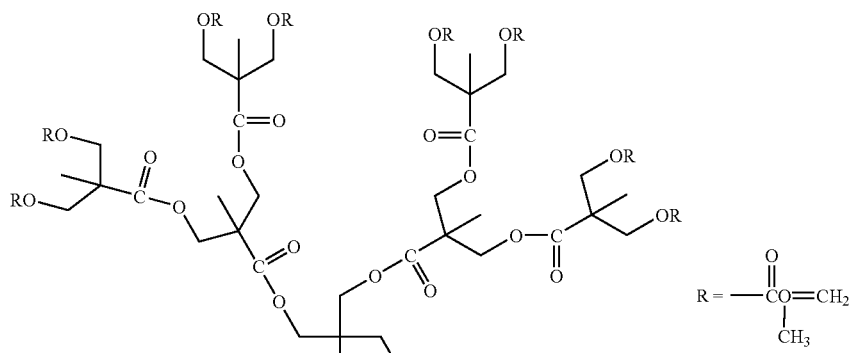

-continued
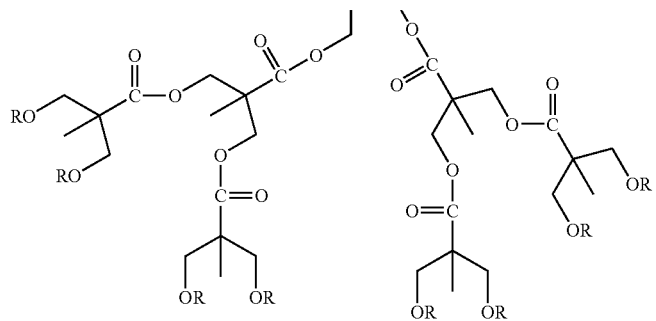
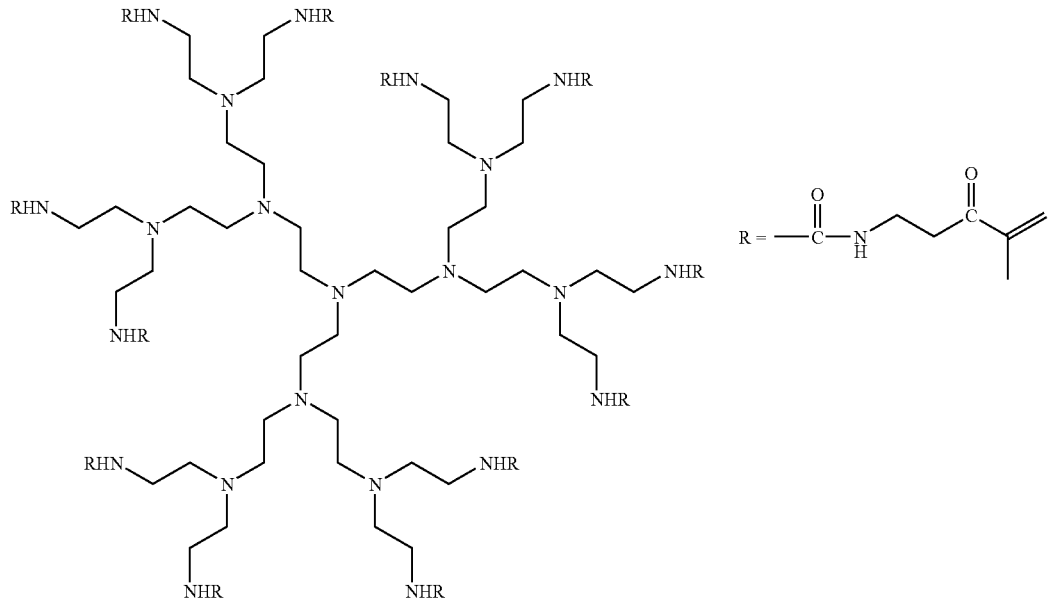
(M-2)
(M-3)
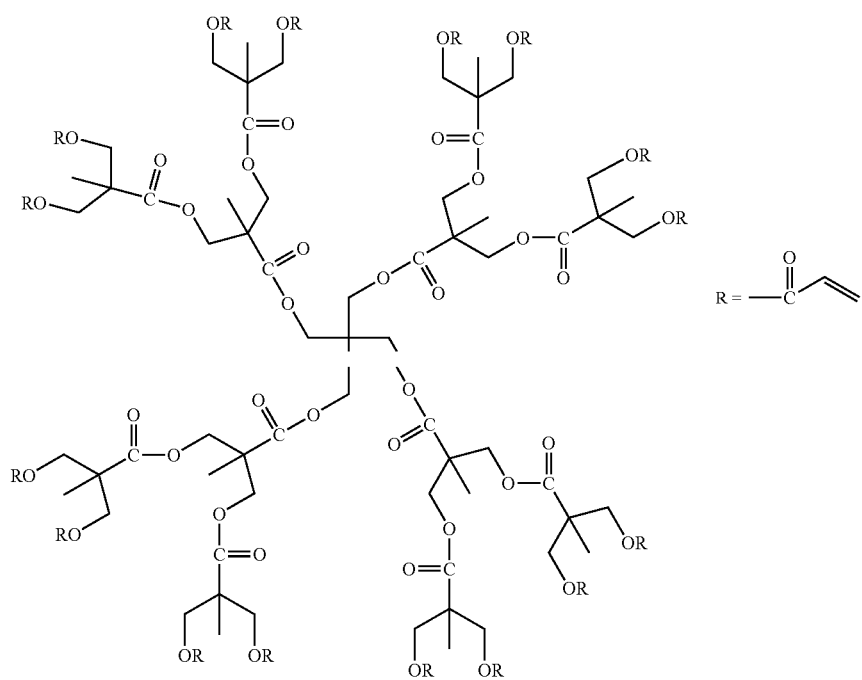

(M-4)
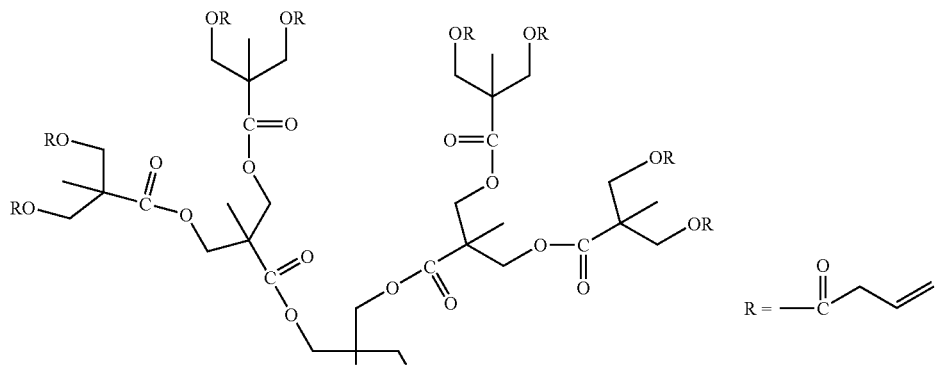
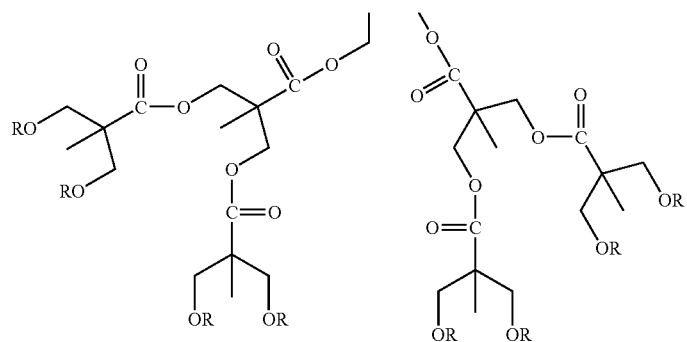
(M-5)
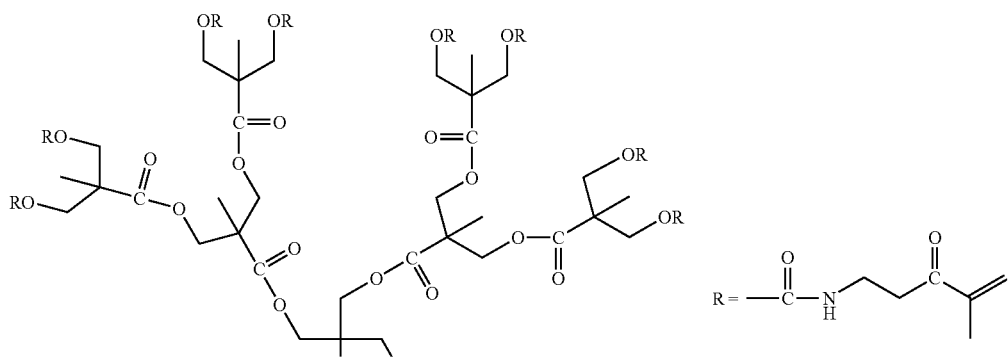

-continued
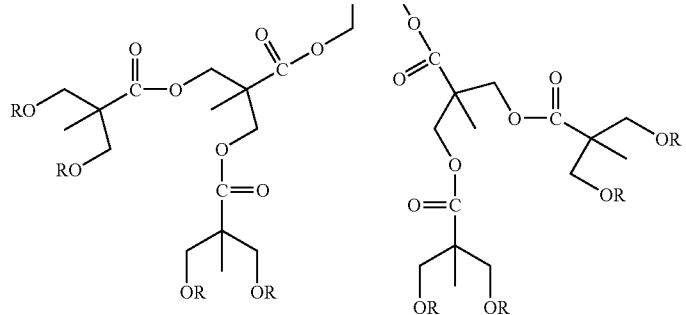
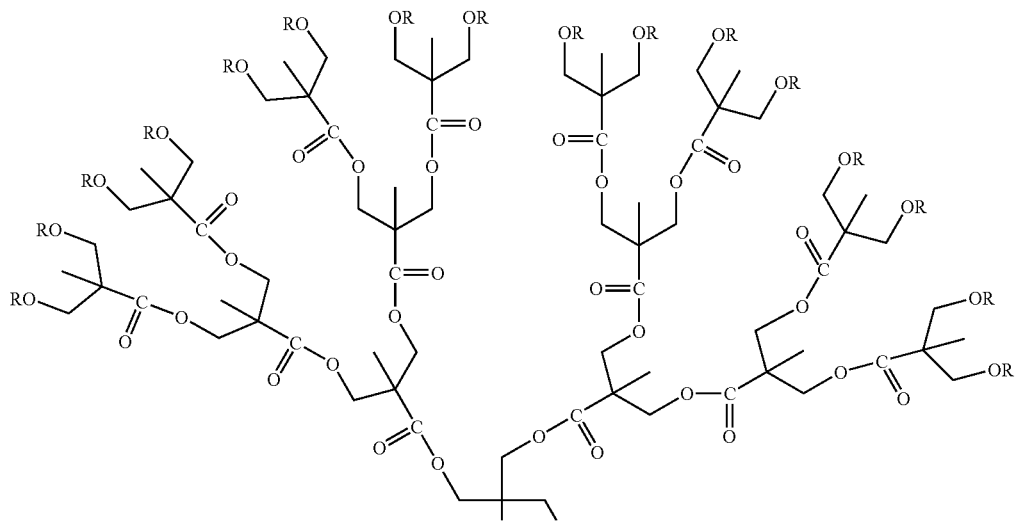
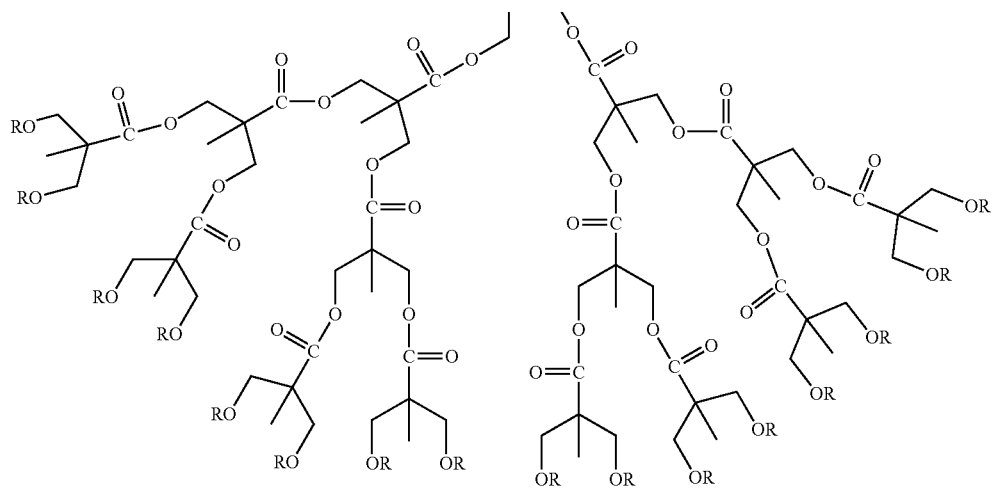

-continued
(M-6)
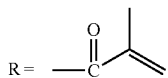
(M-7)
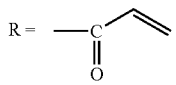
(M-8)
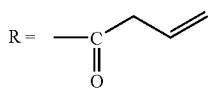
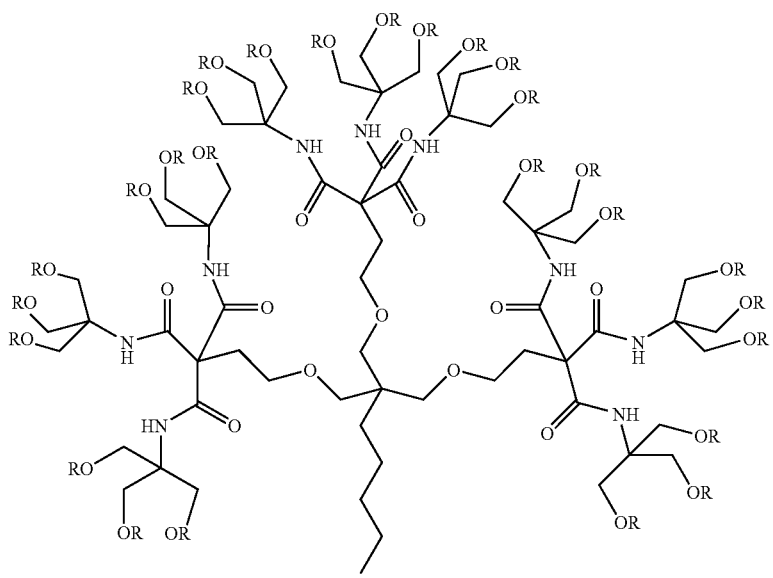
(M-9)
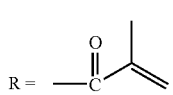
(M-10)
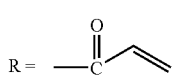
(M-11)
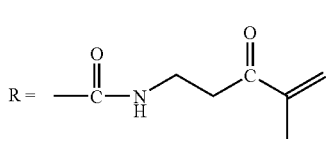
(M-12)
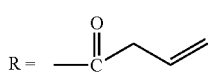

-continued
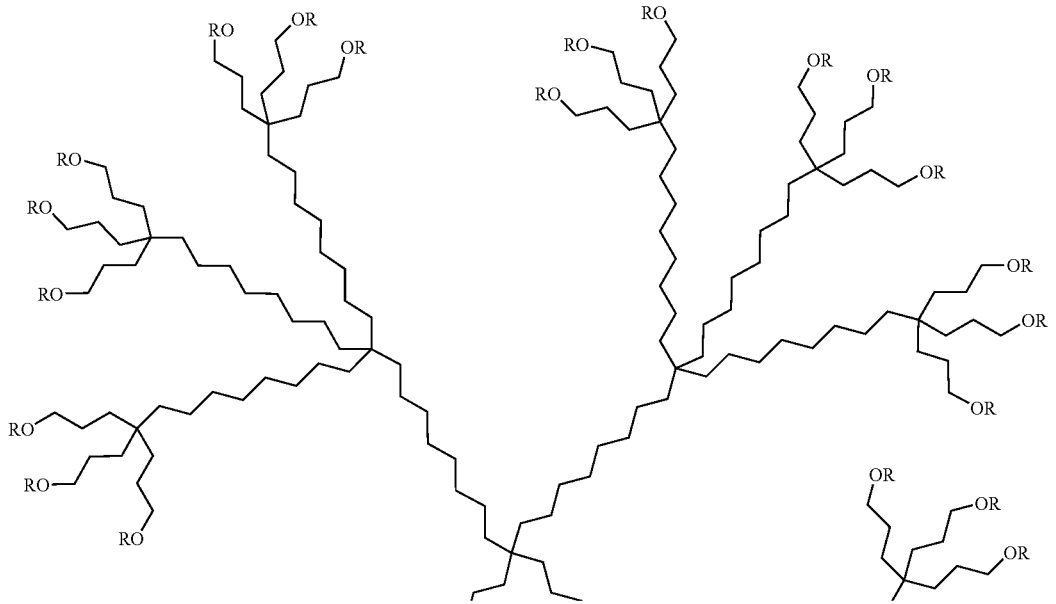
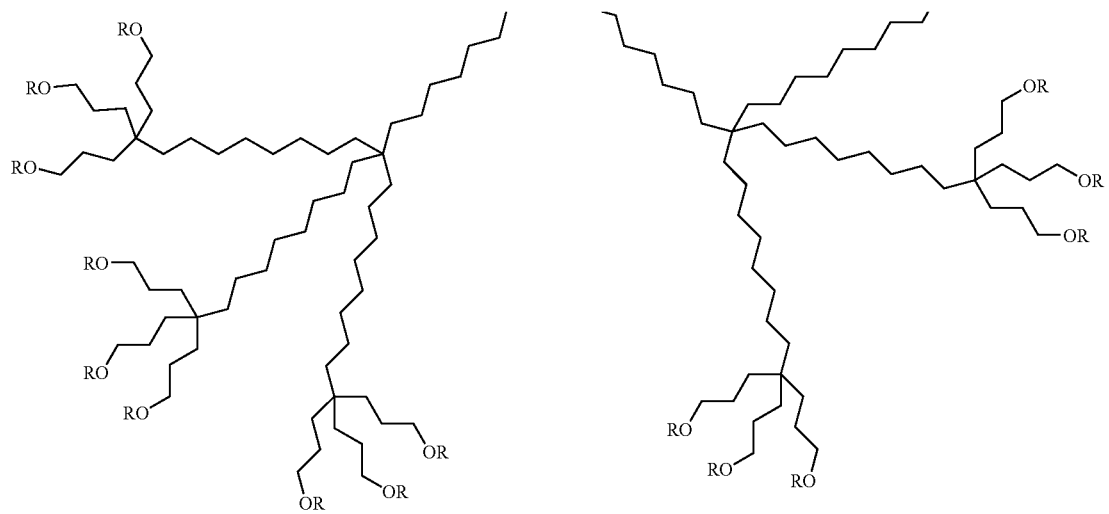
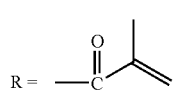 (M-13)
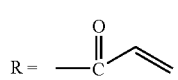 (M-14)
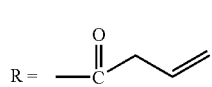 (M-15)
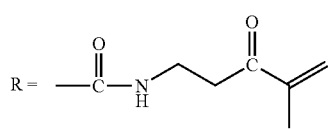 (M-16)

-continued
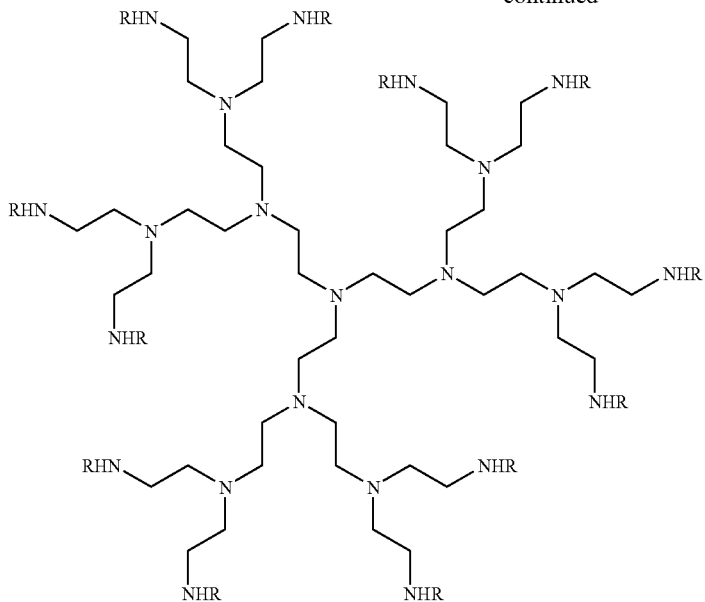
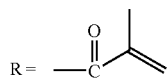 (M-17)
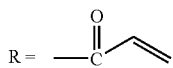 (M-18)
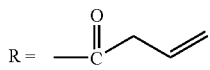 (M-19)
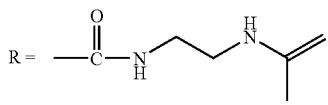 (M-20)
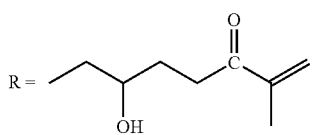 (M-21)

-continued

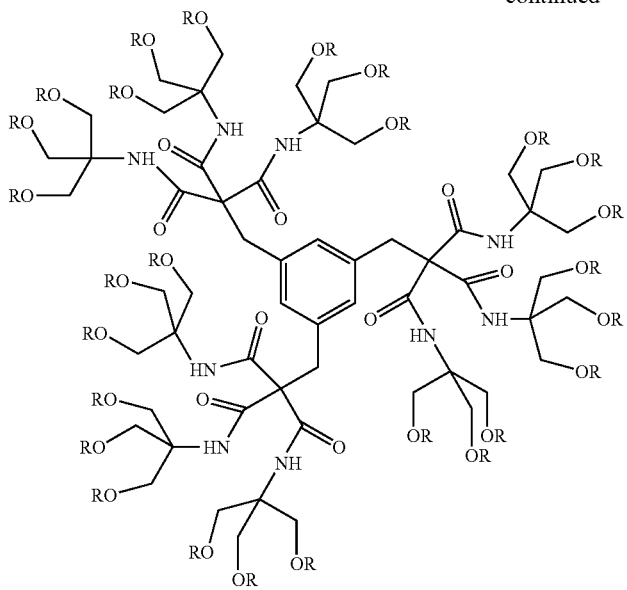

(M-22)

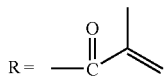

(M-23)

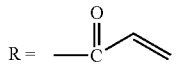

(M-24)

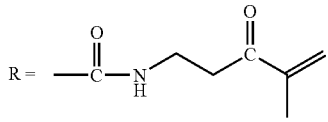

In view of sensitivity, press life and stability, the polymerizable dendrimer is preferably contained in an amount of, in terms of solid contents, 10 to 90 mass %, more preferably from 10 to 80 mass %, and most preferably from 30 to 70 mass %, based on the polymerizable composition of the present invention.

<(2) Radical Initiator>

The polymerizable composition of the present invention must contain (2) a radical initiator. Preferred exiles of the radical initiator include (a) aromatic ketones, (b) aromatic onium salt compounds, (c) organic peroxides, (d) thio compounds, (e) hexaarylbiimidazole compounds, (f) ketooxime ester compounds, (g) borate compounds, (h) azinium compounds, (i) metallocene compounds, (j) active ester compounds and (k) compounds having a carbon halogen bond. Particularly preferred examples of the radical initiator are Onium Salts triazines and lophine dimmers, because the miscibility is good and the crosslinking efficiency is improved.

(a) Aromatic Ketones

Examples of (a) the aromatic ketones preferred as the radical initiator for use in the present invention include compounds having a benzophenone skeleton or a thioxanthone skeleton described in J. P. Fouassier and J. F. Rabek, *Radiation Curing in Polymer Science and Technology*, pp. 77–117 (1993), such as:

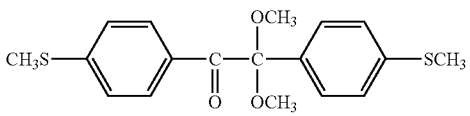

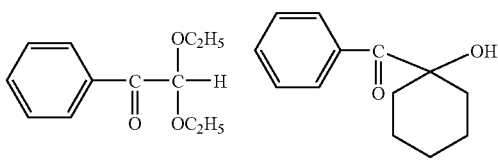

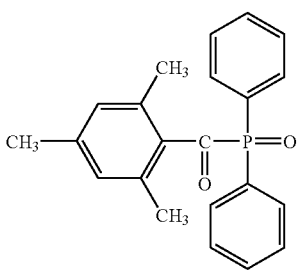

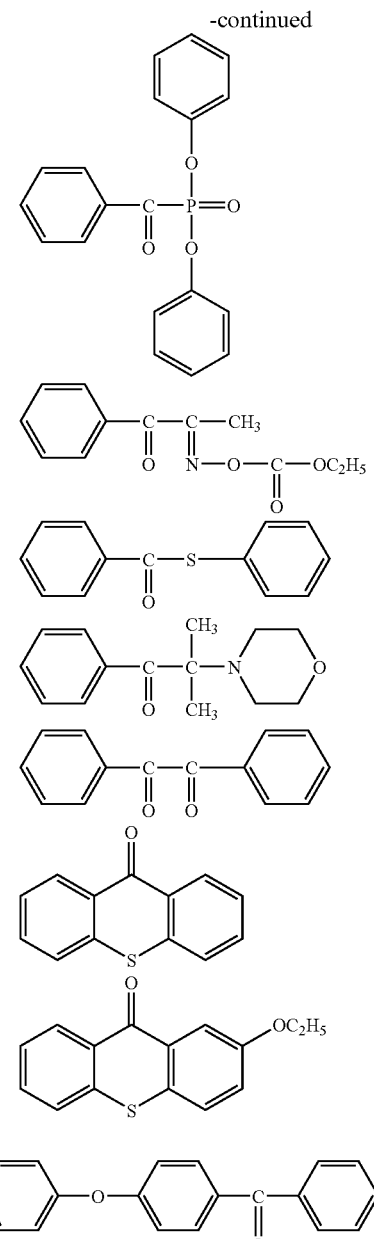

More preferred examples of (a) the aromatic ketones include α-thiobenzophenone compounds described in JP-B-47-6416, benzoin ether compounds described in JP-B-47-3981 such as compounds shown below.

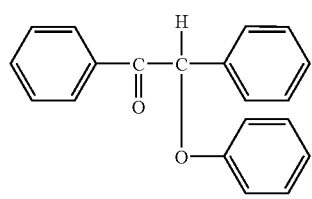

α-substituted benzoin compounds described in JP-3-47-22326 such as compounds shown below:

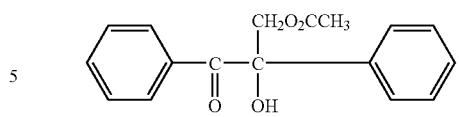

benzoin derivatives described in JP-B-47-23664, aroylphosphonic acid esters described in JP-A-57-30704, dialkoxybenzophenones described in JP-B-60-26483 such as compounds shown below:

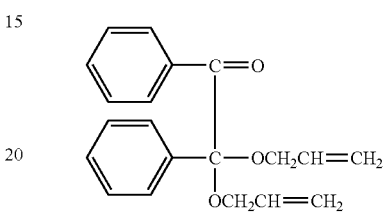

benzoin ethers described in JP-B-60-26403 and JP-A-62-81345 such as compounds shown below:

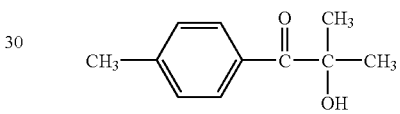

α-aminobenzophenones described in JP-B-1-34242, U.S. Pat. No. 4,318,791 and EP-A-0284561 such as compounds shown below:

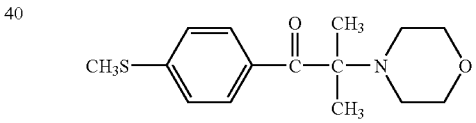

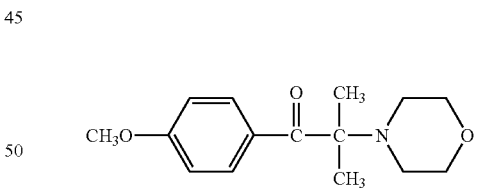

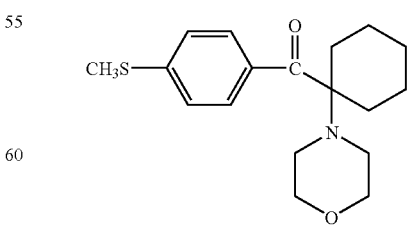

p-di(dimethylaminobenzoyl)benzenes described in JP-A-2-211452 such as compounds shown below:

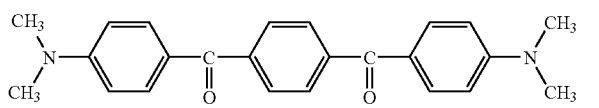

thio-substituted aromatic ketones described in JP-A-61-194062 such as compounds shown below:

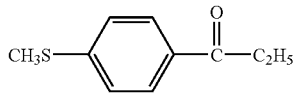

acylphosphine sulfides described in JP-B-2-9597 such as compounds shown below:

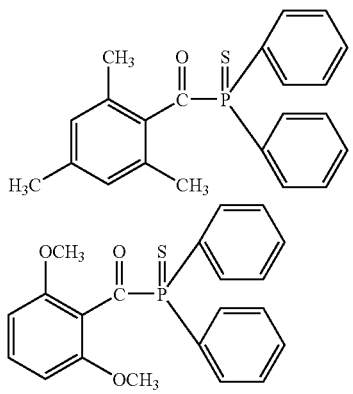

acylphosphines described in JP-B-2-9596 such as compounds shown below:

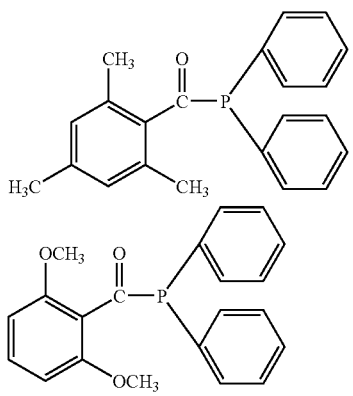

thioxanthones described in JP-B-63-61950 and coumarins described in JP-B-59-42864.

(b) Onium Salt Compound

Examples of (b) the onium salt compound preferred as the radical initiator for use in the present invention include compounds represented by the following formulae (1) to (3):

$$Ar^1—I^+—Ar^2(Z^2)^-$$ Formula (1):

$$Ar^3—N^+\equiv N(Z^3)^-$$ Formula (2):

Formula (3):

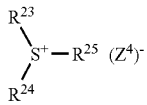

In formula (1), $Ar^2$ and $Ar^2$ each independently represents an aryl group having 20 or less carbon atoms, which may have a substituent. In the case where this aryl group has a substituent, preferred examples of the substituent include a halogen atom, a nitro group, an alkyl group having 12 or less carbon atoms, an alkoxy group having 12 or less carbon atoms and an aryloxy group having 12 or less carbon atoms. $(Z^2)^-$ represents a counter ion selected from the group consisting of perchlorate ion, carboxylate ion, tetrafluoroborate ion, hexafluorophosphate ion and sulfonate ion. The counter ion is preferably perchlorate ion, hexafluorophosphate ion or arylsulfonate ion.

In formula (2), $Ar^3$ represents an aryl group having 20 or less carbon atoms, which may have a substituent. Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $(Z^3)^-$ represents a counter ion having the same meaning as $(Z^2)^-$.

In formula (3), $R^{23}$, $R^{24}$ and $R^{25}$ may be he same or different and each represents a hydrocarbon group having 20 or less carbon atoms, which may have a substituent. Preferred examples of the substituent include a halogen atom, a nitro group, an alkyl group having 12 or less carbon atoms, an alkoxy group having 12 or less carbon atoms, and an aryloxy group having 12 or less carbon atoms. $(Z^4)^-$ represents a counter ion having the same meaning as $(Z^2)^-$.

Specific examples of the onium salt which can be suitably used in the present invention include those described in JP-A-2001-133969 (paragraphs [0030] to [0033]), JP-A-2001-92127 (paragraphs [0096] to [0101]) and JP-A-2001-343742 (paragraphs [0015] to [0046]).

The onium salt for use in the present invention preferably has a maximum absorption wavelength of 400 nm or less, more preferably 360 nm or less. In this way, when the absorption wavelength is in the ultraviolet region, the image recording material produced can be handled under white light.

(c) Organic Peroxide

The organic peroxide (c) preferred as the radical initiator for use in the present invention includes almost all organic compounds having one or more oxygen-oxygen bonds within the molecule and examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy) cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-oxanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tertiary carbonate, 3,3',4,4'-tetra-(tert-butylperoxy-carbonyl)benzophenone, 3,3',4,4'-tetra-(tert-amylperoxy-carbonyl)benzophenone, 3,3',4,4'-tetra-(tert-hexylperoxy-carbonyl)benzophenone, 3,3',4,4'-tetra-(tert-octylperoxy-carbonyl)benzophenone, 3,3',4,4'-tetra-(cumylperoxycarbonyl)benzophenone, 3,3',4,4'-tetra-(p-isopropylcumylperoxycarbonyl)benzophenone, carbonyldi(tert-butylperoxy dihydrogen diphthalate) and carbonyldi (tert-hexylperoxy dihydrogen diphthalate).

Among these, preferred are ester peroxides such as 3,3',4,4'-tetra-(tert-butylperoxycarbonyl)benzophenone, 3,3',4,4'-tetra-(tert-amylperoxycarbonyl)benzophenone, 3,3',4,4'-tetra-(tert-hexylperoxycarbonyl)benzophenone, 3,3',4,4'-tetra-(tert-octylperoxycarbonyl)benzophenone, 3,3',4,4'-tetra-(cumylperoxycarbonyl)benzophenone, 3,3',4,4'-tetra-(p-isopropylcumylperoxycarbonyl)benzophenone and di-tert-butyl diperoxyisophthalate.

(d) Thio Compound

Examples of (d) the thio compound preferred as the radical initiator for use in the present invention include compounds having a structure represented by the following formula (4):

Formula (4):

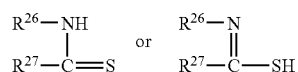

(wherein $R^{26}$ represents an alkyl group, an aryl group or a substituted aryl group and $R^{27}$ represents a hydrogen atom or an alkyl group, or $R^{26}$ and $R^{27}$ each represents a nonmetallic atom group necessary for forming, when combined with each other, a 5-, 6- or 7-membered ring which may contain a heteroatom selected from oxygen atom, sulfur atom and nitrogen atom).

The alkyl group in formula (4) is preferably an alkyl group having from 1 to 4 carbon atoms. The aryl group is preferably an aryl group having from 6 to 10 carbon atoms such as phenyl and naphthyl, and the substituted aryl group includes these aryl groups which are substituted by a halogen atom such as chlorine, an alkyl group such as methyl, or an alkoxy group such as methoxy and ethoxy. $R^{27}$ is preferably an alkyl group having from 1 to 4 carbon atoms. Specific examples of the thio compound represented by formula (4) include the following compounds.

TABLE 1

| No. | $R^{26}$ | $R^{27}$ |
|---|---|---|
| 1 | —H | —H |
| 2 | —H | —CH$_3$ |

TABLE 1-continued

| No. | $R^{26}$ | $R^{27}$ |
|---|---|---|
| 3 | —CH$_3$ | —H |
| 4 | —CH$_3$ | —CH$_3$ |
| 5 | —C$_2$H$_5$ | —C$_2$H$_5$ |
| 6 | —C$_2$H$_5$ | —C$_4$H$_9$ |
| 7 | —C$_6$H$_4$Cl | —CH$_3$ |
| 8 | —C$_6$H$_4$Cl | —C$_4$H$_9$ |
| 9 | —C$_6$H$_4$—CH$_3$ | —C$_4$H$_9$ |
| 10 | —C$_6$H$_4$—OCH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_5$ |
| 14 | —C$_6$H$_4$—OC$_2$H$_5$ | —C$_4$H$_9$ |
| 15 | —(CH$_2$)$_2$— | |
| 16 | —(CH$_2$)$_2$—S— | |
| 17 | —CH(CH$_3$)—CH$_2$—S— | |
| 18 | —CH$_2$—CH(CH$_3$)—S— | |
| 19 | —C(CH$_3$)$_2$—CH$_2$—S— | |
| 20 | —CH$_2$—C(CH$_3$)$_2$—S— | |
| 21 | —(CH$_2$)$_2$—O— | |
| 22 | —CH(CH$_3$)—CH$_2$—O— | |
| 23 | —C(CH$_3$)$_2$—CH$_2$—O— | |
| 24 | —CH=CH—N(CH$_3$)— | |
| 25 | —(CH$_2$)$_3$—S— | |
| 26 | —(CH$_2$)$_2$—CH(CH$_3$)—S— | |
| 27 | —(CH$_2$)$_3$—O— | |
| 28 | —(CH$_2$)$_3$— | |

TABLE 1-continued

| No. | $R^{26}$ | $R^{27}$ |
|---|---|---|
| 29 | | —C$_6$H$_4$—O— |
| 30 | | —N=C(SCH$_3$)—S— |
| 31 | | —C$_6$H$_4$—NH— |
| 32 | | 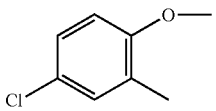 |

(e) Hexaarylbiimidazole Compound

Examples of (e) the hexaarylbiimidazole compound preferred as the radical initiator for use in the present invention include lophine dimers described in JP-B-45-37377 and JP-B-44-86516 such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,21'-bis(o-trifluorophenyl)-4,4',5,5'-tetraphenylbiimidazole.

(f) Ketooxime Ester Compound

Examples of (f) the ketooxime ester compound preferred as the radical initiator for use in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluene-sulfonyloxyiminobutan-2-one and 2-ethoxycarbonyloxyimino-1-phenylpropan-1-one.

(g) Borate Compound

Examples of (g) the borate compound preferred as the radical initiator for use in the present invention include a compound represented by the following formula (5):

Formula (5):

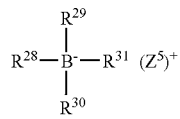

(wherein $R^{21}$, $R^{29}$, $R^{30}$ and $R^{31}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, two or more groups of $R^{28}$, $R^{29}$, $R^{30}$ and $R^{31}$ may combine to form a cyclic structure, provided that at least one of $R^{28}$, $R^{29}$, $R^{30}$ and $R^{31}$ is a substituted or unsubstituted alkyl group, and $(Z^5)^+$ represents an alkali metal cation or a quaternary ammonium cation).

The alkyl group represented by $R^{28}$ to $R^{31}$ includes a linear, branched or cyclic alkyl group preferably having from 1 to 18 carbon atoms. Specific examples thereof include methyl, ethyl, propyl, isopropyl, butyl, pentyl, hexyl, octyl, stearyl, cyclobutyl, cyclopentyl and cyclohexyl. The substituted alkyl group includes these alkyl groups having, as a substituent, a halogen atom (e.g., —Cl, —Br), a cyano group, a nitro group, an aryl group (preferably a phenyl group), a hydroxy group, —COOR$^{32}$ (wherein R$^{32}$ represents a hydrogen atom, an alkyl group having from 1 to 14 carbon atoms or an aryl group), —OCOR$^{33}$, —OR$^{34}$ (wherein R$^{33}$ and R$^{34}$ each represents an alkyl group having from 1 to 14 carbon atoms or an aryl group) or

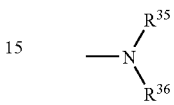

(wherein $R^{35}$ and $R^{36}$ each independently represents a hydrogen atom, an alkyl group having from 1 to 14 carbon atoms or an aryl group).

The aryl group represented by $R^{28}$ to $R^{31}$ includes a mono-, di- or tri-cyclic aryl group such as phenyl group and naphthyl group, and the substituted aryl group includes these aryl groups having a substituent described above for the substituted alkyl group or substituted by an alkyl group having from 1 to 14 carbon atoms. The alkenyl group represented by $R^{28}$ to $R^{31}$ includes a linear, branched or cyclic alkanyl group having from 2 to 18 carbon atoms, and the substituent of the substituted alkenyl group includes the substituents described above for the substituted alkyl group. The alkynyl group represented by $R^{28}$ to $R^{31}$ includes a linear or branched alkynyl group having from 2 to 28 carbon atoms, and the substituent of the substituted alkynyl group includes the substituents described above for the substituted alkyl group. The heterocyclic group represented by $R^{28}$ to $R^{31}$ includes a 5- or greater membered, preferably 5- to 7-membered, heterocyclic group containing at least one of N, S and O, and the heterocyclic group may contain a condensed ring and may further have a substituent described above as the substituent of the substituted alkyl group. Specific examples of the compound represented by formula (5) include the compounds described in U.S. Pat. Nos. 3,567,435 and 4,343,891 and European Patent Nos. 109,772 and 109,773 and the compounds shown below.

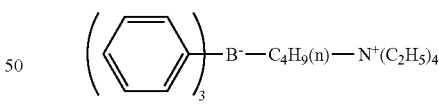

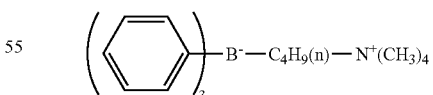

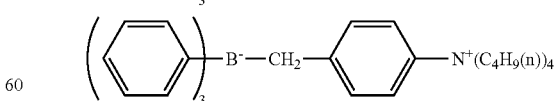

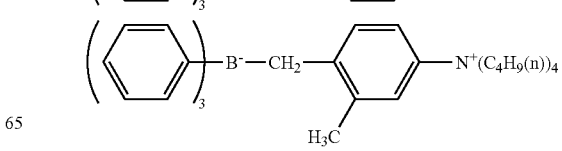

(h) Azinium Compound

Examples of (h) the azinium salt compound (h) preferred as the radical initiator for use in the present invention include the compounds having an N—O bond described in JP-A-63-138345, JP-A-63-142345, JP-A-63-142346, JP-A-63-143537 and JP-B-46-42363.

(i) Metallocene Compound

Examples of (i) the metallocene compound preferred as the radical initiator for use in the present invention include titanocene compounds described in JP-A-59-152396, JP-A-61-151197, JP-A-63-41484, JP-A-2-249 and JP-A-2-4705 and iron-allene complexes described in JP-A-1-304453 and JP-A-1-152109.

Specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, di-methylcyclopentadienyl-Ti-bis-2,3,5,6-tetrafluorophen-1-yl, dimethylcyclopentadienyl-Ti-bis-2,4-difluorophen-1-yl, bis-(cyclopentadienyl)-bis(2,6-difluoro-3-(pyr-1-yl)phenyl)-titanium, bis(cyclopentadienyl)bis[2,6-difluoro-3-(methyl-sulfonamido)phenyl]titanium, bis(cyclopentadienyl)bis[2,6-difluoro-3-(N-butylbialloylamino)phenyl]titanium, bis(cyclopentadienyl)bis[2,6-difluoro-3-(N-butyl-(4-chlorobenzoyl)amino)phenyl]titanium, bis(cyclopentadienyl)bis-[2,6-difluoro-3-(N-benzyl-2,2-dimethylpropanoylamino)-phenyl]titanium, bis(cyclopentadienyl)bis[2,6-difluoro-3-(N-(2-ethylhexyl)-4-tolyl-sulfonyl)amino)phenyl]titanium, bis(cyclopentadienyl)bis[2,6-difluoro-3-(N-(3-oxaheptyl)benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonyl)amino)phenyl]titanium, bis(cyclopentadienyl)bis-[2,6-difluoro-3-(trifluoroacetylamino)phenyl]titanium, bis(cyclopentadienyl)bis [2,6-difluoro-3-(2-chlorobenzoyl)-amino)phenyl]titanium, bis(cyclopentadienyl)bis[2,6-difluoro-3-(4-chlorobenzoyl)amino)phenyl]titanium, bis-(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxy-octyl)benzoylamino)phenyl]titanium and bis(cyclopentadienyl)bis[2,6-difluoro-3-(N-cyclohexylbenzoylamino)-phenyl]titanium.

(j) Active Ester Compound

Examples, of (J) the active ester compound preferred as the radical initiator for use in the present invention include imidosulfonate compounds described in JP-B-62-6223 and active sulfonates described in JP-B-63-14340 and JP-A-59-174831.

(k) Compound Having Carbon Halogen Bond

Examples of (k) the compound having a carbon halogen bond preferred as the radical initiator for use in the present invention include those represented by the following formulae (6) to (12):

Formula (6):

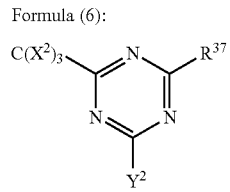

(wherein $X^2$ represents a halogen atom, $Y^2$ represents $-C(X^2)_3$, $-NH_2$, $-NHR^{38}$, $-NR^{38}$ or $-OR^{38}$ (wherein $R^{38}$ represents an alkyl group, a substituted alkyl group, an aryl group or a substituted aryl group) and $R^{37}$ represents $-C(X^2)_3$, an alkyl group, a substituted alkyl group, an aryl group, a substituted aryl group or a substituted alkenyl group).

Formula (7):

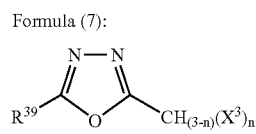

(wherein $R^{39}$ represents an alkyl group, a substituted alkyl group, an alkenyl group, a substituted alkenyl group, an aryl group, a substituted aryl group, a halogen atom, an alkoxy group, a substituted alkoxyl group, a nitro group or a cyano group, $X^3$ represents a halogen atom and n represents an integer of from 1 to 3).

$$R^{40}-Z^6-CH_{(2-m)}(X^3)_m R^{41} \qquad \text{Formula (8):}$$

(wherein R40 represents an aryl group or a substituted aryl group, R41 represents a group shown below or a halogen, $Z^6$ represents $-C(=O)-$, $-C(=S)-$ or $-SO_2-$),

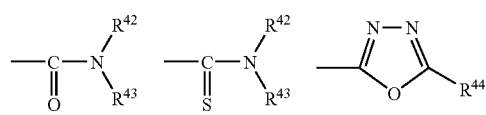

(wherein $R^{42}$ and $R^{43}$ each represents an alkyl group, a substituted alkyl group, an alkenyl group, a substituted alkenyl group, an aryl group or a substituted aryl group, $R^{44}$ has the same meaning as $R^{38}$ in formula (6), $X^3$ represents a halogen atom, and m represents 1 or 2).

Formula (9):

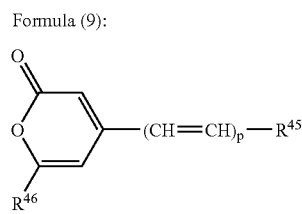

(wherein $R^{45}$ represents an aryl group which may be substituted or a heterocyclic group which may be substituted, $R^{46}$ represents a trihaloalkyl or trihaloalkenyl group having from 1 to 3 carbon atoms, and p represents 1, 2 or 3; a carbonylmethylene heterocyclic compound having a trihalogenomethyl group, represented by:

Formula (10):

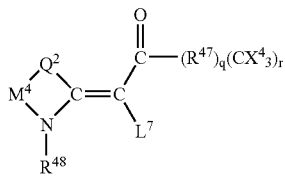

(wherein $L^7$ represents hydrogen atom or a substituent represented by the formula: $CO—(R^{47})_q(C(X^4)_3)_r$, $Q^2$ represents a sulfur atom, a selenium atom, an oxygen atom, a dialkylmethylene group, an alken-1,2-ylene group, 1,2-phenylene group or an N—R group, $M^4$ represents a substituted or unsubstituted alkylene or alkenylene group or a 1,2-arylene group, $R^{48}$ represents an alkyl group, an aralkyl group or an alkoxyalkyl group, $R^{47}$ represents a carbocyclic or heterocyclic divalent aromatic group, $X^4$ represents a chlorine atom, a bromine atom or an iodine atom, and q=0 and r=1, or q=1 and r=1 or 2); a 4-halogeno-5-(halogenomethyl-phenyl)-oxazole derivative represented by:

Formula (11):

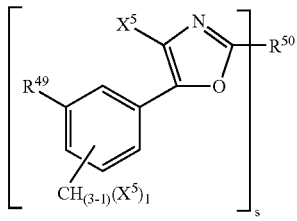

(wherein $X^5$ represents a halogen atom, t represents an integer of 1 to 3, s represents an integer of 1 to 4, $R^{49}$ represents a hydrogen atom or a $CH_{3-t}X^5_t$ group, and $R^{50}$ represents an s-valent unsaturated organic group which may be substituted); and a 2-(halogenomethyl-phenyl)-4-halogeno-oxazole derivative represented by:

Formula (12):

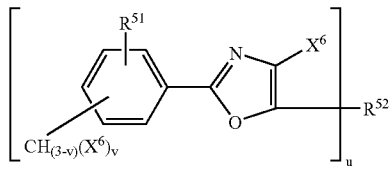

(wherein $X^6$ represents a halogen atom, v represents an integer of 1 to 3, u represents an integer of 1 to 4, $R^{51}$ represents a hydrogen atom or a $CH_{3-v}X^6_v$ group, and $R^{52}$ represents a u-valent unsaturated organic group which may be substituted).

Specific examples of the compound having a carbon-halogen bond include: compounds described, for example, in Wakabayashi at al, Bull. Chem. Soc. Japan, 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine; compounds described in British Patent 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-s-triazine; compounds described in JP-A-53-133428 such as 2-(4-methoxynaphtho-1-yl)-4,6-bis-trichloromethyl-S-triazine, 2-(4-ethoxynaphtho-1-yl)-4,6-bis-trichloromethyl-S-triazine, 2-[4-(2-ethoxyethyl)-naphtho-1-yl]-4,6-bis-trichloroethyl-S-triazine, 2-(4,7-dimethoxynaphtho-1-yl)-4,6-bis-trichloromethyl-S-triazine and 2-(acenaphtho-5-yl)-4,6-bis-trichloromethyl-S-triazine, compounds described in German Patent No. 3,337,024 such as compounds shown below:

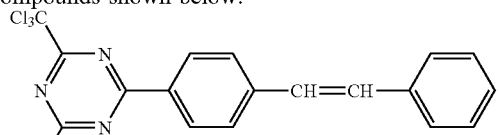

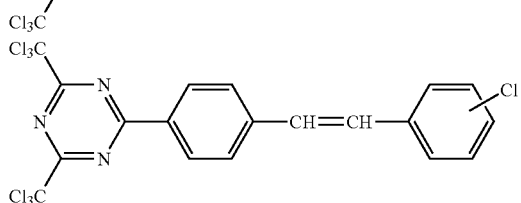

compounds described in F. C. Schaefer et al., J. Org. Chem., 29, 1527 (1964) such as 2-methyl-4,6-bis(tribromomethyl)-S-triazine, 2,4,6-tris(tribromomethyl)-S-triazine, 2,4,6-tris(tribromomethyl)-S-triazine, 2-amino-4-methyl-6-tribromomethyl-S-triazine and 2-methoxy-4-methyl-6-trichloromethyl-S-triazine; compounds described in JP-A-62-58241 such a compounds shown below:

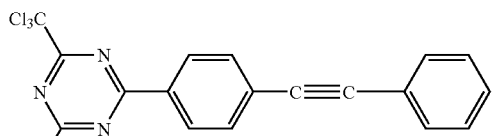

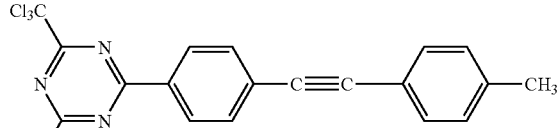

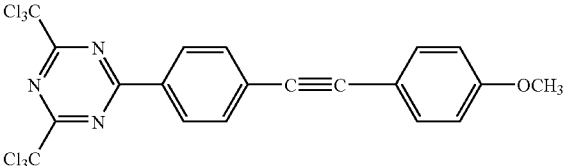

compounds described in JP-A-5-281728 such as compounds shown below:

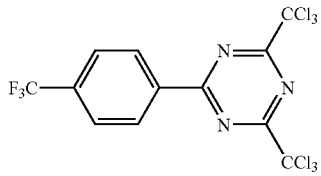

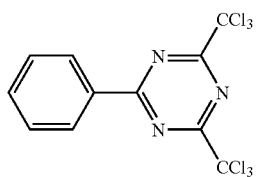

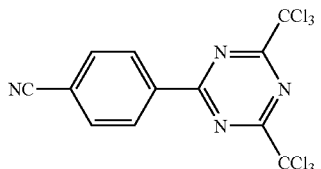

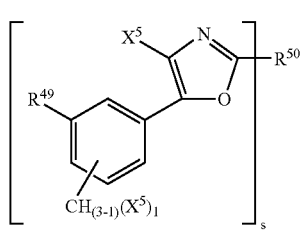

and compounds which can be easily synthesized by a person skilled in the art according to the synthesis method described in M. P. Hutt, E. F. Elslager and L. M. Herbel, *Journal of Heterocyclic Chemistry*, Vol. 7 (No. 3), page 511 et seq. (1970), such as compound shown below:

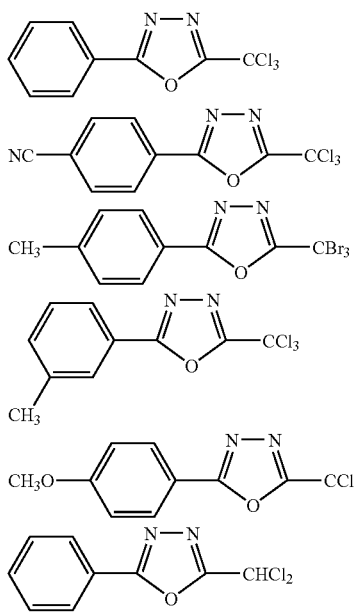

-continued

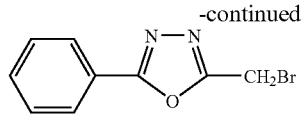

Specific aromatic sulfonium salts described, for example, in JP-A-2001-92127 and Japanese Patent Application Nos. 2000-266797, 2001-177150 and 2000-184603 previously proposed by the present inventors are also preferred as the radical initiator.

Most preferred examples of the radical initiator for use in the polymerizable composition of the present invention include titanocene compounds, aromatic sulfonium salts and trihalomethyl-S-triazine compounds.

Only one of these radical initiators may be used or two or more thereof may be used in combination.

The radical initiator is preferably added in an amount of, in terms of solid contents, from 0.01 to 10 wt %, more preferably from 0.1 to 2 wt %, based on the polymerizable composition.

<(3) Alkali-Soluble Polymer>

The polymerizable composition of the present invention must contain an alkali-soluble polymer. The alkali-soluble polymer may be any polymer as long as it is an alkali-soluble polymer having compatibility with the polymerizable dendrimer. preferably a water- or alkali-water soluble or swellable organic high molecular polymer enabling water or alkali water development is selected.

The main chain of the alkali-soluble polymer is not particularly limited, but the polymer main chain preferred in view of effects includes polyurethane, polyamide, polyester, polyvinyl, polystyrene, poly(meth)acryl and novolak-based polymer, with polystyrene and ply(meth)acryl being more preferred.

The alkali-soluble polymer includes a homopolymer containing an acidic group in the main chain and/or side chain of the polymer, and a copolymer or mixture thereof. Accordingly, the recording layer comprising the polymerizable composition of the present invention dissolves when contacted with an alkaline developer.

Among these, alkali-soluble polymers having, in the main chain and/or side chain of the polymer, an acidic group set forth in the following (1) to (6) are preferred in view of solubility in an alkaline developer.

(1) Phenolic hydroxyl group (—Ar—OH)
(2) Sulfonamido group (—SO$_2$NH—R)
(3) Substituted sulfonamide-based acid group (hereinafter referred to as "active imide group") (—SO$_2$NHCOR, —SO$_2$NHSO$_2$R, —CONHSO$_2$R)
(4) Carboxylic acid group (—CO$_2$H)
(5) Sulfonic acid group (—SO$_3$H)
(6) Phosphoric acid group (—OPO$_3$H$_2$)

In (1) to (6) above, Ar represents a divalent aryl linking group which may have a substituent, and R represents a hydrogen atom or a hydrocarbon group which may have a substituent.

Among these alkali-soluble groups selected from (1) to (6) above, those having (1) a phenol group, (2) a sulfonamide group or (4) a carboxylic acid group are preferred. In particular, a specific polymer having (4) a carboxylic acid group as the alkali-soluble group is mot preferred because satisfactory solubility or swellability and press life property can be ensured.

The alkali water-soluble polymer having (1) a phenol group is preferably a polymer having a hydroxyaryl group in the side chain, and examples of the hydroxyaryl group in the polymer include an aryl group where one or more OH group is bonded.

Examples of the polymer having a hydroxyaryl group in the side chain include polymers containing any one of the constituent units represented by the following formulae (a) to (d).

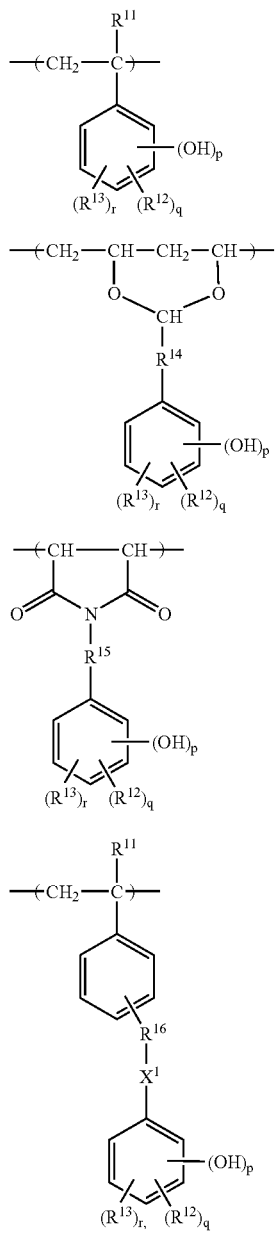

In formulae (a) to (d), $R^{11}$ represents a hydrogen atom or a methyl group, $R^{12}$ and $R^{13}$, which may be the same or different, each represents a hydrogen atom, a halogen atom, a hydrocarbon group having 10 or less carbon atoms, an alkoxy group having 10 or less carbon atoms or an aryloxy group having 10 or less carbon atoms, $R^{12}$ and $R^{13}$ may be combined or condensed to form a benzene ring or a cyclohexane ring, $R^{12}$ represents a single bond or a divalent hydrocarbon group having 20 or less carbon atoms, $R^{15}$ represents a single bond or a divalent hydrocarbon group having 20 or less carbon atoms, $R^{16}$ represents a single bond or a divalent hydrocarbon group having 10 or less carbon atoms, X1 represents a single bond, an ether bond, a thioether bond, an ester bond or an amide bond, p represents an integer of 1 to 4, and q and r each independently represents an integer of 0 to 3.

Examples of the alkali water-soluble polymer having 2) a sulfonamide group include polymers comprising, as a main constituent component, a minimum constituent unit originated in a compound having a sulfonamide group. Examples of such a compound include compounds having one or more sulfonamide group containing at least one hydrogen atom bonded to the nitrogen atom and one or more polymerizable unsaturated bond. Among these, low molecular compounds having an acryloyl, allyl or vinyloxy group and a substituted or mono-substituted aminosulfonyl group or a substituted sulfonylimino group within the molecule are preferred. Examples thereof include the compounds represented by the following formulae (i) to (v).

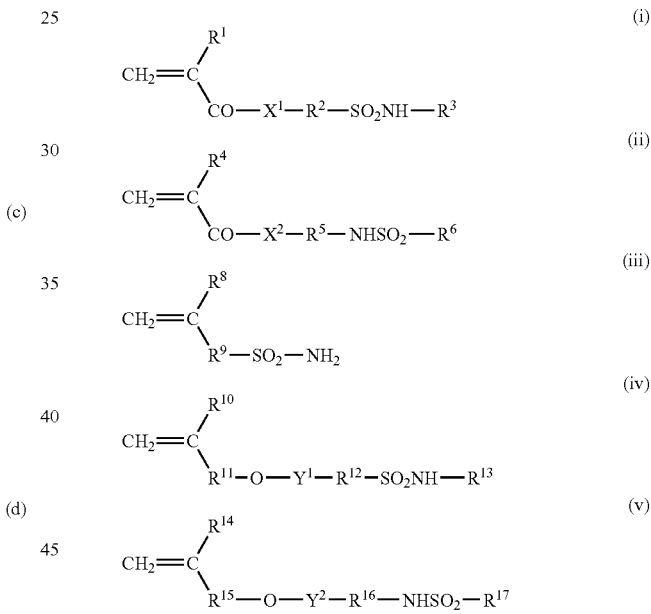

[wherein $X^1$ and $X^2$ each independently represents —O— or —$NR^7$—, $R^1$ and $R^4$ each represents hydrogen atom or —$CH_3$, $R^2$, $R^5$, $R^9$, $R^{12}$ and $R^{16}$ each independently represents an alkylene group having from 1 to 12 carbon atoms, which may have a substituent, a cycloalkylene group which may have a substituent, an arylene group which may have a substituent, or an aralkylene group which may have a substituent, $R^3$, $R^7$ and $R^{13}$ each independently represents a hydrogen atom, an alkyl group having from 1 to 12 carbon atoms, which may have a substituent, a cycloalkyl group which may have a substituent, an aryl group which may have a substituent, or an aralkyl group which may have a substituent, $R^6$ and $R^{17}$ each independently represents an alkyl group having from 1 to 12 carbon atoms, which may have a substituent, a cycloalkyl group which may have a substituent, an aryl group which may have a substituent, or aralkyl group which may have a substituent, $R^8$, $R^{10}$ and $R^{14}$ each independently represents a hydrogen atom or —$CH_3$, $R^{11}$ and $R^{15}$ each independently represents a single bond, an alkylene group having from 1 to 12 carbon atoms, which may have a substituent, a cycloalkylene group which may have a substituent, an arylene group which may have a substituent, or an aralkylene group which may have a substituent, and $Y^1$ and $Y^2$ each independently represents a single bond or —CO—].

Examples of the alkali water-soluble polymer having (3) an active imide group include polymers comprising, as a main constituent component, a minimum constituent unit originated in a compound having an active imide group. Examples of such a compound include compounds having one or more active imido group represented by the following formula and one or more polymerizable unsaturated bond within the molecule.

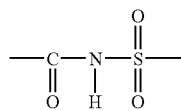

Examples of the alkali water-soluble polymer having (4) a carboxylic acid group include polymers comprising, as a main constituent component, a minimum constituent unit originated in a compound having one or more carboxylic acid group and one or more polymerizable unsaturated group within the molecule.

Examples of the alkali-soluble polymer having (5) a sulfonic acid group include polymers comprising, as a main constituent component, a minimum constituent unit originated in a compound having one or more sulfonic acid group and one or more polymerizable unsaturated group within the molecule.

Examples of the alkali water-soluble polymer having (6) a phosphoric acid group include polymers comprising, as a main constituent component, a minimum constituent unit originated in a compound having one or more phosphoric acid group and one or more polymerizable unsaturated group within the molecules.

The minimum constituent unit having an acidic group selected from (1) to (6) above, constituting the alkali water-soluble polymer for use in the present invention, need not be one unit, but those obtained by copolymerizing two or more minimum constituent units having the same acidic group, or two or more minimum constituent units differing in the acid group may also be used.

For the copolymerization, a conventionally known method such as graft copolymerization, block copolymerization and random copolymerization can be used.

The amount of the alkali-soluble group into the polymer is not particularly limited as long as by virtue of the presence of the alkali-soluble group, the polymer can dissolve in an alkali developer at a pH of 10 to 13, but in general, the compound having an acidic group selected from (1) to (6) is preferably contained in an amount of 10 mol % or more, more preferably 20 mol % or more, in the copolymer.

The acidic group constituting the alkali water-soluble polymer for use in the present invention is most preferably an acidic group having a specific functional group represented by the following formula (I);

Formula (I):

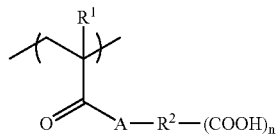

In formula (I), $R^1$ represents a hydrogen atom or a methyl group, $R^2$ represents a linking group comprising two or more atoms selected from the group consisting of a carbon atom, a hydrogen atom, an oxygen atom, a nitrogen atom and a sulfur atom, where the number of atoms is from 2 to 82, A represents an oxygen atom or —$NR^3$, $R^3$ represents a hydrogen atom or a monovalent hydrocarbon group, and n represents an integer of 1 to 5.

$R^1$ in formula (I) represents a hydrogen atom or a methyl group, preferably a methyl group.

The linking group represented by $R^2$ in formula (I) comprises two or more atoms selected from the group consisting of a carbon atom, a hydrogen atom, an oxygen atom, a nitrogen atom and a sulfur atom, and the number of atoms is from 2 to 82, preferably from 2 to 50, more preferably from 2 to 30. The number of atoms as used herein indicates, when the linking group has a substituent, a number of atoms including the substituent.

More specifically, the number of atoms constituting the main frame of the linking group represented by $R^2$ is preferably from 1 to 30, more preferably from 3 to 25, still more preferably from 4 to 20, and most preferably from 5 to 10. The "main frame of the linking group" as used in the present invention indicates an atom or atomic group used only for linking A to terminal COOH in formula (I) and particularly, when multiple linking paths are present, indicates an atom or an atomic group constituting a path having a smallest number of atoms used. Accordingly, in the case of having a ring structure in the linking group, the number of atoms included differs depending on the linking site (for example, o-, m- or p-).

Among these, the linking group represented by $R^2$ in formula is preferably a (n+1)-valent hydrocarbon group having an aliphatic cyclic or chained structure with from 3 to 30 carbon atoms. Specific examples thereof include a (n+1)-valent hydrocarbon group formed by eliminating (n+1) hydrogen atoms on arbitrary carbon atoms constituting a compound containing an aliphatic cyclic structure such as cyclopropane, cyclopentane, cyclohexane, cycloheptane, cyclooctane, cyclodecane, dicyclohexyl, tercyclohexyl and norbornane, which may be substituted by one or more arbitrary substituent, or constituting a compound containing an aliphatic chained structure having from 5 to 20 atoms.

An arbitrary carbon atom constituting the compound constituting the aliphatic cyclic or chained structure may be replaced with one or more heteroatom selected from a nitrogen atom, an oxygen atom and a sulfur atom.

The substituent which can be introduced into the linking group represented by $R^2$ include a monovalent nonmetallic atom group exclusive of hydrogen, such as a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino groups an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and a conjugate base group thereof, an alkoxycarbonyl group, an aryloxycarbonyl group, a carbamoyl group, an N-alkylcarbamoyl group, an N,N-dialkylcarbamaoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo (—SO$_3$H) group and a conjugate bass group thereof, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acyleulfamoyl group and a conjugate base group thereof, an N-alkylsulfonylsulfamoyl group (—SO$_2$NHSO$_2$(alkyl)) and a conjugate base group thereof, an N-arylsulfonylsulfamoyl group (—SO$_2$NHSO$_2$(aryl)) and a conjugate base group thereof, an N-alkylsulfonylcarbamoyl group (—CONHSO$_2$(alkyl)) and a conjugate base group thereof, an N-arylsulfonylcarbamoyl group (—CONHSO$_2$(aryl)) and a conjugate base group thereof, an alkoxysilyl group (—Si(O-alkyl)$_3$), an aryloxysilyl group (—Si(O-aryl)$_3$), a hydroxysilyl group (—Si(OH)$_3$) and a conjugate base group thereof, a phosphono group (—PO$_3$H$_2$) and a conjugate base group thereof, a dialkylphosphono group (—PO$_3$(alkyl)$_2$) a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugate base group thereof, a monoarylphosphono group (—PO$_3$H(aryl)) and a conjugate base group thereof, a phosphonoxy group (—OPO$_3$H$_2$) and a conjugate base group thereof, a dialkylphosphonoxy group (—OPO$_3$(alkyl)$_2$), a diarylphosphonoxy group (—OPO$_3$(aryl)$_2$), an alkylarylphosphonoxy group (—OPO$_3$(alkyl)(aryl)) a monoalkylphosphonoxy group (—OPO$_3$H(alkyl)) and a conjugate base group thereof, a monoarylphosphonoxy group (—OPO$_3$H(aryl)) and a conjugate base group thereof, a cyano group, a nitro group, a dialkylboryl group (—B(alkyl)$_2$), a diarylboryl group (—B(aryl)$_2$), an alkylarylboryl group (—B(alkyl)(aryl)), a dihydroxyboryl group (—B(OH)$_2$) and a conjugate base group thereof, an alkylhydroxyboryl group (—B(alkyl)(OH)) and a conjugate base group thereof, an arylhydroxyboryl group (—B(aryl)(OH)) and a conjugate base group thereof, an aryl group, an alkenyl group and an alkynyl group.

Among these, hydrophobic groups such as halogen atom and hydrocarbon group (e.g., alkyl, aryl, alkenyl, alkynyl), alkoxy group and aryloxy group are preferred because the press life property tends to be enhanced. Particularly, when the cyclic structure is a 6-membered or less monocyclic aliphatic hydrocarbon such as cyclopentane and cyclohexane, such a hydrophobic substituent is preferably introduced. These substituents may combine, if possible, with each other or combine with the hydrocarbon group to which the substituent is bonded, and the substituent may be further substituted.

In formula (I), A represents an oxygen atom or —NR$^3$— and when A is —NR$^3$—, R$^3$ represents a hydrogen atom or a monovalent hydrocarbon group having from 1 to 10 carbon atoms. Examples of the monovalent hydrocarbon group having from 1 to 10 carbon atoms represented by R$^3$ include an alkyl group, an aryl group, an alkenyl group and an alkynyl group.

Specific examples of the alkyl group include a linear, branched or cyclic alkyl group having from 1 to 10 carbon atoms, such as methyl group, ethyl group, propyl group, butyl group, pentyl group, hexyl group, heptyl group, octyl group, nonyl group, decyl group, isopropyl group, isobutyl group, sec-butyl group, tert-butyl group, isopentyl group, neopentyl group, 1-methylbutyl group, isohexyl group, 2-ethylhexyl group, 2-methylhexyl group, cyclopentyl group, cyclohexyl group, 1-adamantyl group and 2-norbornyl group.

Specific examples of the aryl group include an aryl group having from 1 to 10 carbon atoms, such as phenyl group, naphthyl group and indenyl group, and a heteroaryl group having from 1 to 10 carbon atoms and containing one heteroatom selected from the group consisting of a nitrogen atom, an oxygen atom and a sulfur atom, such as furyl group, thienyl group, pyrrolyl group, pyridyl group and quinolyl group.

Specific examples of the alkenyl group include a linear, branched or cyclic alkenyl group having from 1 to 10 carbon atoms, such as vinyl group, 1-propenyl group, 1-butenyl group, 1-methyl-1-propenyl group, 1-cyclopentenyl group and 1-cyclohexenyl group.

Specific examples of the alkynyl group include an alkynyl group having from 1 to 10 carbon at, such as ethynyl group, 1-propynyl group, 1-butynyl group and 1-octynyl group. Examples of the substituent which R$^3$ may have are the same as those of the substituent which can be introduced into R$^2$. However, the number of carbon atoms in R$^3$ is from 1 to 10 including carbon atoms of the substituent.

A in formula (I) is preferably an oxygen atom or —NH—, because synthesis is easy.

n in formula (I) represents an integer of 1 to 5 and from the standpoint of obtaining excellent film property, preferably 1.

In view of enhanced film property, the alkali-soluble polymer for use in the present invention preferably has a polymerizable group. The radical polymerizable which can be introduced into the alkali-soluble polymer is described in detail below. The radical polymerizable group is not particularly limited as long as the group can be radical-polymerized.

Preferred examples thereof include an α-substituted methyl acryl group [—OC(=O)—C(—CH$_2$Z)=CH$_2$ (wherein Z is a hydrocarbon group starting from a heteroatom)], an acryl group, a methacryl group, an allyl group and a styryl group. Among these, more preferred are an acryl group and a methacryl group.

The content of the radical polymerizable group (the content of radical polymerizable unsaturated double bond as measured by bromine titration) in the polymer is, in view of sensitivity, film property and storage stability, preferably from 0.1 to 10.0 mmol, more preferably from 1.0 to 7.0 mmol, and most preferably from 2.0 to 5.0 mmol, per g of the polymer.

In the alkali-soluble polymer, in addition to those alkali-soluble group and radical polymerizable group, other constituent units may be copolymerized for various purposes such as enhancement of film property, within the range of not impairing the effects of the present invention.

Examples of the other structural unit which can be used in combination include structural units originated in known monomers such as acrylic acid esters, methacrylic amid esters, acrylamides, methacrylamides, vinyl esters, styrenes, acrylic acid, methacrylic acid, acrylonitrile, maleic anhydride and malic acid imide.

Examples of the acrylic acid esters include methyl acrylate, ethyl acrylate, (n- or i-)propyl acrylate, (n-, i-, sec- or tert-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol mono-acrylate, glycidyl acrylate, benzyl acrylate, methoxybenzyl acrylate, chlorobenzyl acrylate, 2-(p-hydroxyphenyl)ethyl acrylate, furfuryl acrylate, tetrahydrofurfuryl acrylate, phenyl acrylate, chlorophenyl acrylate and sulfamoylphenyl acrylate.

Examples of the methacrylic acid esters include methyl methacrylate, ethyl methacrylate, (n- or i-)propyl methacrylate, (n-, i-, sec- or tert-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, methoxybenzyl methacrylate, chlorobenzyl methacrylate, 2-(p-hydroxyphenyl)ethyl methacrylate, furfuryl methacrylate, tetrahydrofurfuryl methacrylate, phenyl methacrylate, chlorophenyl methacrylate and sulfamoylphenyl methacrylate.

Examples of the acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(p-hydroxyphenyl)acrylamide, N-(sulfamoylphenyl)acrylamide, N-(phenylsulfonyl)acrylamide, N-(tolylsulfonyl)acrylamide, N,N-dimethylacrylamide, N-methyl-N-phenylacrylamide and N-hydroxyethyl-N-methylacrylamide.

Examples of the methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(p-hydroxyphenyl)methacrylamide, N-(sulfamoylphenyl)methacrylamide, N-(phenylsulfonyl)methacrylamide, N-(tolylsulfonyl)-methacrylamide, N,N-dimethylmethacrylamide, N-methyl-N-phenylmethacrylamide and N-hydroxyethyl-N-methylmethacrylamide.

Examples of the vinyl esters include vinyl acetate, vinyl butyrate and vinyl benzoate.

Examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene and carboxystyrene.

Among these monomers, preferred are acrylic acid esters having 20 or less carbon atoms, methacrylic acid esters, acrylamides, methacrylamides, vinyl esters, styrenes, acrylic acid, methacrylic acid and acrylonitrile.

In the case of using the polymerizable composition of the present invention for a recording layer of an image recording material as described later, the binder polymer may be (3) the alkali-soluble polymer alone or may be a mixture by using one or other alkali-soluble polymer or other polymer in combination.

The binder polymer used in combination is used in an amount of 1 to 60 wt %, preferably from 1 to 40 wt %, more preferably from 1 to 30 wt %, based on the total weight of binder polymer components. As for the binder polymer which can be used in combination, conventionally known binder polymers can be used without limitation and specifically, an acryl main chain binder often used in this industry, a urethane binder or the like is preferably used.

The total amount of the alkali-soluble polymer and the binder polymer which can be used in combination, in the recording layer may be appropriately selected but usually, this is preferably from 10 to 90 wt %, more preferably from 20 to 80 wt %, and most preferably from 30 to 70 wt %, based on the total weight of nonvolatile components in the recording layer.

The acid value (meg/g) of the alkali-soluble polymer is, in view of developability, inking property and press life, preferably from 0.01 to 10.00, more preferably from 0.1 to 7.0, and most preferably from 0.2 to 5.0.

The weight average molecular weight of the alkali-soluble polymer for use in the present invention is appropriately determined by taking account of image-forming property and press life. Usually, as the molecular weight is higher, the press life is more enhanced but the image-forming property tends to deteriorate and the handleability also decreases. On the other hand, as the molecular weight is lower, the film property and press life tends to decrease, though the image-forming property is enhanced. The molecular weight is preferably from 2,000 to 1,000,000, more preferably from 5,000 to 500,000, still more preferably from 10,000 to 300,000.

The glass transition point (Tg) of the alkali-soluble polymer is, in view of film property and sensitivity, preferably from 0 to 300° C., more preferably from 20 to 250° C., and most preferably from 50 to 200° C.

The degree of dispersion [weight average molecular weight (Mw)/number average molecular weight (Mn)] of the alkali-soluble polymer for use in the present invention is, from the standpoint of preventing undesired penetration of the developer into image at the development, preferably 2.5 or less, more preferably from 1 to 2.0, and most preferably from 1 to 1.5.

The alkali-soluble polymer for use in the present invention may be a linear polymer or a branched polymer or may have a block structure or a graft structure.

<(4) Sensitizing Dye>

From the standpoint of enhancing the sensitivity, the polymerizable composition of the present invention preferably further comprises a sensitizing dye, for example, an ultraviolet absorbent having a maximum absorption (λmax) or 150 to 300 nm, a visible light absorbent having λmax of 330 to 700 nm, or an infrared absorbent having λmax of 800 to 1,300 nm. The sensitizing dye includes a spectral sensitizing dye and a dyestuff or pigment which absorbs light of a light source and interacts with the radical initiator. For example, in the case of using the polymerizable composition of the present invention for a recording layer of an image recording material recordable by infrared exposure, such as lithographic printing plate precursor, an infrared absorbent having a maximum absorption in the wavelength region of infrared ray is used as the sensitizing dye.

Preferred examples of the spectral sensitizing dye or dyestuff preferred as the sensitizing dye for use in the present invention include polynuclear aromatics (e.g., pyrene, perylene, triphenylene), xanthenes (e.g., fluorescein, eosine, erythrosine, Rhodamine B, Rose Bengal), cyanines (e.g., thiacarbocyanine, oxacarbocyanine), merocyanines (e.g., merocyanine, carbomerocyanine), thiazines (e.g., thionine, ethylene blue, toluidine blue), acridines (e.g., acridine orange, chloroflavin, acriflavine), phthalocyanines (e.g., phthalocyanine, metal phthalocyanine), porphyrins (e.g., tetraphenyl porphyrin, center metal-substituted porphyrin), chlorophylls (e.g., chlorophyll, chlorophyllin, center metal-substituted chlorophyll), metal complexes (e.g., compound shown below), anthraquinones (e.g., anthraquinone) and squaliums (e.g., squalium). Cyanine dyes and merocyanine dyes are especially preferable, because the crosslinking efficiency at heating is dramatically improved.

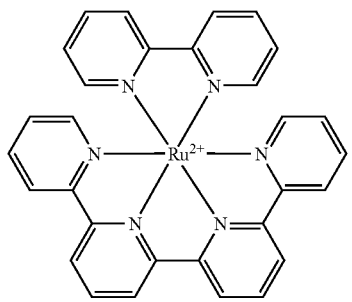

More preferred examples of the spectral sensitizing dye or dyestuff are set forth below.

Styryl-based Dyes Described in JP-B-37-13034:

Specific preferred examples include the following compounds:

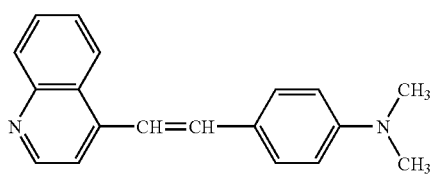

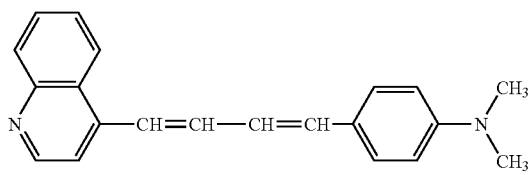

Cationic Dyes Described in JP-A-62-143044:

Specific preferred examples include the following compounds:

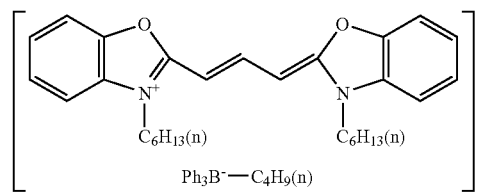

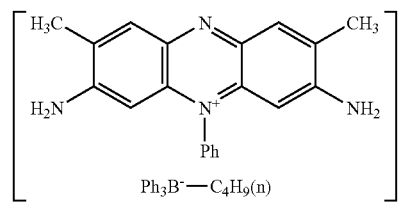

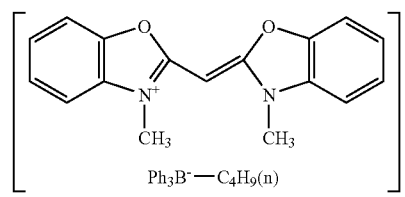

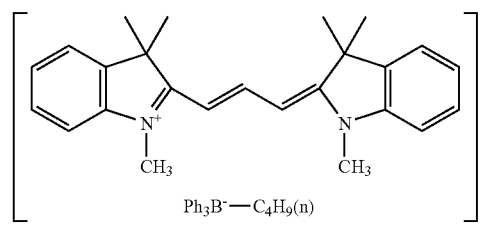

Quinoxalinium Salts Described in JP-B-59-24147;

Specific preferred examples include the following compounds:

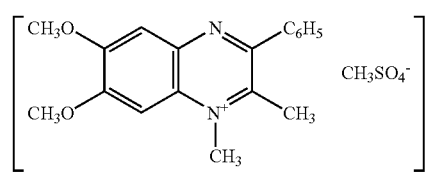

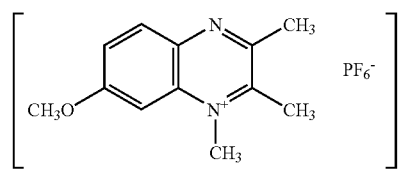

New Methylene Blue Compounds Described in JP-A-64-33104:

Specific preferred examples include the following compounds:

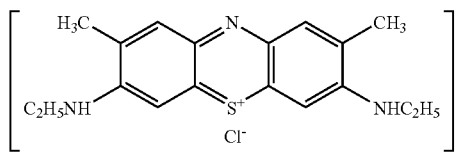

Anthraquinones Described in JP-A-64-56767;

Specific preferred examples include the following compounds:

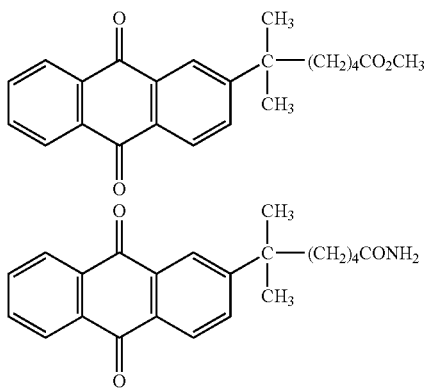

Benzoxanthene Dyes Described in JP-A-2-1714 and Acridines Described in JP-A-2-226148 and JP-A-2-226149:

Specific preferred examples include the following compounds:

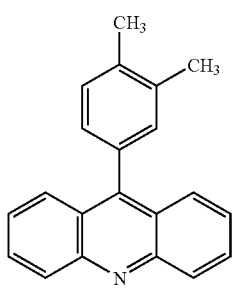

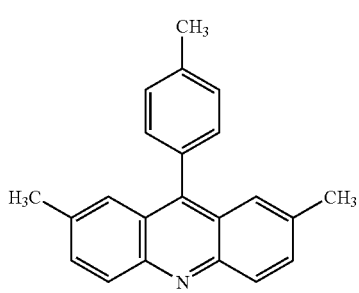

Pyrylium Salts Described in JP-B-40-28499:

Specific preferred examples include the following compounds:

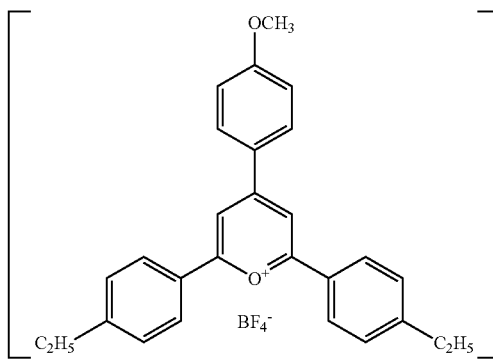

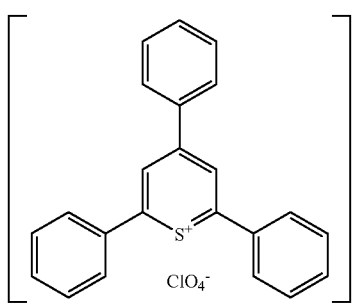

Cyanines Described in JP-B-46-42363:

Specific preferred examples include the following compounds:

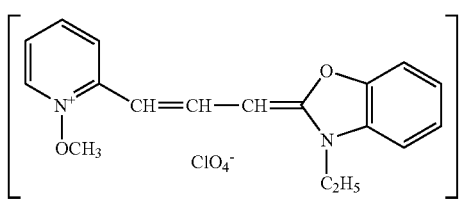

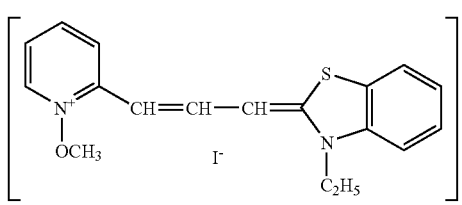

Benzofuran Dyes Described in JP-A-2-63053:

Specific preferred examples include the following compounds:

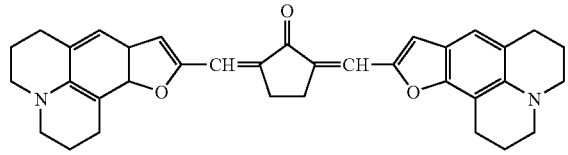

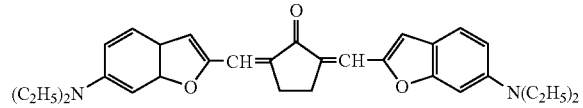

Conjugate Ketone Dyes Described in JP-A-2-85858 and JP-A-2-216154:

Specific preferred examples include the following compounds:

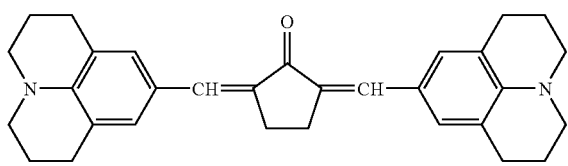

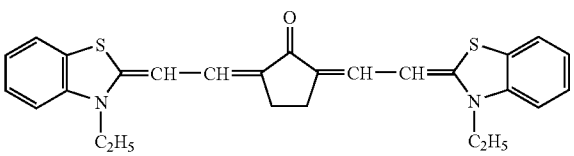

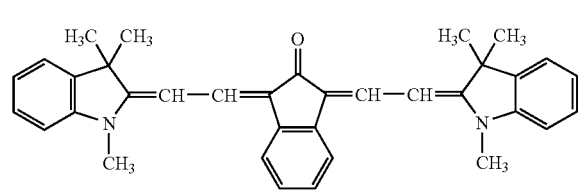

Dyes Described in JP-A-57-10605 and Azacinnamylidene Derivatives Described in JP-B-2-30321:

Specific preferred examples include the following compounds:

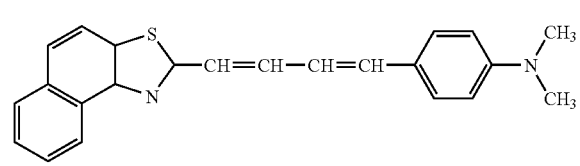

Cyanine-based Dyes Described in JP-A-1-287105:

Specific preferred examples include the following compounds:

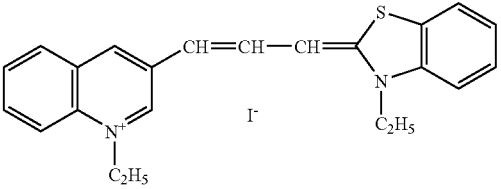

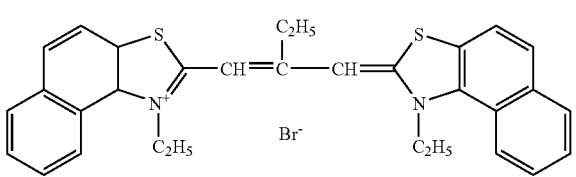

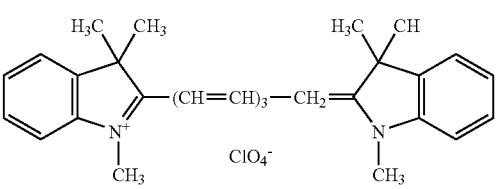

Xanthene-based Dyes Described in JP-A-62-31844, JP-A-62-31848 and JP-A-62-143043;

Specific preferred examples include the following compounds:

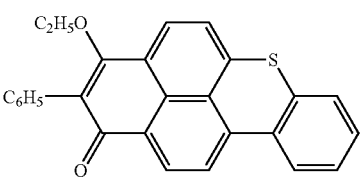

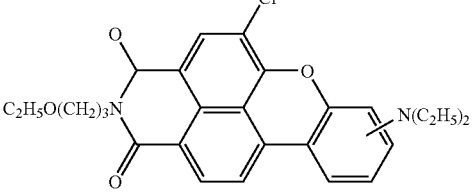

Aminostyryl Ketones Described in JP-B-59-28325:

Specific preferred examples include the following compounds:

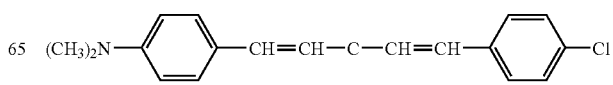

-continued

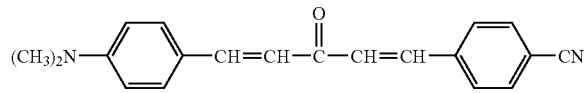

Dyes Represented by the Following Formulae (13) to (15) Described in JP-A-2-179643:

Formula (13):

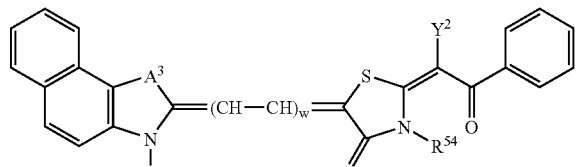

Formula (14):

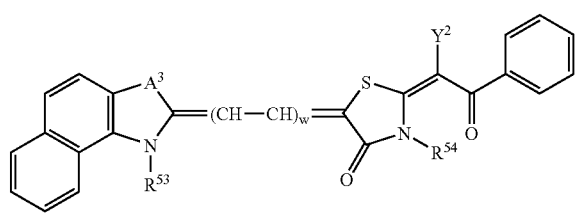

Formula (15):

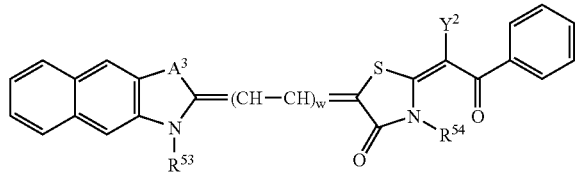

In formulae (13) to (15), $A^3$ represents an oxygen atom, a sulfur atom, a selenium atom, a tellurium atom, an alkyl- or aryl-substituted nitrogen atom or a dialkyl-substituted carbon atom, $Y^2$ represents a hydrogen atom, an alkyl group, a substituted alkyl group, an aryl group, a substituted aryl group, an aralkyl group, an acyl group or a substituted alkoxycarbonyl group, $R^{53}$ and $R^{54}$ each represents a hydrogen atom, an alkyl group having from 1 to 18 carbon atoms or a substituted alkyl group having from 1 to 18 carbon atoms and containing, as a substituent, —$OR^{55}$ —$(CH_2CH_2O)_w$—$R^{55}$, a halogen atom (e.g., F, Cl, Br, I), or a substituted alkyl group having from 1 to 18 carbon atoms and containing a group represented by the following formula (wherein $R^{55}$ represents a hydrogen atom or an alkyl group having from 1 to 10 carbon atoms, and $B^1$ represents a dialkylamino group, a hydroxyl group, an acyloxy group, a halogen atom or a nitro group), and w represents an integer of 0:

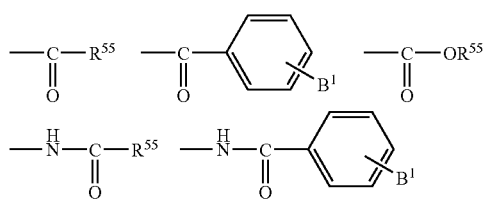

Merocyanine Dyes Represented by the Following Formula (16) Described in JP-A-2-244050:

Formula (16):

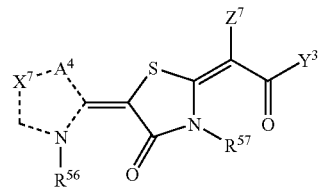

In formulae (16), $R^{56}$ and $R^{57}$ each independently represents a hydrogen atom, an alkyl group, a substituted alkyl group, an alkoxycarbonyl group, an aryl group, a substituted aryl group or an aralkyl group, $A^4$ represents an oxygen atom, a sulfur atom, a selenium atom, a tellurium atom, an alkyl- or aryl-substituted nitrogen atom or a dialkyl-substituted carbon atom, $X^7$ represents a nonmetallic atom group necessary for forming a nitrogen-containing 5-membered heterocyclic ring, $Y^3$ represents a substituted phenyl group, an unsubstituted or substituted polynuclear aromatic ring or an unsubstituted or substituted heteroaromatic ring, $Z^7$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, and $Z^7$ and $Y^3$ may combine with each other to form a ring. Specific preferred examples thereof include the following compounds.

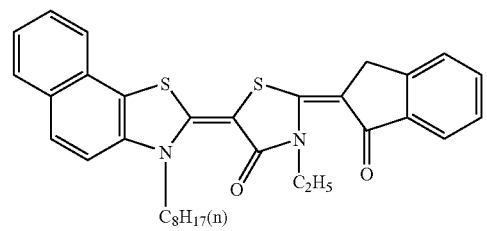

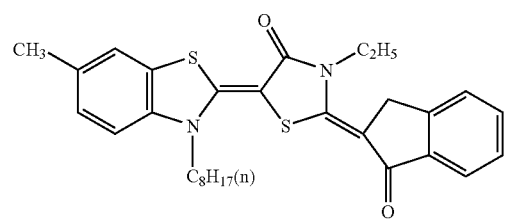

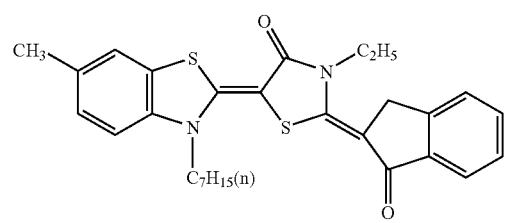

Merocyanine Dyes Represented by the Following Formula (17) Described in JP-B-59-28326:

Formula (17):

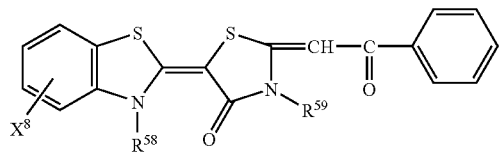

In formula (17), $R^{58}$ and $R^{59}$, which may be the same or different, each represents a hydrogen atom, an alkyl group, a substituted alkyl group, an aryl group, a substituted aryl group or an aralkyl group, and $X^8$ represents a substituent having a Hammett's σ value of −0.9 to +0.5).

Merocyanine Dyes Represented by the Following Formula (18) Described in JP-A-59-89303:

Formula (18):

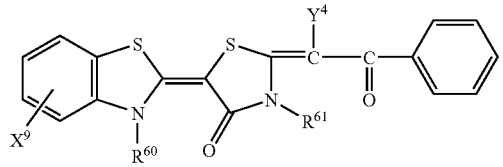

In formula (18), $R^{60}$ and $R^{62}$ each independently represents a hydrogen atom, an alkyl group, a substituted alkyl group, an aryl group, a substituted aryl group or an aralkyl group, $X^9$ represents a substituent having a Hammett's σ value of −0.9 to +0.5, and $Y^4$ represents a hydrogen atom, an alkyl group, a substituted alkyl group, an aryl group, a substituted aryl group, an aralkyl group, an acyl group or an alkoxycarbonyl group. Specific preferred examples thereof include the following compounds.

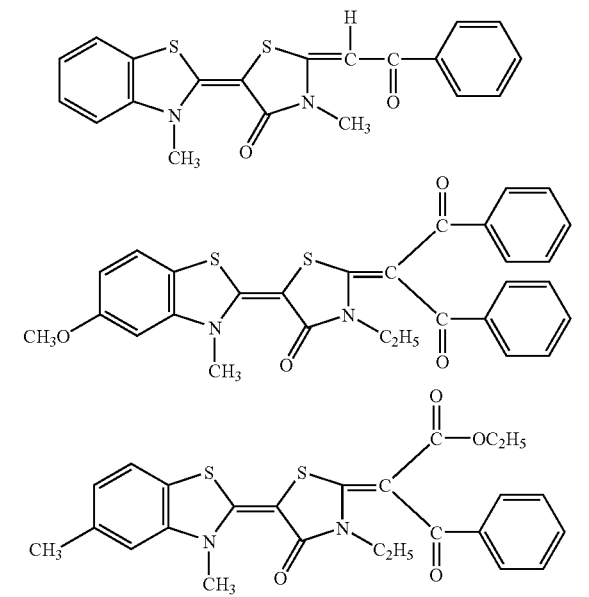

Merocyanine Dyes Represented by the Following Formula (19) Described in Japanese Patent Application No. 6-269047:

Formula (19):

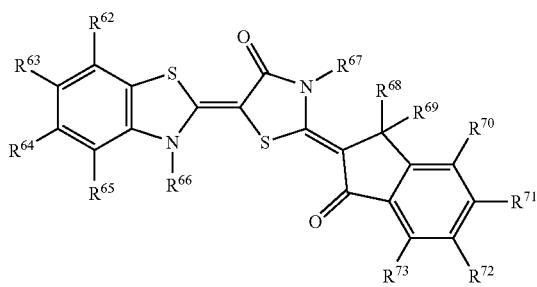

In formula (19), $R^{62}$, $R^{63}$, $R^{64}$, $R^{66}$, $R^{70}$, $R^{71}$, $R^{72}$ and $R^{73}$ each independently represents a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group or a nitro group, or $R^{62}$ and $R^{63}$, $R^{63}$ and $R^{64}$, $R^{64}$ and $R^{65}$, $R^{70}$ and $R^{71}$, $R^{71}$ and $R^{72}$, or $R^{72}$ and $R^{73}$ may combine with each other to form an aliphatic or aromatic ring, $R^{66}$ represents a hydrogen atom, an alkyl group, a substituted alkyl group, an aryl group or a substituted aryl group, $R^{67}$ represents a substituted or unsubstituted alkenylalkyl group or a substituted or unsubstituted alkynylalkyl group, and $R^{68}$ and $R^{69}$ each independently represents a hydrogen atom, a halogen atom, an alkyl group, a substituted alkyl group, an aryl group, a substituted aryl group or a substituted carbonyl group. Specific preferred examples thereof include the following compounds.

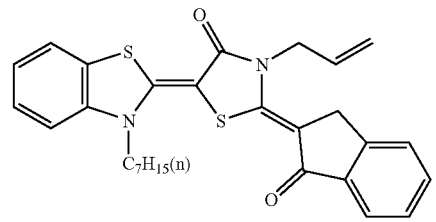

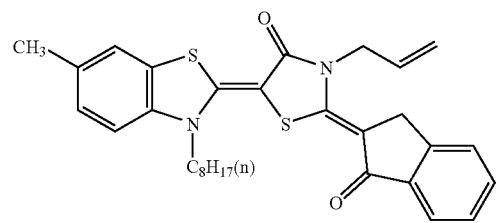

Benzopyran-based Dyes Represented by the Following Formula (20) Described in Japanese Patent Application No. 7-164583:

Formula (20):

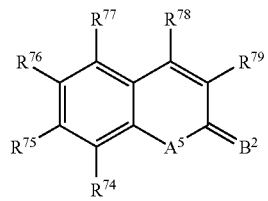

In formula (20), $R^{74}$ to $R^{77}$ each independently represents a hydrogen atom, a halogen atom, an allyl group, an aryl group, a hydroxyl group, an alkoxy group or an amino group, $R^{74}$ to $R^{77}$ each may form a ring comprising a nonmetallic atom together with the carbon atom with which $R^{74}$ to $R^{77}$ each may combine, $R^{78}$ represents a hydrogen atom, an alkyl group, an aryl group, a heteroaromatic group, a cyano group, an alkoxy group, a carboxy group or an alkenyl group, $R^{79}$ represents a group represented by $R^{78}$, or -Z'-$R^{78}$ $Z^7$ represents a carbonyl group, a sulfonyl group, a sulfinyl group or an arylene dicarbonyl group, $R^{78}$ and $R^{79}$ may form together a ring comprising a nonmetallic atom, $A^5$ represents an O atom, an S atom, NH or an N atom having a substituent, $B^2$ represents an O atom or $=C(G^7)(G^8)$, $G^7$ and $G^8$ may be the same or different and each represents a hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group or a fluorosulfonyl group, provided that $G^7$ and $G^8$ are not a hydrogen atom at the same time, and $G^7$ and $G^8$ may form a ring comprising a nonmetallic atom together with the carbon atom.

Specific indolenine cyanine dyes and the like described in Japanese Patent Application Nos. 2001-6326 and 2001-23784 previously filed by the present inventors are also preferred examples of the sensitizing dye.

Other than these, the following infrared absorbents (dye or pigment) are in particular suitably used as the sensitizing dye. Preferred examples of the dye include cyanine dyes described in JP-A-58-125246, JP-A-59-84356, JP-A-59-202829 and JP-A-60-78787, and cyanine dyes described in British Patent 434,875.

Also, near infrared absorbing sensitizers described in U.S. Pat. No. 5,156,938 may be suitably used. In addition, substituted arylbenzo(thio)pyrylium salts described in U.S. Pat. No. 3,881,924, trimethinethiapyrylium salts described in JP-A-57-142645 (U.S. Pat. No. 4,327,169), pyrylium-based compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used.

Other preferred examples of the dye include near infrared absorbing dyes represented by formulae (I) and (II) of U.S. Pat. No. 4,756,993 and phthalocyanine-based dyes described in EP-A-916513.

Furthermore, anionic infrared absorbents described in Japanese Patent Application No. 10-79912 may be suitably used. The term "anionic infrared absorbents" means a dye not having cationic structure but having an anionic structure in the mother nucleus which substantially absorbs an infrared ray. Examples thereof include (c1) an anionic metal complex, (c2) an anionic carbon black, (c3) an anionic phthalocyanine and (c4) a compound represented by the following formula (29). In these anionic infrared absorbents, the counter cation is a monovalent cation containing a proton, or a polyvalent cation.

$$[G^9\text{-}M^5\text{-}G^{10}]_m(X^{10})^+ \qquad \text{Formula (21)};$$

The anionic metal complex (c1) as used herein means a metal complex where the center metal and ligand in the complex moiety which substantially absorbs light entirely become anionic.

Examples of (c2) the anionic carbon black include carbon black where an anionic group such as sulfonic acid, carboxylic acid or phosphonic acid group is bonded as a substituent. Such a group may be introduced into the carbon black by a method of oxidizing carbon black with a predetermined acid as described in *Carbon Black Binran Dai 3 Han* (*Carbon Black Handbook*, 3rd Edition), page 12, complied by Carbon Black Kyokai and issued by Carbon Black Kyokai (Apr. 5, 1995).

The anionic phthalocyanine (c3) means a phthalo-cyanine where an anionic group described above for (c2) is bonded as a substituent to the phthalocyanine skeleton and the phthalocyanine entirely becomes anionic.

The compound (c4) represented by formula (21) is described in detail below. In formula (21), $G^9$ represents an anionic substituent, $G^{10}$ represents a neutral substituent, $(X^{10})^+$ represents a cation having from 1 to m valence and containing a proton, m represents an integer of from 1 to 6, and $M^5$ represents a conjugate chain. The conjugate chain $M^5$ may have a substituent or a ring structure. The conjugate chain $M^5$ can be represented by the following formula:

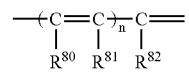

wherein $R^{80}$, $R^{81}$ and $R^{82}$ each independently represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group, $R^{80}$, $R^{81}$ and/or $R^{82}$ may combine with each other to form a ring structure, and n represents an integer of 1 to 8.

Preferred examples of the anionic infrared absorbent represented by formula (21) include Compounds IRA-1 to IRA-5 shown below.

IRA-1

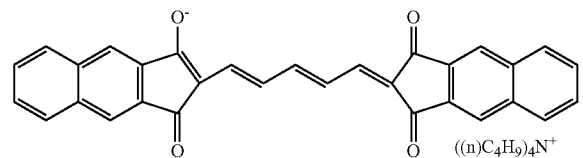

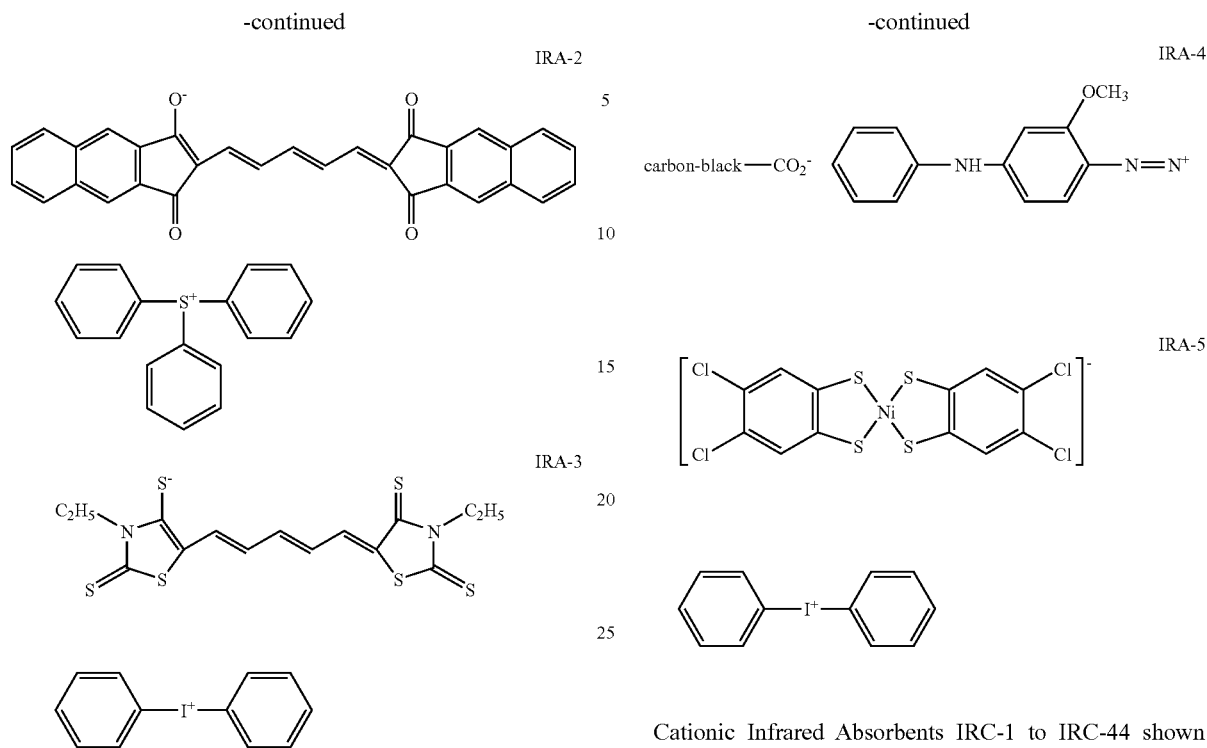
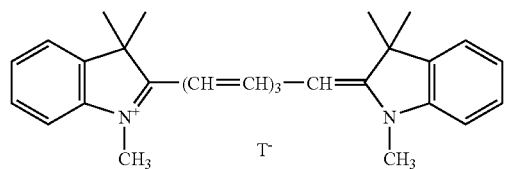
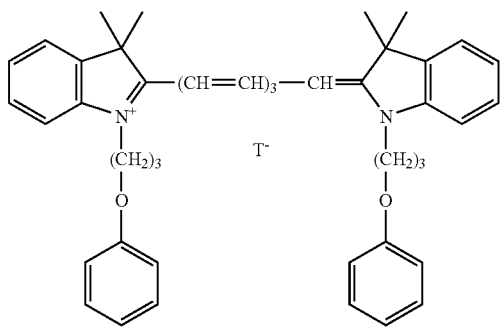
Cationic Infrared Absorbents IRC-1 to IRC-44 shown below may also be preferably used.
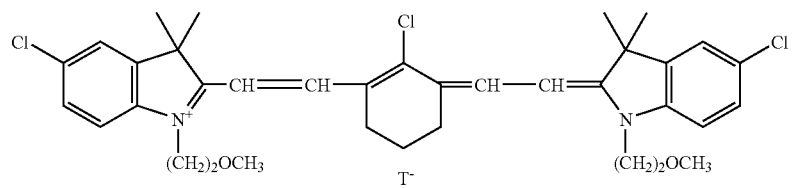

-continued
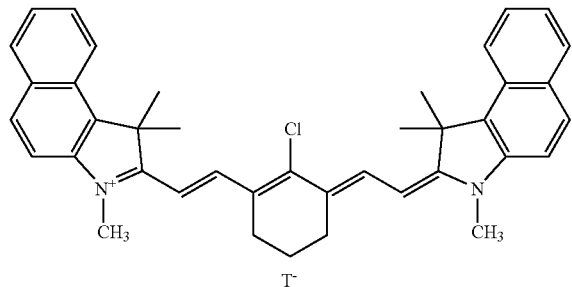
IRC-4
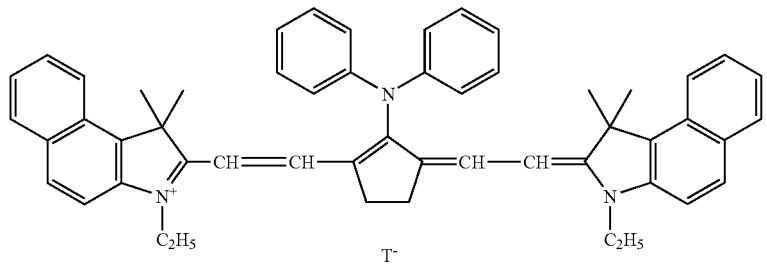
IRC-5
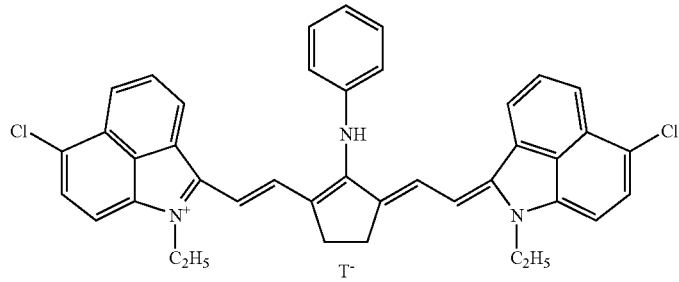
IRC-6
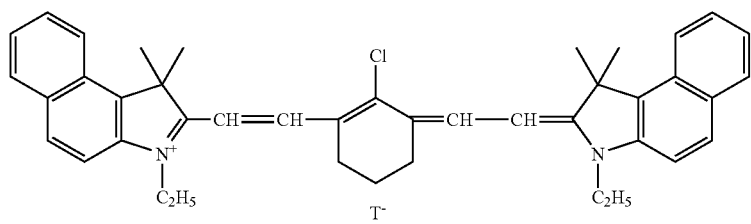
IRC-7
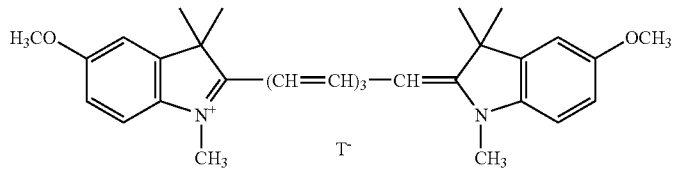
IRC-8
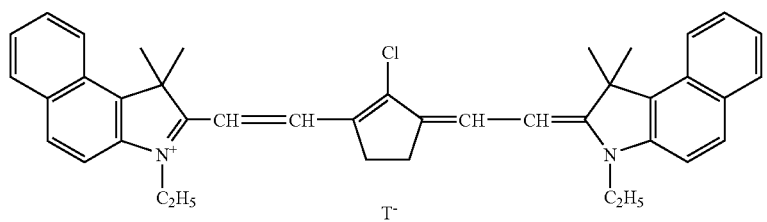
IRC-9

-continued
IRC-10
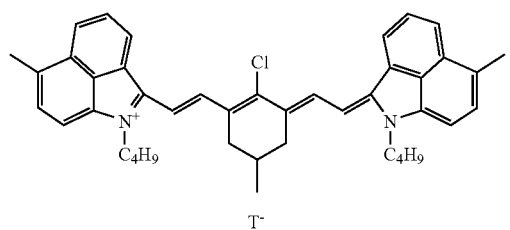
IRC-11
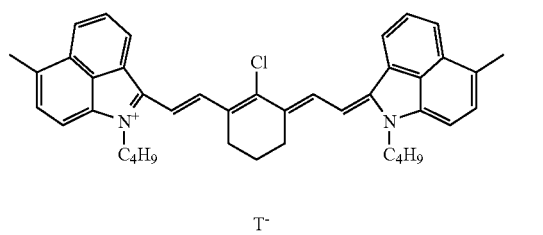
IRC-12
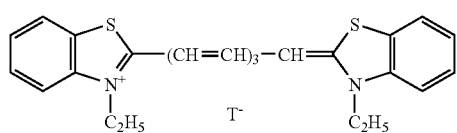
IRC-13
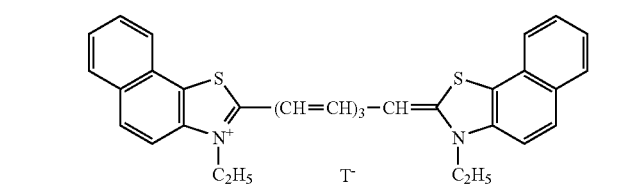
IRC-14
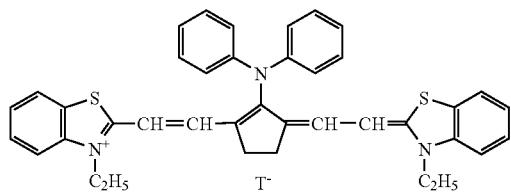
IRC-15
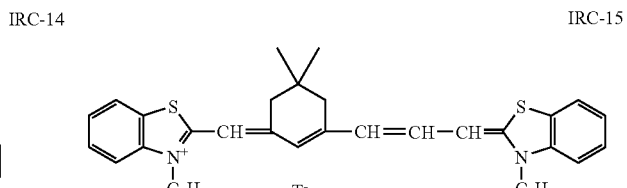
IRC-16
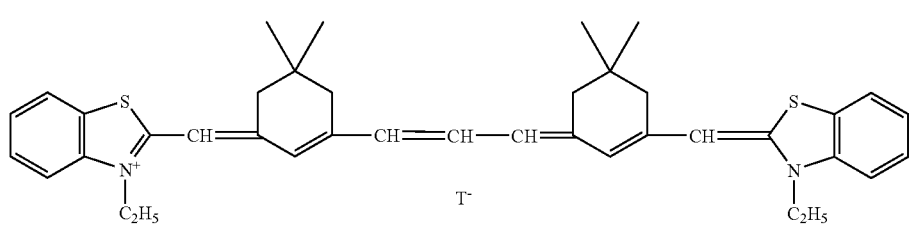
IRC-17
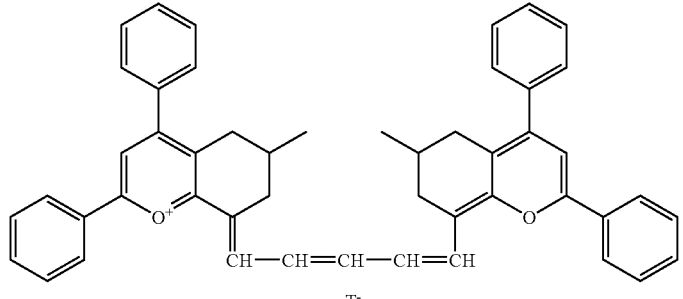
IRC-18
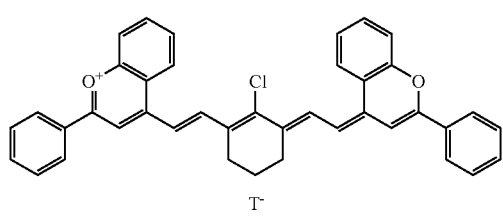
IRC-19
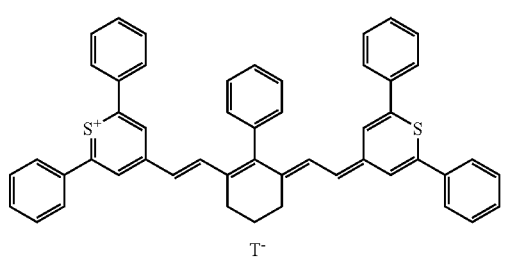

-continued
IRC-20
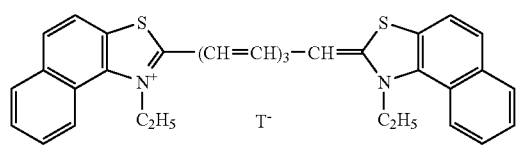
IRC-21
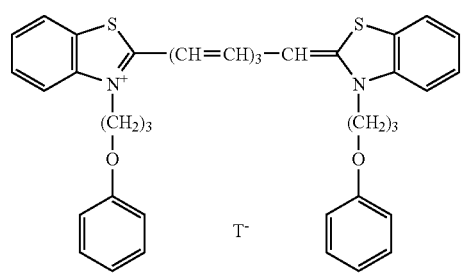
IRC-22
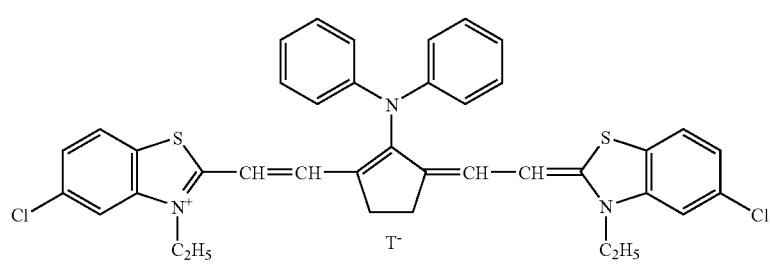
IRC-23
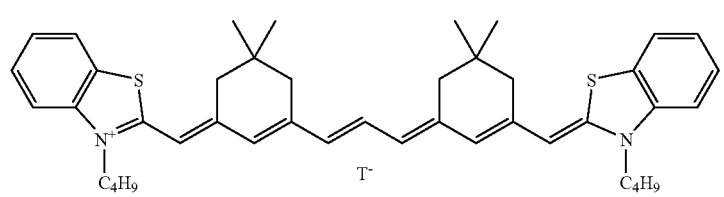
IRC-24
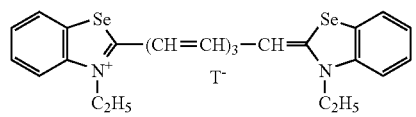
IRC-25
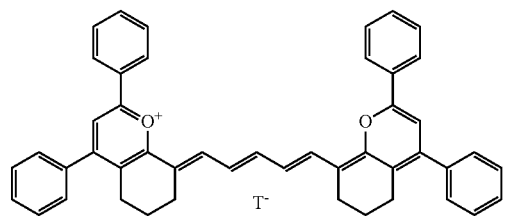
IRC-26
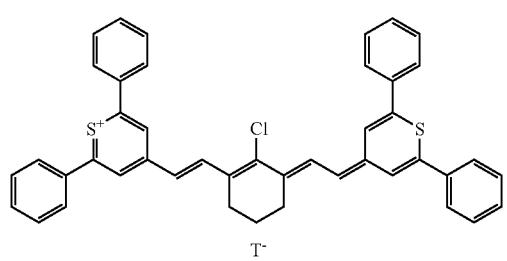
IRC-27
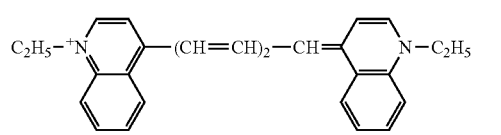
IRC-28
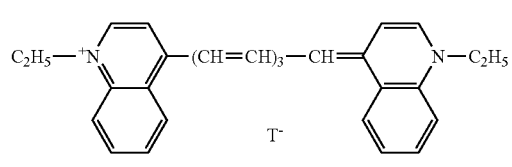
IRC-29
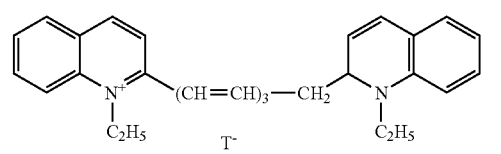

-continued
IRC-30
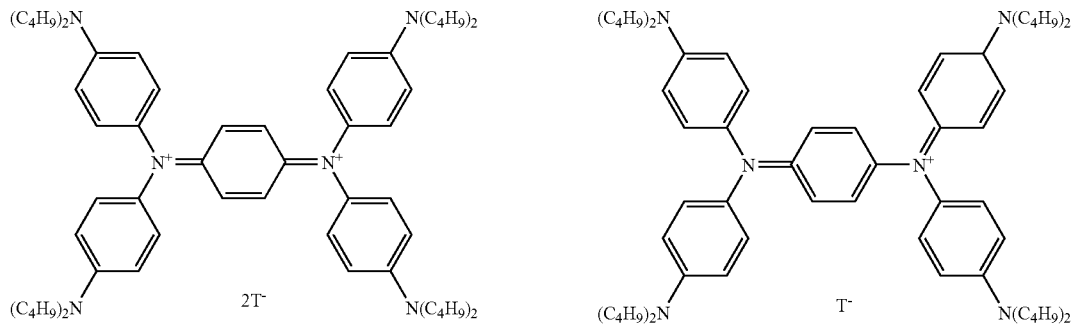
IRC-31
IRC-32
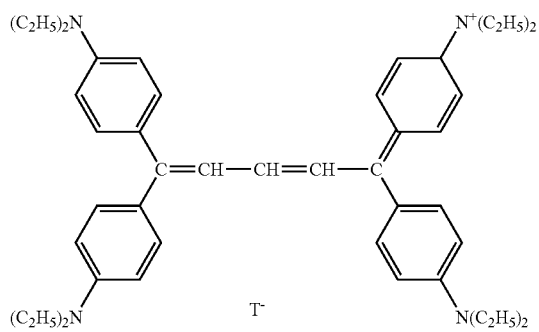
IRC-33
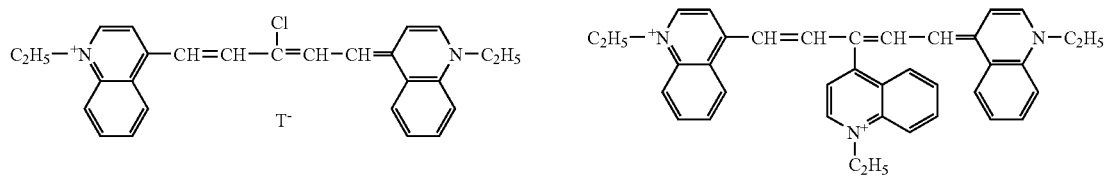
IRC-34
IRC-35
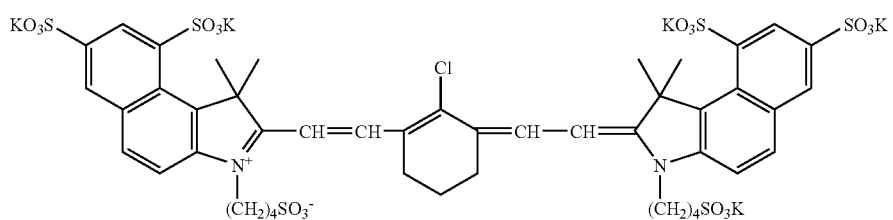
IRC-36
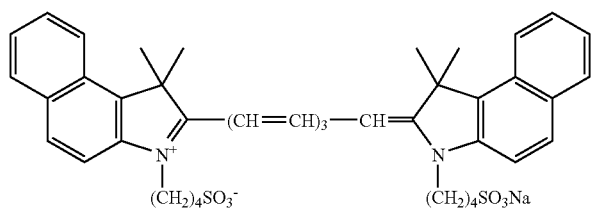

-continued
IRC-37
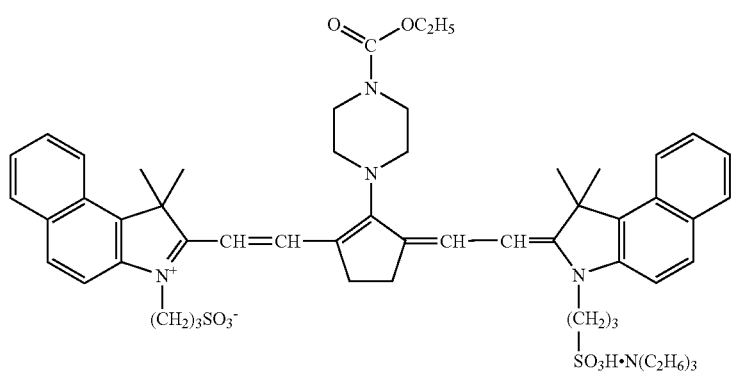
IRC-38
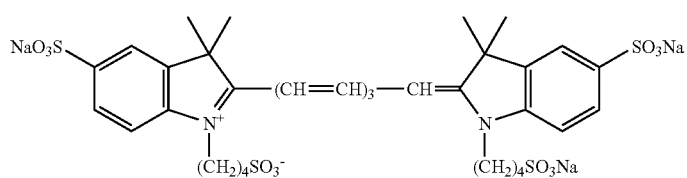
IRC-39
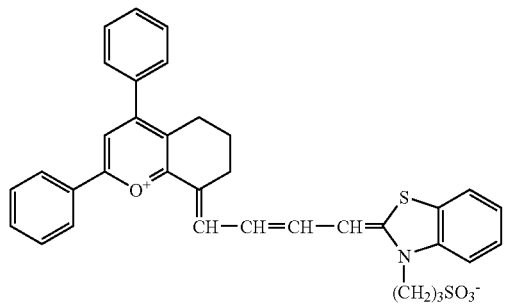
IRC-40
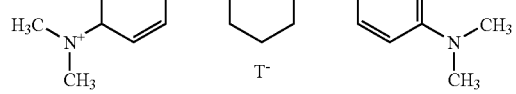
IRC-41
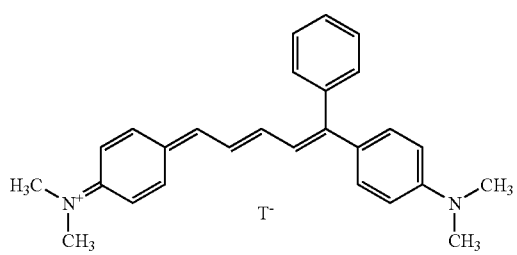
IRC-42
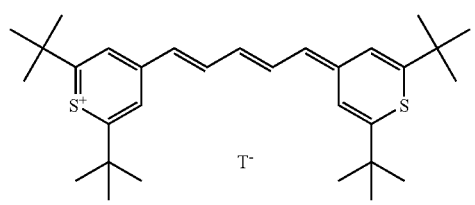
IRC-43
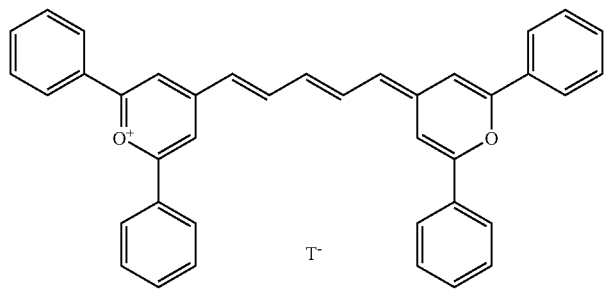

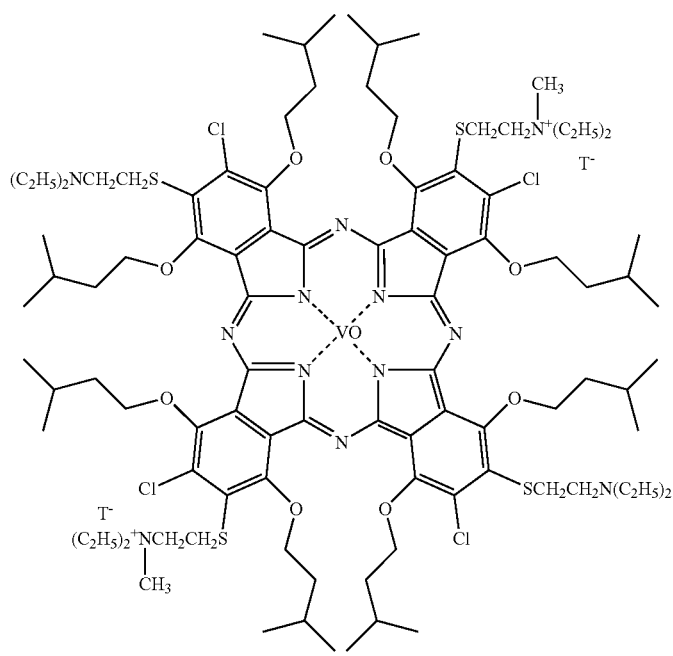

IRC-44

In these structural formulae, T⁻ represents a monovalent counter anion, preferably a halogen anion (e.g., $F^-$, $Cl^-$, $Br^-$, $I^-$), a Lewis acid anion (e.g., $BF_4^-$, $PF_6^-$, $SbCl_6^-$, $ClO_4^-$), an alkylsulfonate anion or an arylsulfonate anion.

The alkyl in the alkylsulfonic acid is a linear, branched or cyclic alkyl group having from 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, linear alkyl groups having from 1 to 12 carbon atoms, branched alkyl groups having from 3 to 12 carbon atoms, and cyclic alkyl groups having from 5 to 10 carbon atoms are preferred.

The aryl in the arylsulfonic acid is an aryl group comprising one benzene ring or an aryl group resulting from forming a condensed ring by 2 or 3 benzene rings or by a benzene ring and a 5-membered unsaturated ring, and specific examples thereof include a phenyl groups a naphthyl group, an anthryl group, a phenanthryl group, an indenyl group, an acenaphthenyl group and a fluorenyl group, with a phenyl group and a naphthyl group being preferred.

In addition, Nonionic Infrared Absorbents IRN-1 to IRN-9 shown below may also be preferably used.

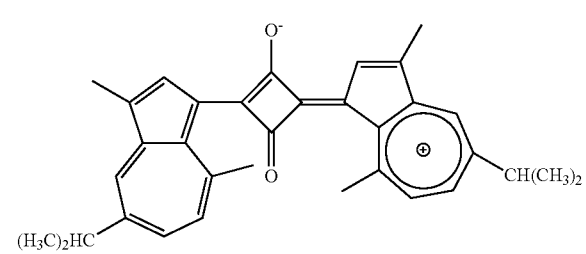

IRN-1

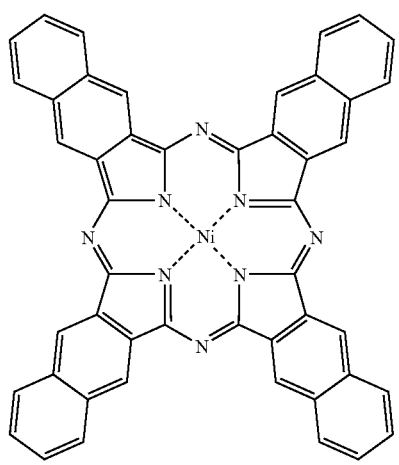

IRN-2

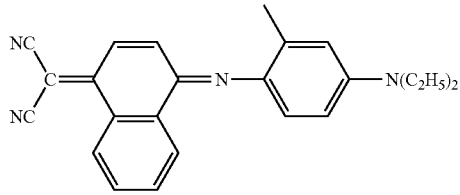

IRN-3

-continued

IRN-4
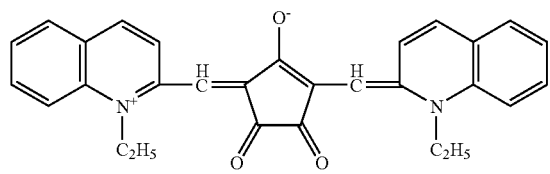

IRN-5
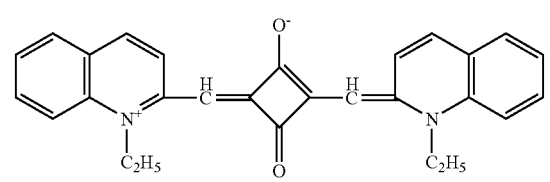

IRN-6
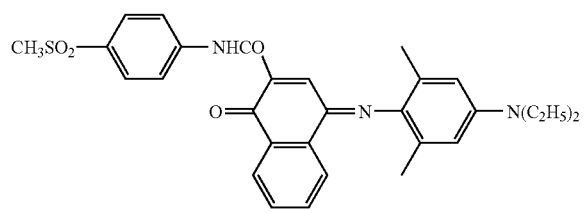

IRN-7
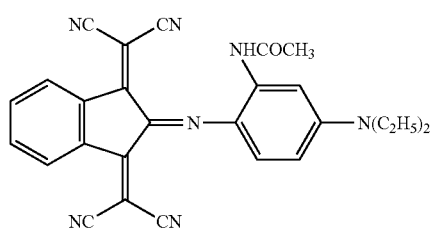

IRN-8
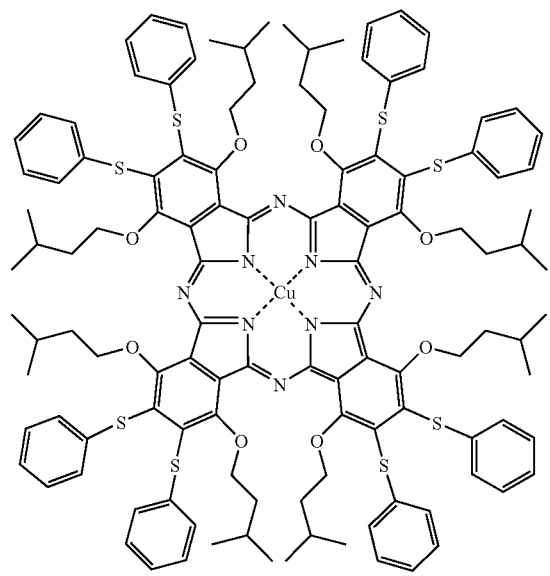

-continued

IRN-9
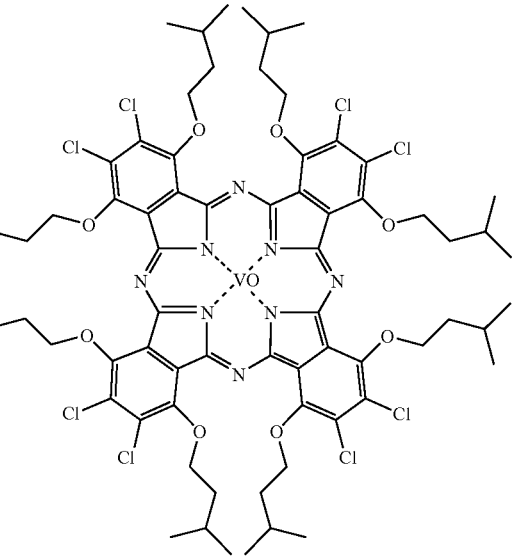

Among these compounds, more preferred are Anionic Infrared Absorbent IRA-1, Cationic Infrared Absorbents IRC-7, IRC-30, IRC-40 and IRC-42, and Nonionic Infrared Absorbent IRN-9.

<Pigment>

As for the pigment for use in the present invention, commercially available pigments and pigments described in *Color Index (C.I.) Binran (C.I. Handbook)*, *Saishin Ganryo Binran (Handbook of Newest Pigments)*, compiled by Nippon Ganryo Gijutsu Kyokai (1977), *Saishin Ganryo Oyo Gijutsu (Newest Pigment Application Technology)*, CMC (1986), and *Insatsu Ink Gijutsu (Printing Ink Technology)*, CMC (1984) can be used.

The kind of the pigment includes a black pigment, a yellow pigment, an orange pigment, a brown pigment, a red pigment, a violet pigment, a blue pigment, a green pigment, a fluorescent pigment, a metal powder pigment and a polymer bond pigment. Specific leas of the pigment which can be used include insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments and carbon black. Among these pigments, carbon black is preferred.

These pigments each may or may not be surface-treated before use. The surface treatment may be performed, for example, by a method of coating the surface with resin or wax, a method of attaching a surfactant, or a method of bonding a reactive substance (for example, a silane coupling agent, an epoxy compound or polyisocyanate) to the pigment surface. These surface treatment methods are described in *Kinzoku Sekken no Seishitsu to Oyo* (*Properties and Application of Metal Soap*), Saiwai Shobo, *Insatsu Ink Gijutsu* (*Printing Ink Technology*), CMC (1984), and *Saishin Ganryo Oyo Gijutsu* (*Newest Pigment Application Technology*), CMC (1986).

The particle size of the pigment is preferably from 0.01 to 10 μm, more preferably from 0.05 to 1 μm, still more preferably from 0.1 to 1 μm. If the particle size of the pigment is less than 0.01 μm, this is disadvantageous in view of stability of the dispersion in the coating solution for the image recording layer, whereas if it exceeds 10 μm, this disadvantageous in view of uniformity of the image recording layer.

For dispersing the pigment, known dispersion techniques employed in the production of ink or toner may be used. Examples of the dispersing machine include ultrasonic disperser, sand mill, attritor, pearl mill, super-mill, ball mill, impeller, disperser, KD mill, colloid mill, dynatron, three-roll mill and pressure kneader. These are described in detail in *Saishin Ganryo Oyo Gijutsu* (*Newest Pigment Application Technology*), CMC (1986).

The sensitizing dye which is added to accelerate the curing reaction of the polymerizable composition of the present invention may be added together with other components directly in the composition, but even when the sensitizing dye is added to a separate layer adjacently provided, the same effects can be obtained.

In the case of using the polymerizable composition of the present invention for the negative recording layer of an image recording material, the polymerizable composition may be added to the same layer of the recording layer, or may be added to a layer separately provided, but when a negative recording material is produced, the optical density of the recording layer at the absorption maximum in the wavelength range of 300 to 1,200 nm is preferably from 0.1 to 3.0. With an optical density in this range, high sensitivity recording can be attained. The optical density is determined by the amount of the sensitizing dye added and the thickness of the recording layer, and a predetermined optical density is obtained by controlling the conditions of these two factors.

The optical density can be measured by a normal method. Examples of the measuring method therefor include a method of forming a recording layer having a dry thickness resulting from appropriately determining the coated amount within a range necessary as a lithographic printing plate on a transparent or white support and measuring the optical density by a transmission-type optical densitometer, and a method of forming a recording layer on a reflective support such as an aluminum and measuring the reflection density.

Such a pigment or dye can be added at a ratio of 0.01 to 50 mass %, preferably from 0.1 to 10 mass %, more preferably from 0.5 to 10 mass % in the case of a dye or from 0.1 to 10 mass % in the case of a pigment, based on all solid contents constituting the polymerizable composition. When the amount of pigment or dye added is in this range, high sensitivity can be achieved and a uniform film having excellent durability can be formed.

In the case of using (4) a sensitizing dye, the molar ratio of (2) the radical initiator to (4) the sensitizing dye in the polymerizable composition is from 100:0 to 1:99, preferably from 90:10 to 10:90, most preferably from 80:20 to 20:80.

In the polymerizable composition of the present invention, a known compound having a function of more enhancing the sensitivity or preventing the polymerization inhibition by oxygen can be added as a co-sensitizer.

Examples of the co-sensitizer include amines such as compounds described in M. R. Sander et al., *Journal of Polymer Society*, Vol. 10, p. 3173 (1972), JP-B-44-20189, JP-A-51-82102, JP-A-52-134692, JP-A-59-138205, JP-A-60-84305, JP-A-62-18537, JP-A-64-33104 and *Research Disclosures* No. 33825. Specific examples thereof include triethanolamine, ethyl p-dimethylaminobenzoate, p-formyldimethylaniline and p-methylthiodimethylaniline.

Other examples of the co-sensitizer include thiols and sulfides such as thiol compounds described in JP-A-53-702, JP-B-55-500806 and JP-A-5-142772, and disulfide compounds described in JP-A-56-75643. Specific examples thereof include 2-mercaptobenzothiazole, 2-mercaptobenzoxazole, 2-mercaptobenzimidazole, 2-mercapto-4(3H)-quinazoline and β-mercaptonaphthalene.

Still other examples of the co-sensitizer include amino acid compounds (for example, N-phenylglycine, N-phenyliminodiacetic acid and derivatives thereof), organo-metallic compounds described in JP-8-48-42965 (for example, tributyltin acetate), hydrogen donors described in JP-B-55-34414, sulfur compounds described in Japanese Patent Application No. 5-91089 (for example, trithian), phosphorus compounds described in Japanese Patent Application No. 5-32147 (for example, diethyl phosphite), and Si—H and Ge—H compounds described in Japanese Patent Application No-6-191605.

In the case of using the above-described co-sensitizer, the co-sensitizer is suitably used in an amount of 0.01 to 50 parts by weight, more preferably from 0.02 to 20 parts by weight, and most preferably from 0.05 to 10 parts by weight, per part by weight of the radical initiator.

The polymerizable composition of the present invention preferably contains a linear organic high molecular polymer as a binder. The "linear organic high molecular polymer" may be any polymer as long as it is a linear organic high molecular polymer having compatibility with the photopolymerizable ethylenically unsaturated compound. A water- or alkalescent water-soluble or swellable linear organic high molecular polymer enabling water development or alkalescent water development is preferably selected. The linear organic high molecular polymer is used not only as a film-forming agent of the composition but also as a developer by appropriately selecting it according to what solvent is used out of water, alkalescent water and organic solvents. For example, when a water-soluble organic high molecular polymer is used, water development can be performed. Examples of this linear organic high molecular polymer includes addition polymers having a carboxylic acid group in the side cin such as methacrylic acid copolymer, acrylic acid copolymer, itaconic acid copolymer, crotonic acid copolymer, maleic acrid copolymer and partially esterified maleic acid copolymer described in JP-A-59-44615, JP-B-54-34327, JP-B-58-12577, JP-B-54-25957, JP-A-54-92723, JP-A-59-53836 and JP-A-59-71048. Furthermore, acidic cellulose derivatives similarly having a carboxylic acid group in the side chain may be used. In addition, those obtained by adding a cyclic acid anhydride to an addition polymer having a hydroxyl group are also useful.

Among these, particularly preferred are a copolymer of [benzyl (meth)acrylate/(meth)acrylic acid/other-addition polymerizable vinyl monomer, if desired] and a copolymer of [allyl (meth)acrylate/(meth)acrylic acid/other addition polymerizable vinyl monomer, if desired]. Other than these, polyvinyl pyrrolidone, polyethylene oxide and the like are useful as the water-soluble linear organic polymer. In order to increase the strength of the cured film, an alcohol-soluble polyamide and a polyether of 2,2-bis(4-hydroxyphenyl) propane with epichlorohydrin are also useful.

However, the amount of the other known binder used is 40% or less, preferably 30% or less, more preferably 20% or less, based on the weight of all components in the polymerizable composition. If the amount used exceeds 40%, this causes deterioration in the film property, storage stability and press life property.

In the present invention, a slight amount of a thermal polymerization inhibitor is preferably added to the polymerizable composition constituting the recording layer so as to prevent the compound having a polymerizable ethylenically unsaturated double bond contained in the composition from undergoing unnecessary thermal polymerization during production or storage of the polymerizable composition.

Suitable examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-tert-butylphenol), 2,2'-methylenebis(4-methyl-6-tert-butylphenol) and N-nitrosophenylhydroxyamine cerous salt.

The amount of the thermal polymerization inhibitor added is preferably from about 0.01 to about 5 wt % based on the weight of the entire composition.

Also, if desired, a higher fatty acid derivative such as behenic acid and behenic acid amide way be added to localize on the surface of the photosensitive layer during the drying process after the coating so as to prevent the polymerization inhibition by oxygen. The amount of the higher fatty acid derivative added is preferably from about 0.5 to about 10 wt % of the entire composition.

Furthermore, a dye or a pigment may be added for the purpose of coloring the recording layer. By this addition, when the image recording material of the present invention is applied to a lithographic printing plate precursor, so-called suitability for plate inspection, such as visibility after plate making or aptitude for image densitometer, can be enhanced. The coloring agent used here is preferably a pigment. Many dyes likely cause reduction in the exposure sensitivity of the polymerizable composition and when a dye is used as the coloring agent, this point should be taken into consideration. Specific examples of the coloring agent include pigments such as phthalocyanine-based pigment, azo-based pigment, carbon black and titanium oxide, and dyes such as Ethyl Violet, Crystal Violet, azo-based dyes, anthraquinone-based dyes and cyanine-based dyes. The amount of the dye or pigment added is preferably from about 0.5 to about 5 wt % based on the entire composition.

Other Additives

Other than these additives, known additives such as inorganic filler or plasticizer for improving the physical properties of the cured film, and ink receptivity agent capable of enhancing the inking property on the photosensitive layer surface may also be added.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin, and when a binder is used, the plasticizer may be added in an amount of 10 wt % or less based on the total weight of the compound having an ethylenically unsaturated double bond and the binder.

Furthermore, additives such as UV initiator and heat crosslinking agent may be added so as to strengthen the effect of heat/exposure treatment performed after development for the purpose of enhancing the film strength (press life) which is described later.

The polymerizable composition of the present invention can be applied to the production of not only an image recording material which is described later, but also a high-sensitivity stereolithographic material or by utilizing the change in refractive index resulting from polymerization, a hologram material, an electronic material (e.g., photoresist) or the like.

[Image Recording Material]

The polymerizable composition of the present invention is used suitably as a negative recording layer of an image recording material. The image recording material of the present invention is fabricated by providing a recording layer containing the polymerizable composition of the present invention, and if desired, other layers on a support. Examples of the image recording material include a three-dimensional stereolithography capable of recording an image by scan exposure, a holography, a lithographic printing plate, a color proof, a photo resist and a color filter. This is described in detail below by referring to a lithographic printing plate precursor which is a preferred application.

(Recording Layer)

In a lithographic printing plate precursor to which the image recording material of the present invention is applied, the recording layer (photosensitive layer) is a polymerizable photosensitive layer comprising a polymerizable composition containing, as essential components, (1) a polymerizable dendrimer, (2) a radical initiator and (3) an alkali-soluble polymer, which are described above, and if desired, containing (4) a sensitizing dye and other arbitrary components. This polymerizable photosensitive layer has a mechanism such that the polymerization initiator decomposes under irradiation of laser light and generates a radical and the radical generated causes a polymerization reaction of (1) the polymerizable dendrimer which is a polymerizable compound. Furthermore, the lithographic printing plate precursor of the present invention is suitable particularly for the production of a printing plate by direct image drawing with a laser ray having a wavelength of 300 to 1,200 nm and as compared with conventional lithographic printing plate precursors, expresses high press life property and high image-forming property.

In this lithographic printing plate precursor, in order to improve the adhesion between the recording layer and the support or to enhance the development removability of the recording layer in the unexposed region, an interlayer may be provided therebetween.

A compound capable of forming an interaction with the support substrate may also be added to the recording layer. Examples of this compound include a compound having a diazonium structure, and a phosphonic compound. Such a compound is added to the recording layer or to a coating composition for forming an undercoat layer, whereby the adhesive property and the press life can be improved. On the other hand, for enhancing the removability of the non-image area, this may be attained by adding a hydrophilic polymer such as polyacrylic acid and polysulfonic acid or forming an undercoat layer containing such a polymer and thereby, the developability of the non-image area can be enhanced and the non-image area can be effectively prevented from staining.

At the time of forming a recording layer by coating the polymerizable composition of the present invention an a support, this polymerizable composition may be used by dissolving it in various organic solvents.

Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50 wt %.

The coverage of the recording layer has an effect mainly on the sensitivity of the photosensitive layer, the developability, and the strength and press life of the exposed film and therefore, an appropriate coverage is preferably selected according to use. If the coverage is too small, the press life property tends to decrease, whereas if it is excessively large, the sensitivity decreases, the exposure takes much time and the development also requires a longer time. In the case of using the image recording material as a lithographic printing plate precursor for scan exposure, the coverage of the recording layer is suitably from about 0.1 to about 10 g/m$^2$, more preferably from 0.5 to 5 g/m$^2$, in terms of the dry weight.

[Support]

The support which can be used for the lithographic printing plate precursor of the present invention is preferably a support having a hydrophilic surface, and conventionally known hydrophilic supports for use in the lithographic printing plate can be used without any particular limitation.

The support substrate is preferably a dimensionally stable plate-like material. Examples thereof include paper, paper laminated with plastic (e.g., polyethylene, polypropylene, polystyrene), metal sheet (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal) and paper or plastic film laminated or vapor-deposited with such a metal. These substrates may be used as the support after subjecting the surface thereof, if desired, to a known appropriate physical or chemical treatment so as to, for example, impart hydrophilicity or improve the strength.

Among those supports, preferred are paper, polyester film and aluminum plate, and more preferred is aluminum plate because this is dimensionally stable and relatively inexpensive and can provide a surface excellent in the hydrophilicity and strength through a surface treatment as needed.

Also, a composite sheet obtained by bonding an aluminum sheet on a polyethylene terephthalate film described in JP-B-48-18327 may be preferably used.

The aluminum plate is suitably a pure aluminum plate or an alloy plate mainly comprising aluminum and containing a trace amount of foreign elements. Also, a plastic film laminated or vapor-deposited with aluminum may be used. Examples of the foreign element contained in the aluminum alloy include silicon, iron, manganese, copper, magnesium, chromium, zinc, bismuth, nickel and titanium. The foreign element content in the alloy is at most 10 wt % or less. In the present invention, pure aluminum is preferred, but it is difficult to produce a completely pure aluminum in view of smelting technology, and therefore, aluminum containing a trace amount of foreign elements may be used.

In this way, the aluminum plate for use in the present invention is not specified in its composition and an aluminum plate comprising conventionally knows and used materials may be appropriately used. The aluminum plate for use in the present invention has a thickness of approximately from 0.1 to 0.6 mm, preferably from 0.15 to 0.4 mm, more preferably from 0.2 to 0.3 mm.

In the case of a support having a metal surface, particularly aluminum surfaced the support is preferably subjected to a surface treatment such as surface roughening (graining), dipping in an aqueous solution of sodium silicate, potassium fluorozirconate or phosphate, or anodic oxidation.

The surface roughening of the aluminum plate is performed by various methods, for example, by a method of mechanically roughening the surface, a method of electrochemically dissolving and roughening the surface, or a method of chemically dissolving the selected surface. As for the mechanical surface roughening, a known method such as ball polishing, brush polishing, blast polishing or buff polishing may be used. The electrochemical surface roughening may be performed by a method of passing an alternating or direct current through an electrolytic solution such as hydrochloric acid or nitric acid. These two surface roughening treatments may be used in combination as disclosed in JP-A-54-63902. In advance of surface-roughening the aluminum plate, the aluminum plate is, if desired, subjected to a degreasing treatment with, for example, a surfactant, an organic solvent or an alkaline aqueous solution so as to remove the rolling oil on the surface.

Furthermore, an aluminum plate subjected to a surface roughening treatment and then to a dipping treatment in an aqueous sodium silicate solution so as to render the surface hydrophilic can be preferably used. For example, an aluminum plate subjected to an anodic oxidation treatment and then to a dipping treatment in an aqueous solution of alkali metal silicate described in JP-B-47-5125 is suitably used. The anodic oxidation treatment is performed by passing an electric current to the aluminum plate working as an anode in an electrolytic solution, for example, in an aqueous or non-aqueous solution of an inorganic acid such as phosphoric acid, chromic acid, sulfuric acid or boric acid, an organic acid such as oxalic acid or sulfamic acid, or a salt thereof. These aqueous or non-aqueous solutions may be used individually or in combination of two or more thereof.

As such a treatment for hydrophilizing the support surface with a silicate compound, silicate electro-deposition described in U.S. Pat. No. 3,658,662 is effective.

A surface treatment combining a support subjected to electrolytic graining disclosed in JP-B-46-27481, JP-A-52-58602 and JP-A-52-30503 with the above-described anodic oxidation treatment and sodium silicate treatment is also useful.

A support subjected in sequence to mechanical graining, chemical etching, electrolytic graining, anodic oxidation treatment and sodium silicate treatment as disclosed in JP-A-56-28893 is also suitably used.

A support subjected to, after the above-described treatments, undercoating with a water-soluble resin such as polyvinyl phosphonic acid, polymer or copolymer having a sulfonic acid group in the side chain or polyacrylic acid or with a water-soluble metal salt (e.g., zinc borate), a yellow dye or an amine salt may also be suitably used.

As other examples of the treatment for hydrophilizing the support surface, a sol-gel treated substrate having covalent-bonded thereto a functional group capable of bringing out an addition reaction under the action of radicals described in Japanese Patent Application No. 5-304358 is also suitably used.

Other preferred examples include those obtained by providing a water-resistant hydrophilic layer as the surface layer on an arbitrary support. Examples of the surface layer include a layer comprising an inorganic pigment and a binder described in U.S. Pat. No. 3,055,295 and JP-A-56-13168, a hydrophilic swelling layer described in JP-A-9-80744, and a sol-gel film comprising titanium oxide, polyvinyl alcohol and a silicic acid described in JP-T-8-507727 (the term "JP-T" as used herein means a "published Japanese translation of a PCT patent application").

These hydrophilizing treatments are applied not only for rendering the support surface hydrophilic but also for preventing a harmful reaction of the polymerizable composition coated thereon and at the same time, enhancing the adhesion of the photosensitive layer.

[Protective Layer]

In the case of using the image recording material of the present invention for a lithographic printing plate for scan exposure, a protective layer can be provided, if desired, on the recording layer. Such a lithographic printing plate precursor is usually exposed in air, but the protective layer prevents low molecular compounds such as oxygen and basic substance present in air, which inhibit the image-formation reaction caused in the photosensitive layer upon exposure, from mixing into the photosensitive layer and thereby prevents the inhibition of image-forming reaction upon exposure in air. Accordingly, the properties required of this protective layer are to have low permeability to low molecular compounds such as oxygen, well transmit light used for exposure, exhibit excellent adhesion to the photosensitive layer and be easily removable in the development step after exposure.

Various designs have been conventionally made to obtain such a protective layer and this is described in detail in U.S. Pat. No. 3,458,311 and JP-A-55-49729. The material which can be used for the protective layer is, for example, preferably a water-soluble polymer compound having relatively excellent crystallinity. Specifically, water-soluble polymers such as polyvinyl alcohol, polyvinyl pyrrolidone, acidic celluloses, gelatin, gum arabi and polyacrylic acid are known. Among these, polyvinyl alcohol is preferably used as the main component, because most advantageous results can be given to the fundamental properties such as oxygen blocking and development removability. The polyvinyl alcohol for use in the protective layer may be partially displaced by an eater, an ether or an acetal as long as it contains an unsubstituted vinyl alcohol unit necessary for ensuring oxygen blocking and water solubility. Similarly, the polyvinyl alcohol may have other copolymerization component in a partial portion. In particular, a mixture whore polyvinylpyrrolidone is displacing from 15 to 50 mass % of the polyvinyl alcohol is preferred in view of storage stability.

Examples of the polyvinyl alcohol which can be used include those having a hydrolysis degree of 71 to 100% and a molecular weight of 300 to 2,400. Specific examples thereof include PVA-105, PVA-110, PVA-117, PVA-117H, PVA-120, PVA-124, PVA-124H, EVA-CS, PVA-CST, PVA-HC, PVA-203, PVA-204, PVA-205, PVA-210, PVA-217, PVA-220, PVA-224, PVA-217ER, PVA-217E, PVA-220E, PVA-224E, PVA-405, PVA-420, PVA-613 and L-8 produced by Kuraray Co., Ltd.

The components (e.g., selection of PVA, use of additives), coated amount and the like of the protective layer are selected by taking account of fogging, adhesion and scratch resistance in addition to oxygen blocking and development removability. In general, as PVA has a higher hydrolysis ratio (namely, the protective layer has a higher content of unsubstituted vinyl alcohol unit) and the layer thickness is larger, the oxygen blocking property is more intensified and this is more advantageous in view of sensitivity. However, if the oxygen blocking property is extremely intensified, an unnecessary polymerization reaction may occur during production or stock storage, or problems such as unnecessary fogging or thickening of image line may be caused at the image exposure. The adhesion to the image area and the scratch resistance are also very important in view of handling of the printing plate. That is, when a hydrophilic layer comprising a water-soluble polymer is stacked on a lipophilic polymerized layer, layer separation readily occurs due to insufficient adhesion and the separated portion causes defects due to polymerization inhibition by oxygen, such as film curing failure.

To overcome this problem, various proposals have been made to improve the adhesive property between those two layers. For example, U.S. Pat. Nos. 292,501 and 44,563 describe a technique of mixing from 20 to 60 wt % of an acrylic emulsion or water-insoluble vinyl pyrrolidone-vinyl acetate copolymer in a hydrophilic polymer mainly comprising polyvinyl alcohol and stacking it on a polymerized layer, thereby obtaining a sufficiently high adhesive property. These known techniques all can be applied to the protective layer for use in the present invention. The method for coating such a protective layer is described in detail, for example, in U.S. Pat. No. 3,458,311 and JP-A-755-49729.

Also, other functions may be imparted to the protective layer. For example, by adding a coloring agent (e.g., water-soluble dye) capable of excellently transmitting light (for example, in the case of an infrared laser, at a wavelength of 760 to 1,200 nm) used for exposure and at the same time, efficiently absorbing light at a wavelength not participating in the exposure, the safe light aptitude can be more enhanced without causing reduction of sensitivity.

Furthermore, other functions may be imparted to the protective layer. For example, when a laser ray is used as the light source, the photosensitive composition is sometimes required to exhibit excellent sensitivity to light at the wavelength of light source but not to be sensitized by light at other wavelengths. In the case where, for example, the light source emits light in the infrared region of 750 m or more, the printing plate may be used substantially in a bright room, but photosensitization takes place in practice even by short-wave light such as light of a fluorescent lamp. In such a case, a coloring agent (e.g. water-soluble dye) capable of excellently transmitting light of the light source and at the same time, efficiently absorbing light at a wavelength of less than 700 nm is preferably added. In another example, when the light source emits light in the ultraviolet region of 450 nm or less, the printing plate can be used substantially under safe light. However, the composition in practice is sometimes sensitized with visible light of 500 nm or more. In such a case, by adding a coloring agent (e.g., water-soluble dye) capable of excellently transmitting light of the light source and at the same time, efficiently absorbing light at 500 nm or more, the safelight aptitude can be more enhanced without causing reduction of sensitivity.

For exposing the image recording material of the present invention, known methods can be used without limitation. The light source is preferably a laser and examples of the laser light source having a wavelength of from 350 to 450 nm, which is available at present and which can be used, include the followings:

gas lasers such as Ar ion laser (364 nm, 351 nm, from 10 mW to 1 W), Kr ion laser (356 nm, 351 nm, from 10 mW to 1 W) and He—Cd laser (441 nm, 325 nm, from 1 to 100 mW); solid lasers such as combination of Nd:YAG (YVO$_4$) with SHG crystal×twice (355 nm, from 5 mW to 1 W) and combination of Cr:LiSAF with SHG crystal (430 nm, 10 mW); semiconductor laser type such as KNbO$_3$, ring resonator (430 nm, 30 mW), combination of a guided wave-type wavelength conversion element with AlGaAs or InGaAs semiconductor (from 380 to 450 nm, from 5 to 100 mW), combination of a guided wave-type wavelength conversion element with AlGaInP or Al semiconductor (from 300 to 350 nm, from 5 to 100 mW) and AlGaInN (from 350 to 450 nm, from 5 to 30 mW); and pulse lasers such as N$_2$ laser (337 nm, pulse: from 0.1 to 10 mJ) and XeF (351 nm, pulse: from 10 to 250 mJ).

Among these, preferred in view of wavelength property and cost is an AlGaInN semiconductor laser (commercially available InGaN-type semiconductor laser, from 400 to 410 ran, from 5 to 30 mW).

In addition, Ar$^+$ laser (488 nm), YAG-SHG laser (532 nm), He—Ne laser (633 nm, He—Cd laser and red semiconductor lasers (from 650 to 690 nm) can be suitably used as the available light source of emitting light at 450 to 700 nm, and semiconductor laser (from 800 to 850 nm) and Nd-YAG laser (1,064 nm) can be suitably used as the available light source of emitting light at 700 to 1,200 nm.

Furthermore, various mercury lamps of ultrahigh pressure, high pressure, medium pressure or low pressure, chemical lamp, carbon arc lamp, xenon lamp, metal halide lamp, ultraviolet laser lamps (e.g., ArF excimer laser, KrF excimer laser), and radiation such as electron beam, X ray, ion beam and far infrared ray, may also be used.

Among these, the light source for rays used in the image exposure of the image recording material of the present invention is preferably a light source having an emission wavelength in the region from near infrared to infrared, more preferably a solid laser or a semiconductor laser.

The exposure mechanism may be any of an internal surface drum system, an external drum system, a flat bed system and the like. In the present invention, by using a highly water-soluble component for the recording layer, the recording layer can be rendered soluble in neutral water or alkalescent water. The lithographic printing plate having such a constitution can be used in a so-called on-press development system of mounting a printing plate on a press and then performing exposure and development on the press, where development using a liquid bath in a separate step is not necessary.

In the lithographic printing plate precursor using the polymerizable composition of the present invention for the recording layer, after image exposure, the recording layer in the unexposed area is usually removed to obtain an image. When the above-described polymerizable composition is used for the production of a lithographic printing plate, the developer is preferably a developer described in JP-B-57-7427, and an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphates sodium metasilicate, sodium bicarbonate and aqueous ammonia, or an aqueous solution of an organic alkali agent such as monoethanolamine and diethanolamine is suitably used. The alkali agent is added to give an alkali solution having a concentration of 0.1 to 10 wt %, preferably from 0.5 to 5 wt %.

The above-described alkaline aqueous solution may contain, if desired, a small amount of surfactant or organic solvent such as benzyl alcohol, 2-phenoxyethanol and 2-butoxyethanol. Examples thereof include those described in U.S. Pat. Nos. 3,375,171 and 3,615,480.

Furthermore, the developers described in JP-A-50-26601, JP-A-58-54341, JP-B-56-39464 and JP-B-56-42860 are also excellent.

In view of developability, a developer containing a specific aromatic nonionic surfactant described in Japanese Patent Application No. 2001-62270 is more preferred as the developer for the present system using a polymerizable composition mainly comprising a polymer.

The printing plate developed using the above-described developer or replenisher is after-treated with washing water, a rinsing solution containing a surfactant or the like, or a desensitizing solution containing gum arabi or a starch derivative. In the case of using the image recording material of the present invention as a printing plate, the after-treatment may be performed by variously combining those treatments.

In the plate-making process of a lithographic printing plate precursor to which the polymerizable composition of the present invention is suitably applied, the entire surface may be heated, if desired, before-or during the exposure or in the time period from exposure to development. By this heating, the image-forming reaction in the photosensitive layer is accelerated and advantageous effects can be obtained such as improvement of the sensitivity and press life, and stabilization of the sensitivity. Furthermore, for the purpose of enhancing the image strength and press life, it is also effective to after-heat or expose the entire surface of the image after development. The heating before development is preferably performed under mild conditions of 150° C. or less. If the temperature is excessively high, problems such as fogging of even the non-image area may arise. For the heating after development, very severe conditions are employed. A temperature of 200 to 500° C. is usually used. If the temperature is low, a sufficiently high effect of strengthening the image may not be obtained, whereas if it is excessively high, there arise problems such as deterioration of support and thermal decomposition of image area. For the exposure of the lithographic printing plate for scan exposure according to the present invention, known methods can be used without limitation.

In addition to use for the lithographic printing plate for scan exposure, the image recording material of the present invention can be used for the production of a high-sensitive stereolithographic material or by utilizing the change in refractive index resulting from polymerization, a hologram material, an electronic material (e.g., photoresist) or the like.

EXAMPLES

The present invention is described in greater detail below by referring to the Examples, but the present invention should not be construed as being limited to these Examples.

[Synthesis of Polymerizable Dendrimer]

The polymerizable dendrimers used in Examples were synthesized through the following procedure by referring to known synthesis method described in the publications cited above.

Synthesis Example 1

Synthesis of Polymerizable Dendrimer (M-1)

In a 1,000 ml-volume three-neck flask equipped with a condenser and a stirrers pentaerythritol (0.1 mol), 2,2-bishydroxymethylproponic acid (1.2 mol) and p-toluenesulfonic acid (0.005 mol) were added and under a flow of nitrogen, reacted for 2 hours in an oil bath at 145° C. to obtain a uniform solution. This solution was further reacted for 2 hours at 145° C. under reduced prepare (up to 50 mmHg) to obtain Compound (K-1) shown below which is a precursor of M-1. The identification of this compound was performed by NMR and IR.

(K-1)

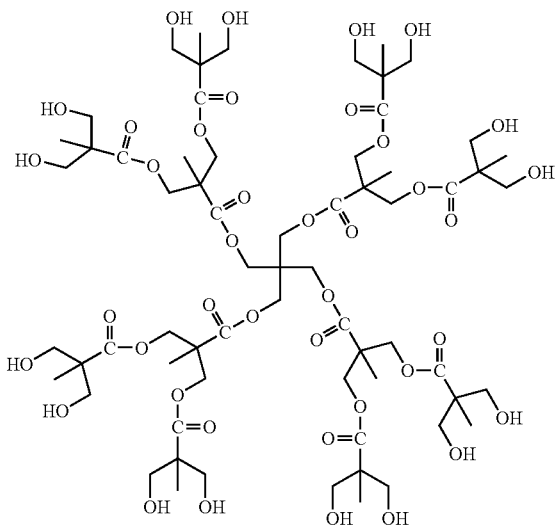

(K-2)

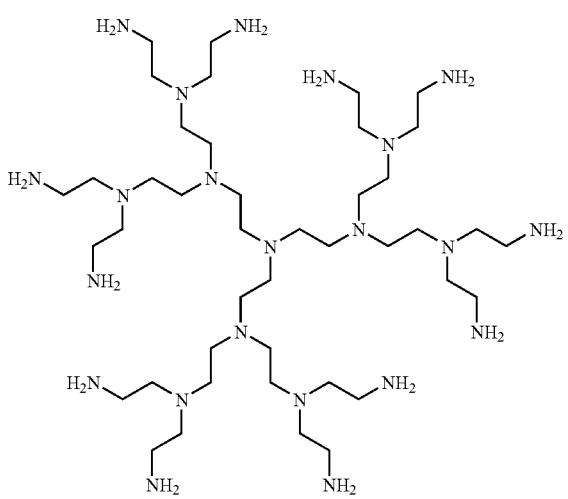

Thereafter, 11 g of the obtained polymerizable group-containing Dendrimer Precursor (K-1) was added to 150 ml of TRY and under a flow of nitrogen, 22 g of methacrylic acid anhydride and 0.2 g of hydroquinone, which were dissolved in 20 ml of tetrahydrofuran (THF), were gradually added in several parts at 70° C. The resulting solution was reacted for 8 hours while keeping the temperature of 70° C.

After the completion of reaction, the solution was removed under reduced pressure, the obtained product was extracted with chloroform, the extracted solution was washed with an aqueous 2% NaOH solution and then with water and dried over magnesium sulfate, and the solvent was removed under reduced pressure, as a result, a yellow viscous solution was obtained.

This solution was dissolved in 200 ml of THF and 20 ml of triethylamine was added thereto under a nitrogen stream. To the resulting solution, 15 g of methacrylic acid chloride was gradually added dropwise while not causing the liquid temperature to exceed 10° C. After the dropwise addition, the reaction solution was reacted for 15 hours. The precipitated salt was filtered and the obtained solution was washed with an aqueous 2% hydrochloric acid solution and an aqueous 2% NaOH solution and then washed with water until the pH became 7. The obtained crude product was dissolved in chloroform and after drying over magnesium sulfate, the chloroform was removed under reduced pressure, as a result, the objective Compound (M-1) was obtained at a yield of 11 g.

Synthesis Example 2

Synthesis of Polymerizable Dendrimer (M-2)

In a 1,000 ml-volume three-neck flask equipped with a condenser and a stirrer, 0.1 mol of Polymerizable Dendrimer Precursor (K-2) having a structure shown below, 1.2 mol of MOI and 54 g of ethyl acetate were added and stirred at 70° C. After 10 minutes, 0.5 g of tin laurate was added to the mixed solution obtained above. The solution was stirred for 4 hours and after confirming that the NCO group characteristic absorption (2,270 cm$^{-1}$) disappeared on the IR chart, the reaction was finished. Thereafter, ethyl acetate was removed under reduced pressure to obtain the objective polymerizable group-containing Dendrimer (M-2).

All polymerizable dendrimer compounds set forth as specific examples can be synthesized in the same manner as in these Synthesis Examples by selecting the starting material and the like.

Example 1

(Preparation of Support)

A 0.3 mm-thick aluminum plate was etched by dipping it in 10 wt % sodium hydroxide at 60° C. for 25 seconds, washed with running water, neutralization washed with 20 wt % of nitric acid and then washed with water. The resulting plate was subjected to an electrolytic graining treatment in an aqueous 1 wt % nitric acid solution by using a sinusoidal wave alternating current at an anodic time electricity of 300 coulomb/dm². Subsequently, the aluminum plate was dipped in an aqueous 1 wt % sodium hydroxide solution at 40° C. for 5 seconds, desmutted at 60° C. for 40 seconds in an aqueous 30 wt % sulfuric acid solution, and then anodized for 2 minutes at a current density of 2 A/dm² in an aqueous 20 wt % sulfuric acid solution to have an anodic oxide film thickness of 2.7 g/m². The surface roughness measured was 0.3 μm (Ra indication according to JIS B0601).

On the back surface of the thus-treated substrate, the following sol-gel reaction solution was coated by a bar coater and dried at 100° C. for 1 minute to prepare a support having provided thereon a backcoat layer in a dry coated amount of 70 ml/m².

(Sol-Ge Reaction Solution)

| | |
|---|---|
| Tetraethyl silicate | 50 parts by weight |
| Water | 20 parts by weight |
| Methanol | 15 parts by weight |
| Phosphoric acid | 0.05 part by weight |

These components were mixed and stirred, as a result, generation of heat was started in about 5 minutes. After reacted for 60 minutes, the following solution was added to prepare a coating solution for the backcoat layer.

| | |
|---|---|
| Pyrogallol formaldehyde condensed resin (molecular weight: 2,000) | 4 parts by weight |
| Dimethyl phthalate | 5 parts by weight |
| Fluorine-based surfactant (N-butylperfluorooctane sulfonamide ethyl acrylate/ polyoxyethylene acrylate copolymer, molecular weight: 20,000) | 0.7 parts by weight |
| Methanol silica sol (produced by Nissan Chemical Industry, Ltd., methanol: 30 wt %) | 50 parts by weight |
| Methanol | 800 parts by weight |

<Formation of Recording Layer>

On the aluminum plate after the backcoat layer was provided as above, a polymerizable composition having the following composition (coating solution for recording layer) was coated to have a dry coated amount of 1.5 g/m² and then dried at 100° C. for 1 minute to form a recording layer.

<Coating Solution for Recording Layer>

| | |
|---|---|
| Polymerizable dendrimer (component (1), Compound (M) shown in Table below) | 1.0 g |
| Radical initiator [component (2), compound shown in Table below) | 0.3 g |
| Alkali-soluble polymer (component (3), compound shown in Table below] | 1.0 g |
| Sensitizing dye [component (4), compound shown in Table below] | 0.08 g |
| Fluorine-based nonionic surfactant (Megafac F-176, produced by Dai-Nippon Ink & Chemicals, Inc.) | 0.01 g |
| Naphthalene sulfonate of Victoria Pure Blue | 0.04 g |
| Methyl ethyl ketone | 9.0 g |
| Propylene glycol monoethyl ether | 8.0 g |
| Methanol | 10.0 g |

The structures of radical initiators, alkali-soluble polymers and sensitizing dyes shown in Tables 2 to 4 below are as follows.

C-1 CGI-784 (Produced by Ciba Geigy)

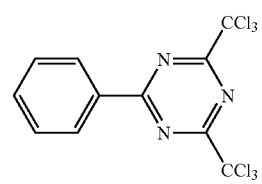

C-2

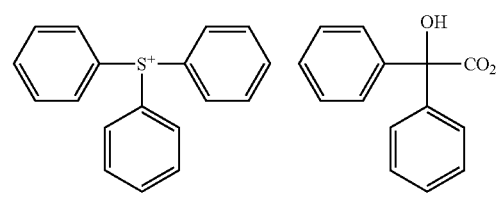

C-3

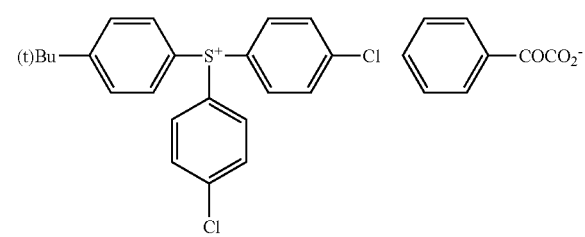

C-4

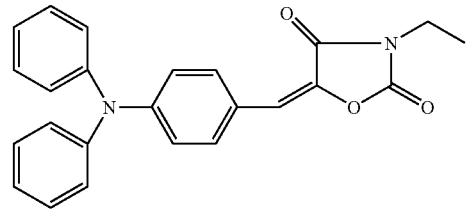

D-1

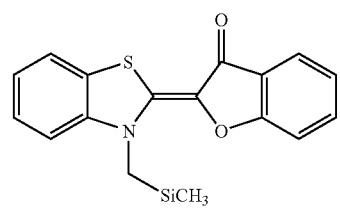

D-2

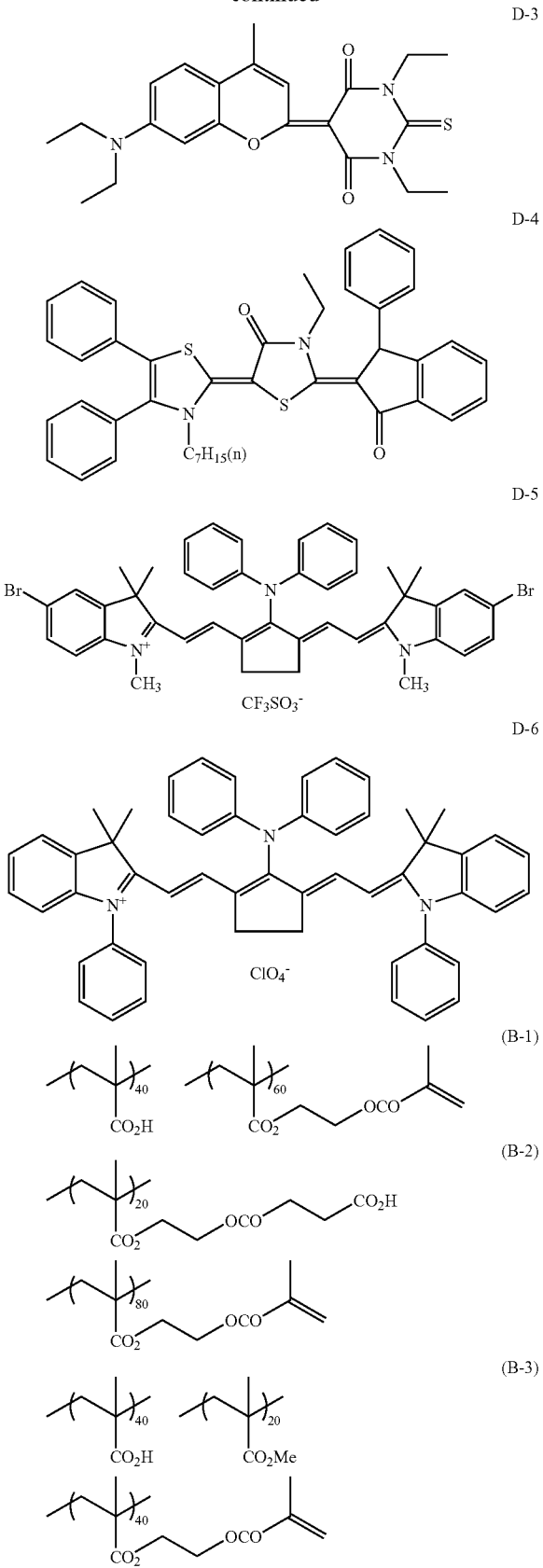

<Preparation of Protective Layer>

In Examples 1 to 8 and Comparative Examples 1 to 8, an aqueous solution containing 3 wt % of polyvinyl alcohol (saponification degree: 98 mol %, polymerization degree: 550) was coated on the recording layer to have a dry coated weight of 2 g/m² and dried at 100° C. for 2 minutes to provide a protective layer. That is, lithographic printing plate precursors of Examples 1 to 3 and Comparative Examples 1 to 3 where recording is performed with light at a wavelength of 400 nm, lithographic printing plate precursors of Examples 4 to 6 and Comparative Examples 4 to 6 where recording is preformed with light at a wavelength of 532 nm, and lithographic printing plate precursors of Examples 7 and 8 and Comparative Examples 7 and 8 where recording is performed with light at a wavelength of 830 nm had a protective layer, and lithographic printing plate precursors of Examples 9 and 10 and Comparative Examples 9 and 10 had no protective layer.

In this way, lithographic printing plate precursors of Examples 1 to 10 were produced.

(Exposure of Lithographic Printing Plate Precursor)

The lithographic printing plate precursors obtained above were subjected to scan exposure by a laser corresponding to respective photosensitive materials. The exposure conditions were as follows.

(1) Lithographic Printing Plate Precursors of Examples 1 to 3 and Comparative Examples 1 to 3

The lithographic printing plate precursor obtained was scan-exposed with an InGaN-type semiconductor laser having an oscillation wavelength of 400 mm under the conditions of giving a beam diameter of 25 μm and an exposure energy density of 0.15 mJ/cm² on the plate surface.

(2) Lithographic Printing Plate Precursors of Examples 4 to 6 and Comparative Examples 4 to 6

The lithographic printing plate precursor obtained was exposed by an FD-YAG (532 nm) laser exposing machine (plate setter manufactured by Heidelberg Inc.; Gutenberg) such that the exposure energy density on the plate surface became 200 μJ/cm².

(3) Lithographic Printing Plate Precursors of Examples 7 to 10 and Comparative Examples 7 to 10

The lithographic printing plate precursor obtained was exposed by using Trendsetter 3244VFS (manufactured by Creo Inc.) equipped with a 40 W water-cooled infrared semiconductor laser (830 nm) under the conditions such that the output was 9 w, the rotation number of external drum was 210 rpm, the plate surface energy was 100 mJ/cm², and the resolution was 2,400 dpi.

(Development/Plate-Making)

The lithographic printing plate precursor after exposure was subjected to development/plate-making at 30° C. in automatic developing machine Stablon 900N manufactured by Fuji Photo Film Co., Ltd. where the developer shown below and a 1:1 water diluted developer of FN-6 produced by Fuji Photo Film Co., Ltd. were each charged. As a result, a lithographic printing plate was obtained. The lithographic printing plate precursors of Examples 2 to 10 were processed in the same manner as that of Example 1 to obtain lithographic printing plates.

<Developer>

| | |
|---|---|
| Water | 800 g |
| DV-2 (produced by Fuji Photo Film Co., Ltd.) | 200 g |

[Evaluation]

(Evaluation of Press Life)

Forced Test of Fine Line Press Life:

Lithron manufactured by Komori Corp. was used as the press, and Graph G (N) of Dainippon Ink and Chemicals, Inc. was used as the ink. At the 5,000th sheet from the start of printing, the fine line area was wiped with a printing sponge impregnated with PS Plate Cleaner CL-2 produced by Fuji Photo Film Co., Ltd. to clean the ink on the plate surface.

Thereafter, a printed matter having fine lines (10 μm) in the image area was observed and the fine line press life was relatively evaluated by the number of sheets where the image started thinning, and expressed according to the exposure wavelength, by the press life index using Examples 1, 4 and 7 as the control (100) of respective exposure systems. A larger press life index indicates higher press life and is more preferred.

(Evaluation of Storage Stability)

The image recording materials obtained above were left standing under a high temperature condition (60° C.) for 3 days. These image recording materials after storage were dipped in the developer shown above and by measuring the time until the image recording material could be developed, the ratio of the time between before and after the high-temperature storage was determined. This time ratio is preferably 1.1 or less in view of production and within this range, good storage stability can also be obtained.

(Evaluation of Sensitivity)

The image recording materials obtained above were exposed by using a light source corresponding to respective recording layers, and scanning a laser ray at the wavelength of each light source. After the exposure, the image recording material was developed by dipping it in the developer having a composition shown above at 25° C. for 10 seconds. By decreasing the above-described standard exposure amount, the minimum exposure amount of allowing for formation of an image after development was calculated as the sensitivity (unit: mJ/cm$^2$) of the image recording material. The evaluation results are shown according to the exposure wavelength, by a relative sensitivity while using Examples 1, 4 and 7 as the basis of respective exposure systems and taking their sensitivity as 1.0.

The relative sensitivity was defined on the following basis. A higher numerical value of relative sensitivity reveals higher sensitivity and better performance.

Relative sensitivity=(sensitivity of base photosensitive material/sensitivity of object photosensitive material)

Results of these evaluations are shown in Tables 2 to 4 below.

TABLE 2

| | Polymerizable Compound | Radical Initiator | Alkali-Soluble Polymer | Sensitizing Dye | Protective Layer | Sensitivity | Press Life Index | Storage Stability |
|---|---|---|---|---|---|---|---|---|
| Example 1 | M-1 | C-1 | B-1 | D-1 | present | 1.0 | 100 | 1.05 |
| Comparative Example 1 | N-3 | C-1 | B-1 | D-1 | present | 0.6 | 70 | 1.2 |
| Example 2 | M-2 | C-2 | B-1 | D-2 | present | 1.2 | 120 | 1.05 |
| Comparative Example 2 | N-4 | C-2 | B-1 | D-2 | present | 0.7 | 80 | 1.15 |
| Example 3 | M-7 | C-2 | B-2 | D-2 | present | 1.3 | 130 | 1.1 |
| Comparative Example 3 | N-1 | C-2 | B-2 | D-2 | present | 0.7 | 80 | 1.25 |

TABLE 3

| | Polymerizable Compound | Radical Initiator | Alkali-Soluble Polymer | Sensitizing Dye | Protective Layer | Sensitivity | Press Life Index | Storage Stability |
|---|---|---|---|---|---|---|---|---|
| Example 4 | M-4 | C-1 | B-1 | D-3 | present | 1.0 | 100 | 1.05 |
| Comparative Example 4 | N-5 | C-1 | B-1 | D-3 | present | 0.6 | 70 | 1.15 |
| Example 5 | M-10 | C-1 | B-1 | D-3 | present | 1.1 | 100 | 1.05 |
| Comparative Example 5 | N-2 | C-1 | B-1 | D-3 | present | 0.5 | 60 | 1.2 |
| Example 6 | M-14 | C-2 | B-2 | D-4 | present | 1.3 | 120 | 1.05 |
| Comparative Example 6 | N-1 | C-2 | B-2 | D-4 | present | 0.7 | 80 | 1.2 |

TABLE 4

| | Polymerizable Compound | Radical Initiator | Alkali-Soluble Polymer | Sensitizing Dye | Protective Layer | Sensitivity | Press Life Index | Storage Stability |
|---|---|---|---|---|---|---|---|---|
| Example 7 | M-7 | C-3 | B-1 | D-5 | present | 1.0 | 100 | 1.05 |
| Comparative Example 7 | N-1 | C-3 | B-1 | D-5 | present | 0.6 | 70 | 1.2 |
| Example 8 | M-22 | C-4 | B-2 | D-6 | present | 1.3 | 120 | 1.05 |
| Comparative Example 8 | N-3 | C-4 | B-2 | D-6 | present | 0.7 | 80 | 1.15 |
| Example 9 | M-3 | C-3 | B-1 | D-5 | none | 1.4 | 120 | 1.05 |
| Comparative Example 9 | N-2 | C-3 | B-1 | D-5 | none | 0.7 | 80 | 1.25 |
| Example 10 | M-24 | C-4 | B-3 | D-6 | none | 1.1 | 110 | 1.05 |
| Comparative Example 10 | N-4 | C-4 | B-3 | D-6 | none | 0.6 | 70 | 1.2 |

[Comparative Examples 1 to 10]

Lithographic printing plate precursors of Comparative Examples 1 to 10 were produced in the same manner as in Example 1 except that in Examples 1 to 10, a polymerizable compound shown below [Compounds (N-1) to (N-3) shown in Tables 2 to 4], which is out of the scope of the present invention, was added in place of the polymerizable dendrimer [component (1); compound (M) shown in the Tables] contained in the coating solution for recording layer,

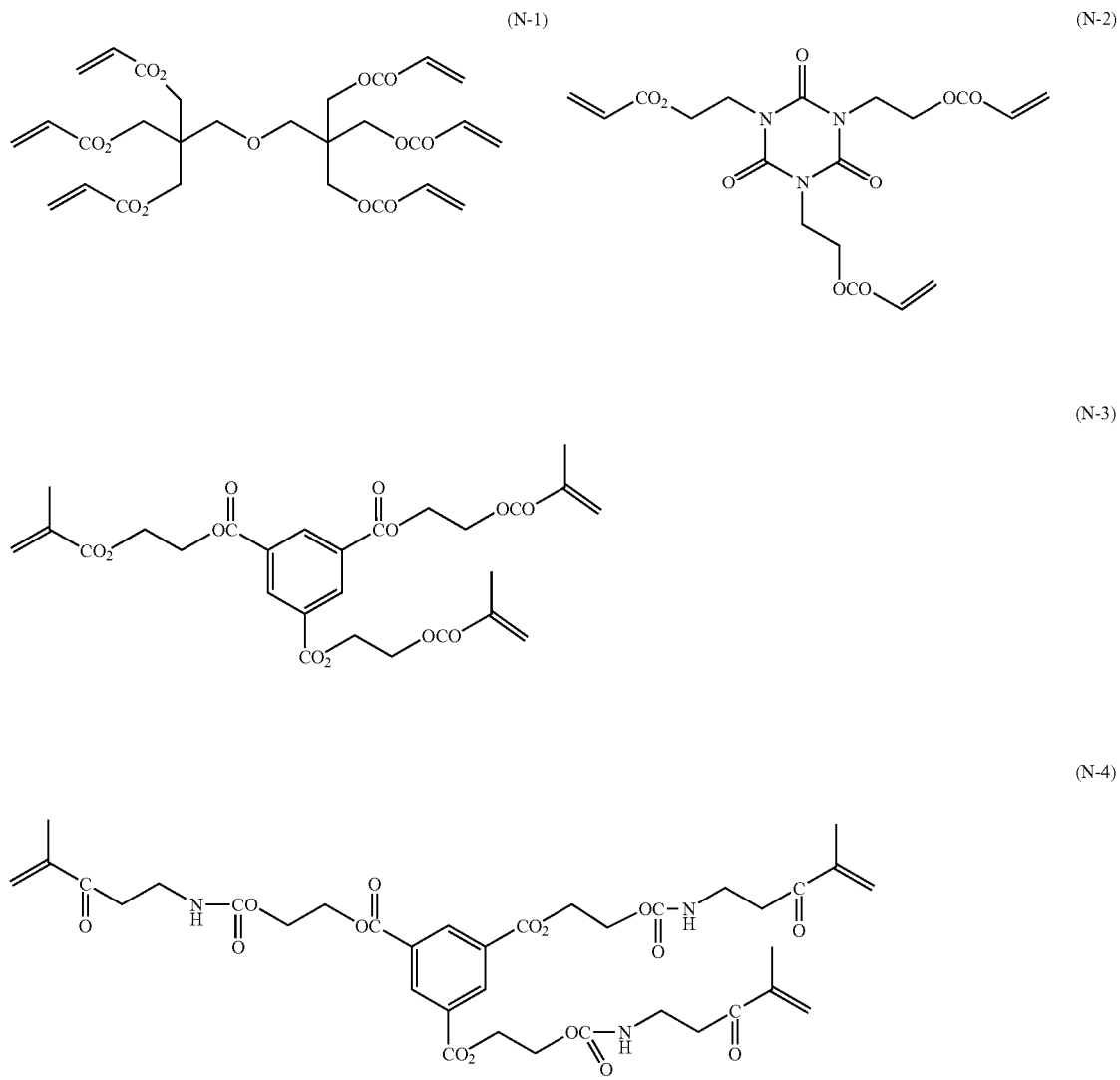

(N-5)

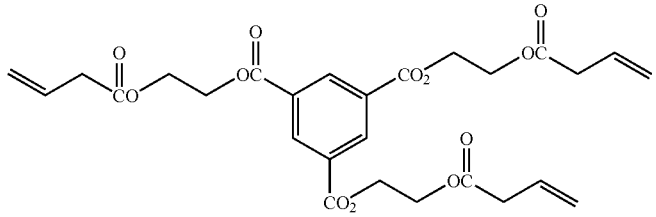

Lithographic printing plate precursors obtained-were subjected to exposure, development and plate-making in the same manner as in Examples 1 to 3 for lithographic printing plate precursors of Comparative Examples 1 to 3, in the same manner as in Examples 4 to 7 for lithographic printing plate precursors of Comparative Examples 4 to 7, and in the same manner as in Examples 8 to 10 for lithographic printing plate precursors of Comparative Examples 8 to 10. The results obtained are shown together in Tables 2 to 4.

It is seen from the results in Tables 2 to 4 that the lithographic printing plate precursors of Examples using the polymerizable composition of the present invention for the recording layer all have high press life property and at the same time, good storage stability.

On the other hand, the lithographic printing plate precursors of Comparative Examples not using a dendrimer having a polymerizable group are inferior to those of Examples in both press life and storage stability.

This application is based on Japanese Patent application JP 2003-348345, filed Oct. 7, 2003, the entire content of which is hereby incorporated by reference, the same as if set forth at length.

What is claimed is:

1. A polymerizable composition comprising:
   a dendrimer having at least two polymerizable groups within a molecule;
   a radical initiator; and
   an alkali-soluble polymer.

2. The polymerizable composition according to claim 1, which further comprises a sensitizing dye.

3. The polymerizable composition according to claim 1, wherein the dendrimer is a multi-branched compound having a molecular weight of 1,500 or more and 12 or more polymerizable groups.

4. The polymerizable composition according to claim 1, wherein the dendrimer is a multi-branched compound having a molecular weight of 1,800 or more and 14 or more polymerizable groups.

5. The polymerizable composition according to claim 1, wherein the dendrimer is a multi-branched compound having a molecular weight of 2,000 or more and 16 or more polymerizable groups.

6. The polymerizable composition according to claim 2, wherein the sensitizing dye is an ultraviolet absorbent having a maximum absorption of 150 to 300 nm, a visible light absorbent having λmax 330 to 700 nm, or an infrared absorbent having λmax of 800 to 1,300 nm.

7. The polymerizable composition according to claim 1, which further comprises a compound having an ethylenically unsaturated double bond.

8. The polymerizable composition according to claim 1, which further comprises a linear organic polymer.

9. The polymerizable composition according to claim 8, wherein the linear organic polymer is an addition polymer having a carboxylic acid group in a side chain, an acidic cellulose derivative having a carboxylic acid group in a side chain, or an addition polymer having a hydroxyl group to which a cyclic acid anhydride is added.

10. An image recording material comprising a support and a recording layer comprising a polymerizable composition containing a dendrimer having at least two polymerizable groups within a molecule, a radical initiator and an alkali-soluble polymer.

* * * * *